United States Patent
Ota

(10) Patent No.: US 12,531,530 B2
(45) Date of Patent: Jan. 20, 2026

(54) AMPLIFIER CIRCUIT AND COMPOSITE CIRCUIT

(71) Applicant: Mitsubishi Electric Corporation, Tokyo (JP)

(72) Inventor: Yasuaki Ota, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 543 days.

(21) Appl. No.: 17/927,059

(22) PCT Filed: Sep. 10, 2020

(86) PCT No.: PCT/JP2020/034258
§ 371 (c)(1),
(2) Date: Nov. 22, 2022

(87) PCT Pub. No.: WO2022/054192
PCT Pub. Date: Mar. 17, 2022

(65) Prior Publication Data
US 2023/0238929 A1    Jul. 27, 2023

(51) Int. Cl.
*H03F 3/30* (2006.01)
*H03F 1/22* (2006.01)
*H03F 3/45* (2006.01)

(52) U.S. Cl.
CPC ......... *H03F 3/45179* (2013.01); *H03F 1/223* (2013.01); *H03F 3/301* (2013.01)

(58) Field of Classification Search
CPC ...... H03F 3/45179; H03F 1/223; H03F 3/301; H03F 1/086; H03F 2203/5018;
(Continued)

(56) References Cited

U.S. PATENT DOCUMENTS

| | | | |
|---|---|---|---|
| 11,343,457 B2 * | 5/2022 | Higuchi | ........... H03F 3/505 |
| 2020/0275041 A1 | 8/2020 | Higuchi | |

FOREIGN PATENT DOCUMENTS

| | | |
|---|---|---|
| JP | 2013179077 A | 9/2013 |
| WO | 2019107084 A1 | 6/2019 |

(Continued)

OTHER PUBLICATIONS

International Search Report and Written Opinion mailed on Dec. 22, 2020, received for PCT Application PCT/JP2020/034258, filed on Sep. 10, 2020, 12 pages including English Translation.

(Continued)

*Primary Examiner* — Andrea Lindgren Baltzell
*Assistant Examiner* — Khiem D Nguyen
(74) *Attorney, Agent, or Firm* — XSENSUS LLP

(57) ABSTRACT

In the amplifier circuit, the rising settling time and the falling settling time are kept short. The amplifier circuit includes a first transistor of a first conductivity type having a first control terminal; a second transistor of a second conductivity type different from the first conductivity type, the second transistor having a second control terminal connected to an input terminal and a fourth current terminal connected to the first control terminal; a third transistor; and a fourth transistor of a fourth conductivity type different from the first conductivity type, the fourth transistor having a fourth control terminal connected to the first control terminal at an equal potential, and a seventh current terminal connected to a third fixed potential.

22 Claims, 70 Drawing Sheets

(58) Field of Classification Search
CPC .......... H03F 3/3022; H03F 3/347; H03F 3/50; H03F 3/505; H03F 3/211
USPC ................................ 330/253, 277, 288, 285
See application file for complete search history.

(56) References Cited

FOREIGN PATENT DOCUMENTS

| | | |
|---|---|---|
| WO | 2020188649 A1 | 9/2020 |
| WO | 2020188919 A1 | 9/2020 |

OTHER PUBLICATIONS

Jeong, D. C. et al., "Ultra-Low Power Direct-Conversion 16 QAM Transmitter Based on Doherty Power Amplifier," EEE Microwave and Wireless Components Letters, 2016, vol. 26, No. 7, pp. 528-530.

* cited by examiner

F I G. 3
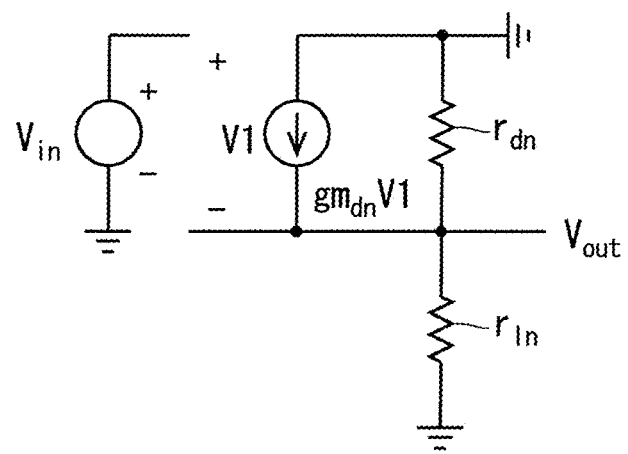

F I G. 6
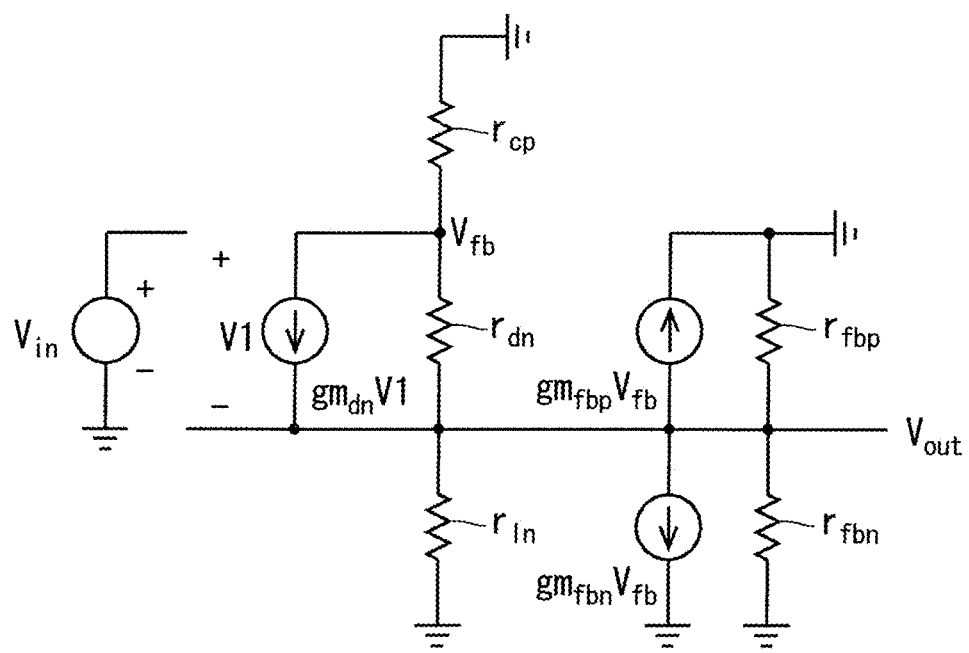

F I G. 8
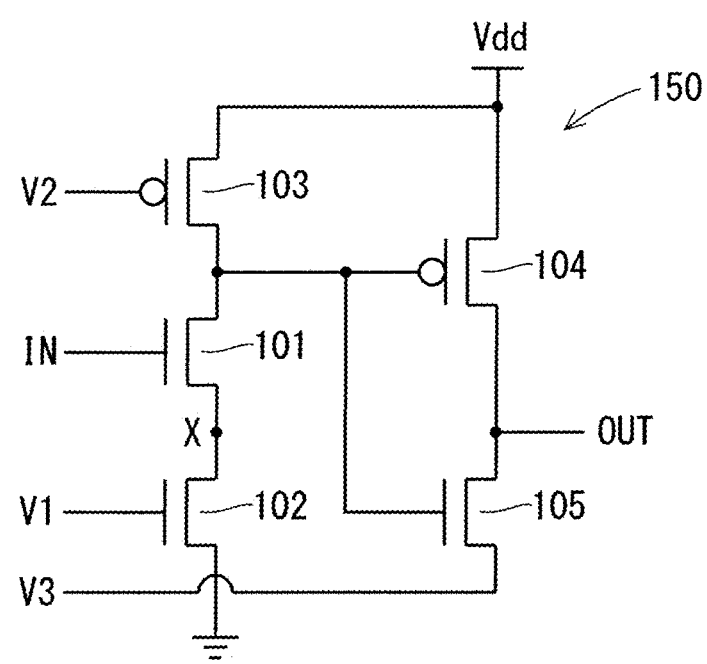

F I G. 1 0
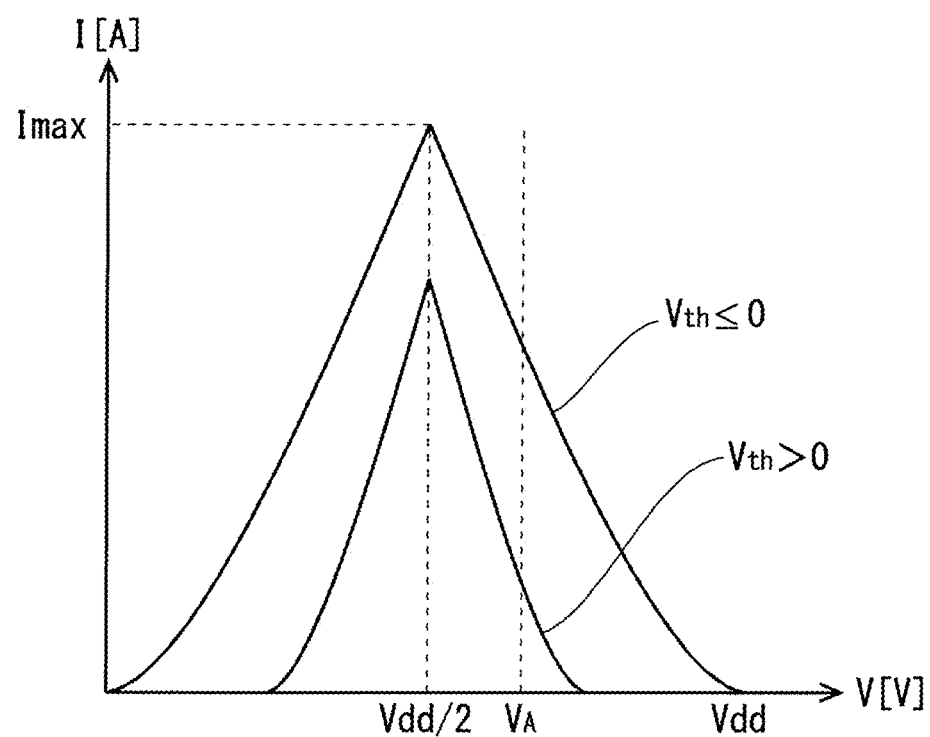

F I G. 1 3
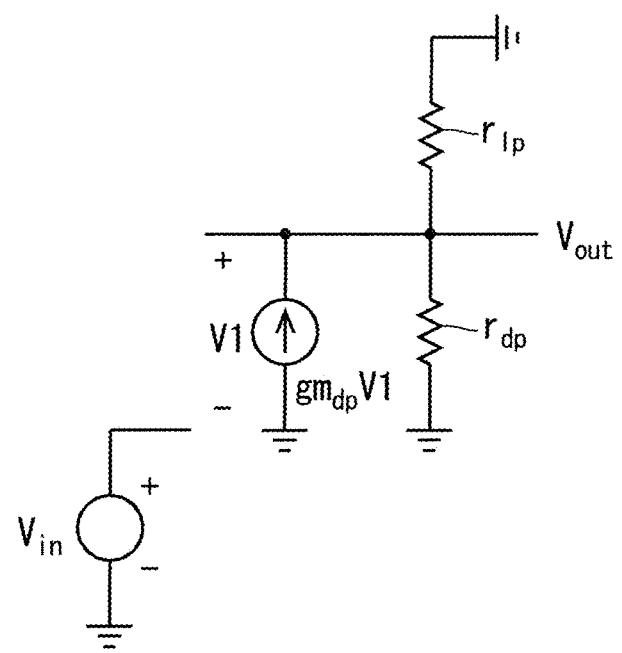

F I G. 1 6
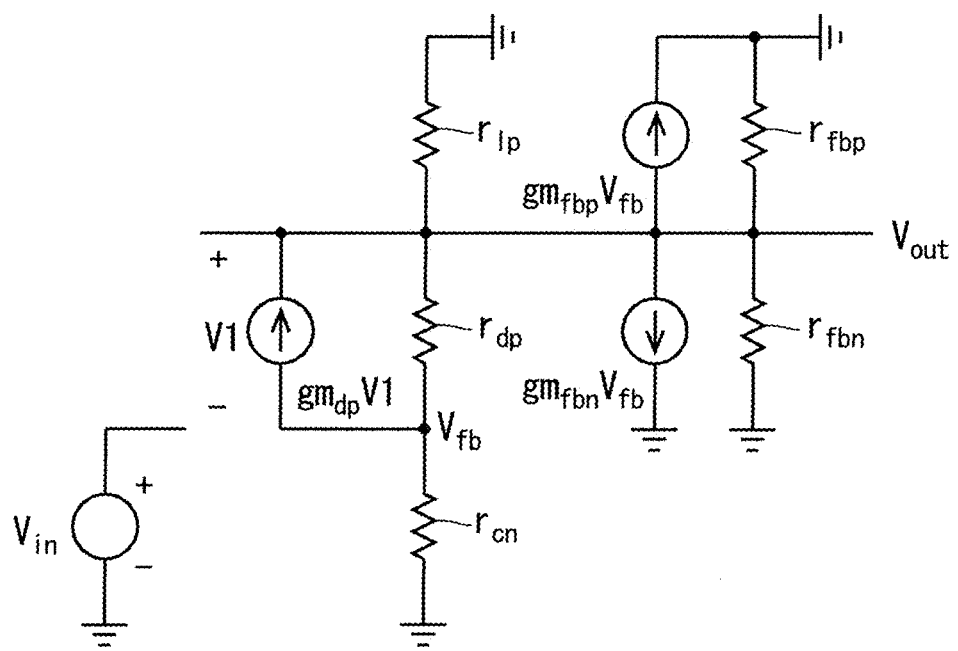

F I G. 1 7
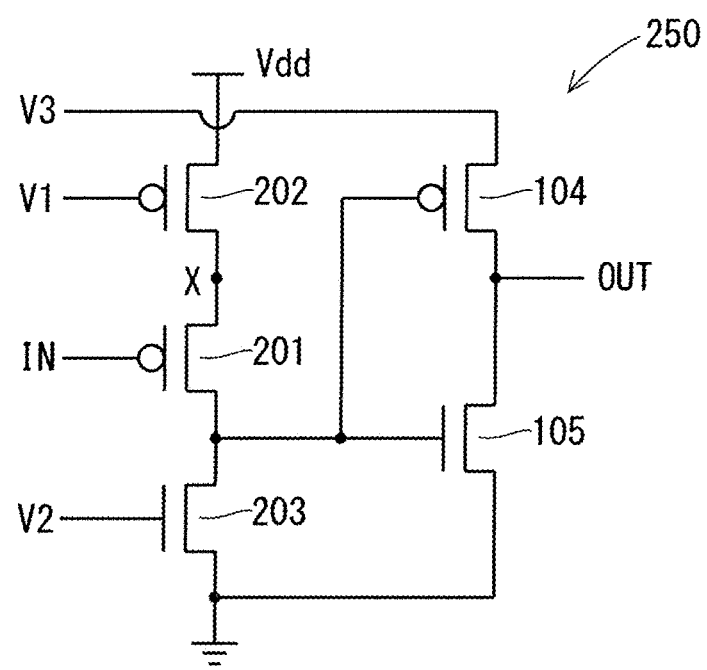

F I G. 1 8
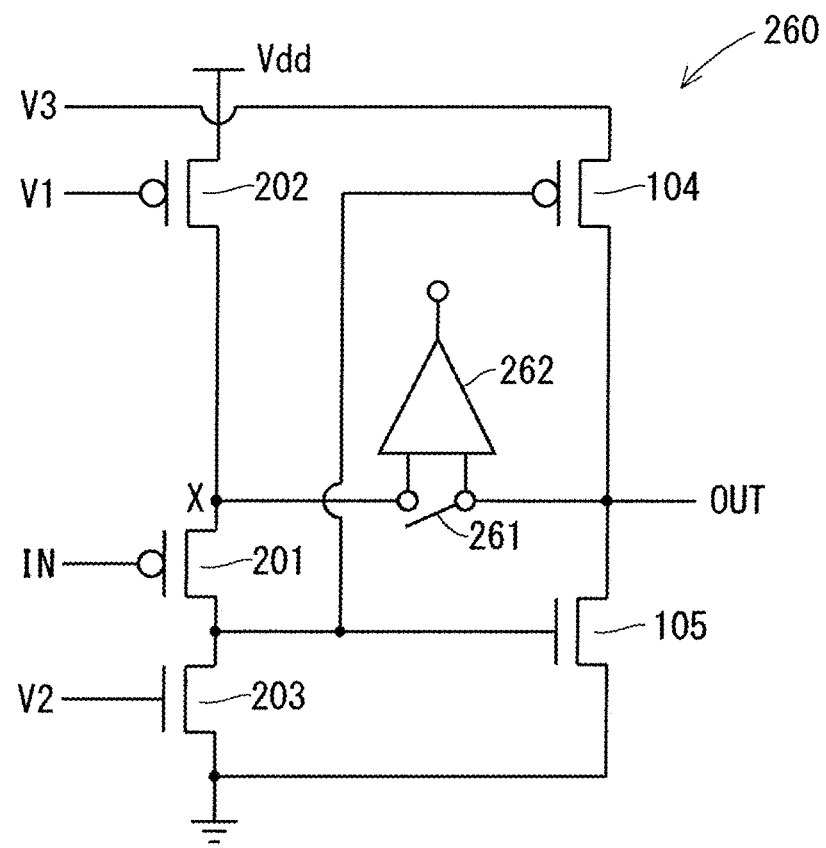

F I G. 1 9
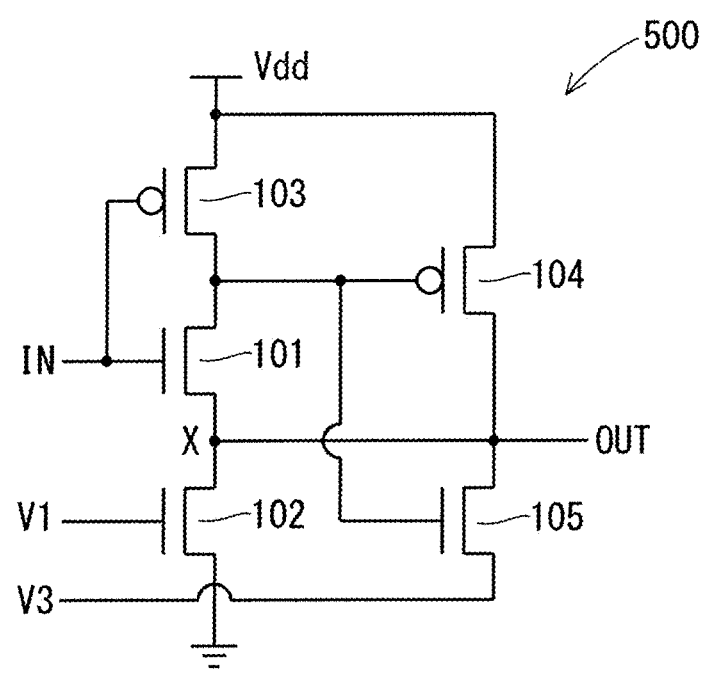

F I G. 20
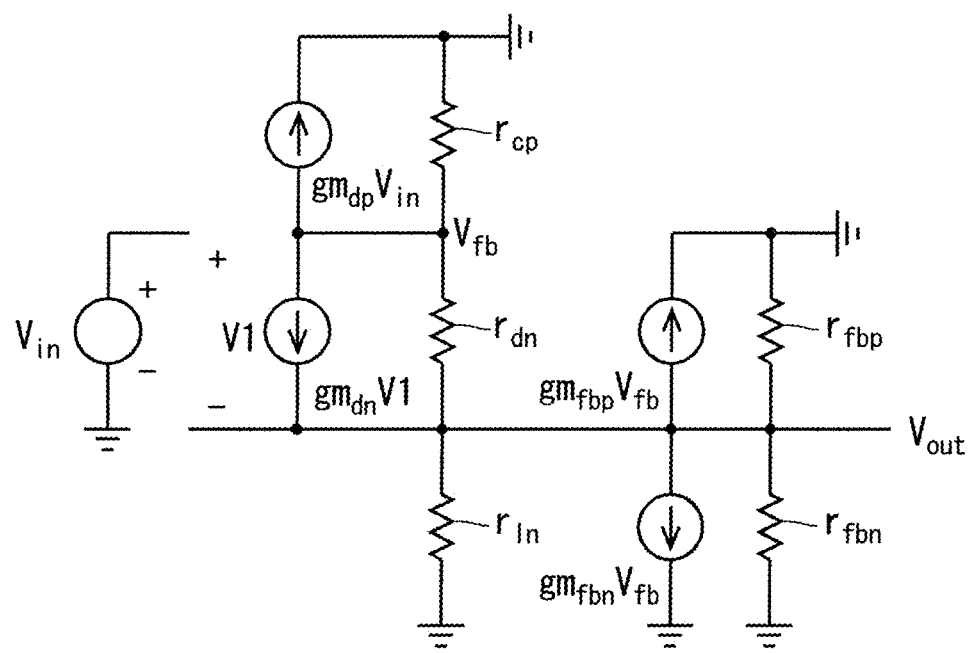

F I G. 2 2
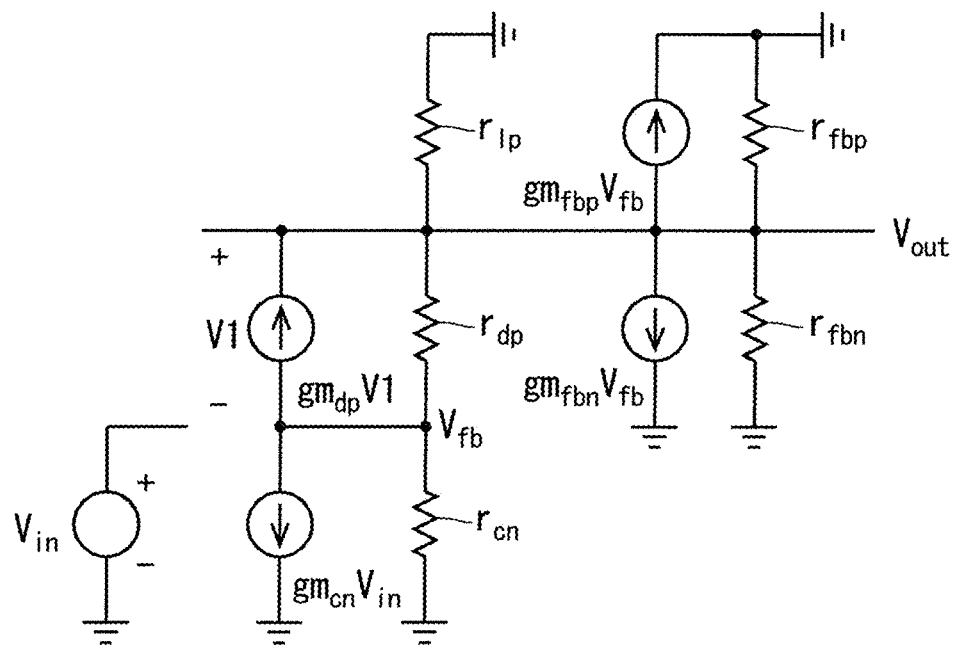

F I G. 2 3
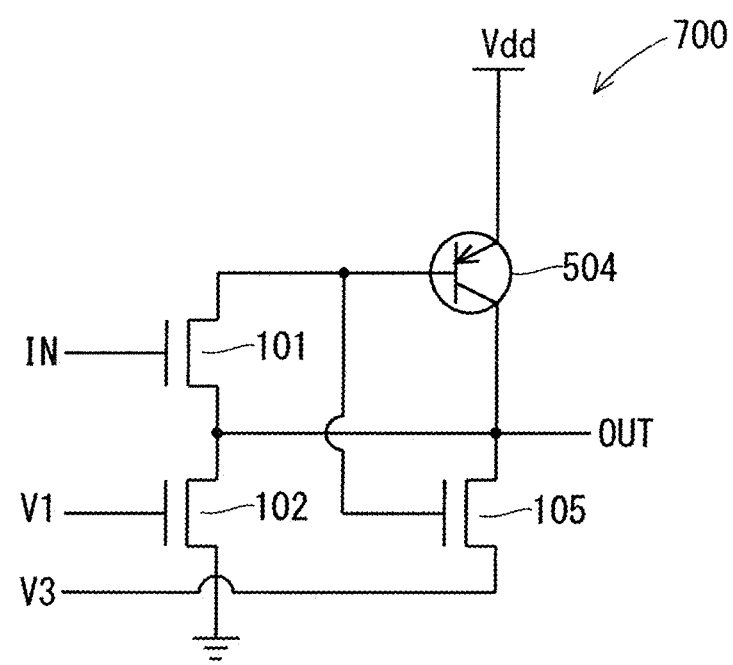

F I G. 2 5
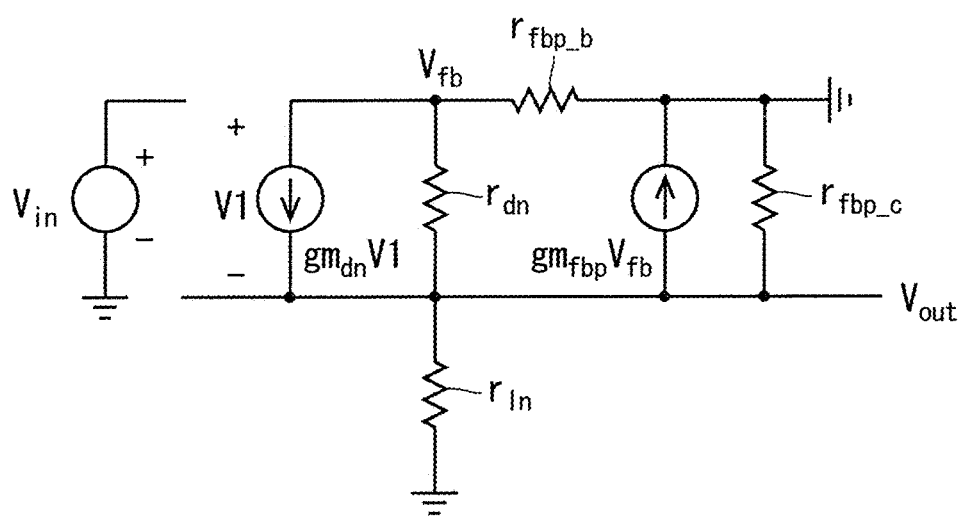

F I G. 2 7
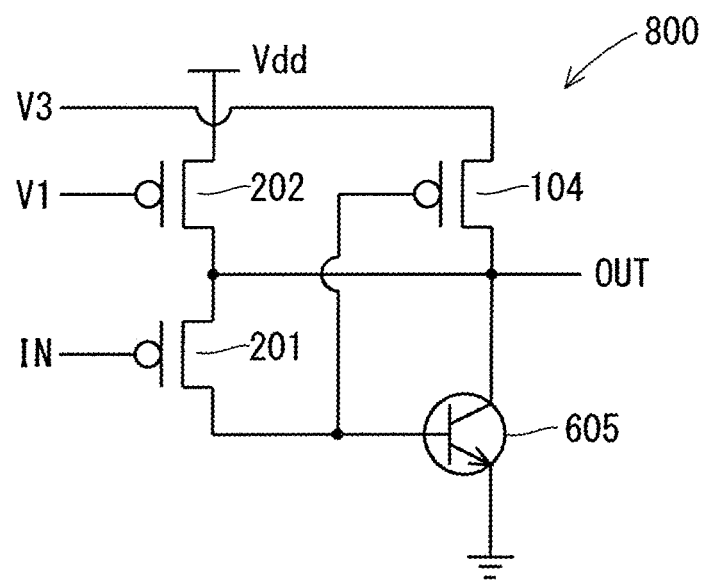

F I G. 2 9
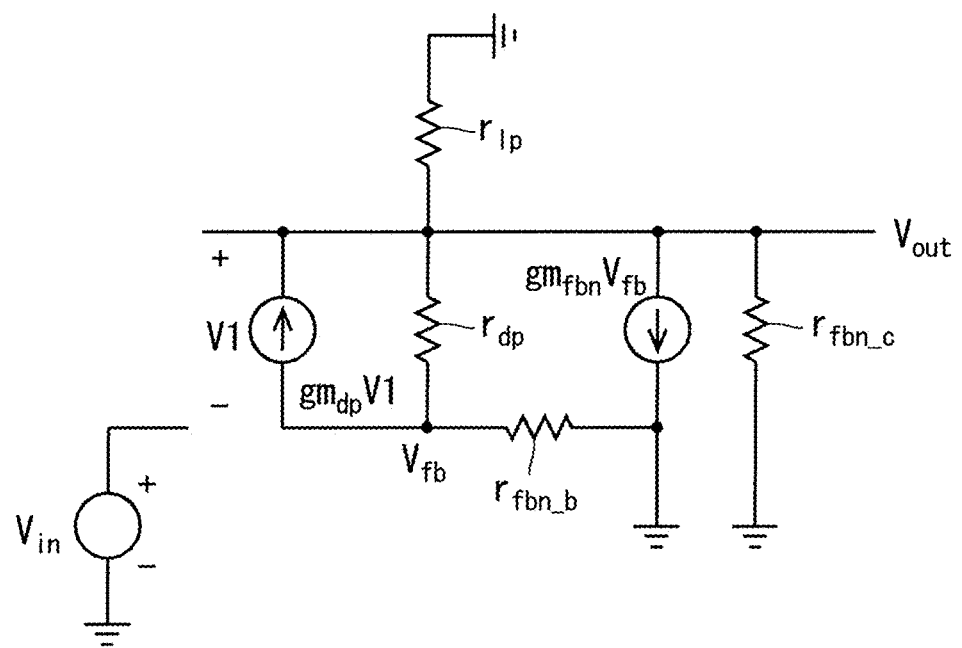

F I G. 3 0
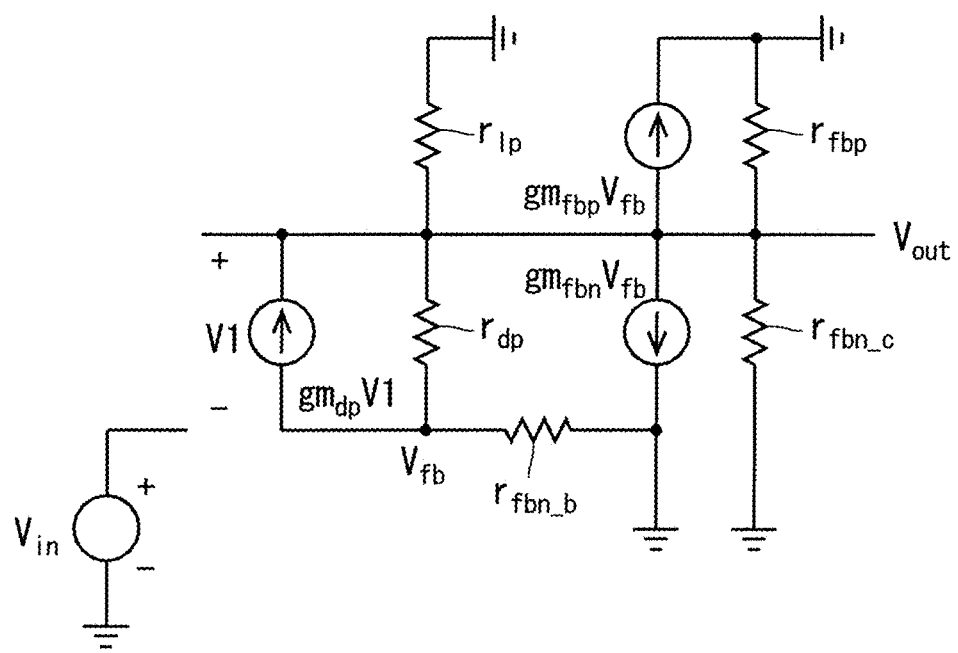

F I G. 3 1
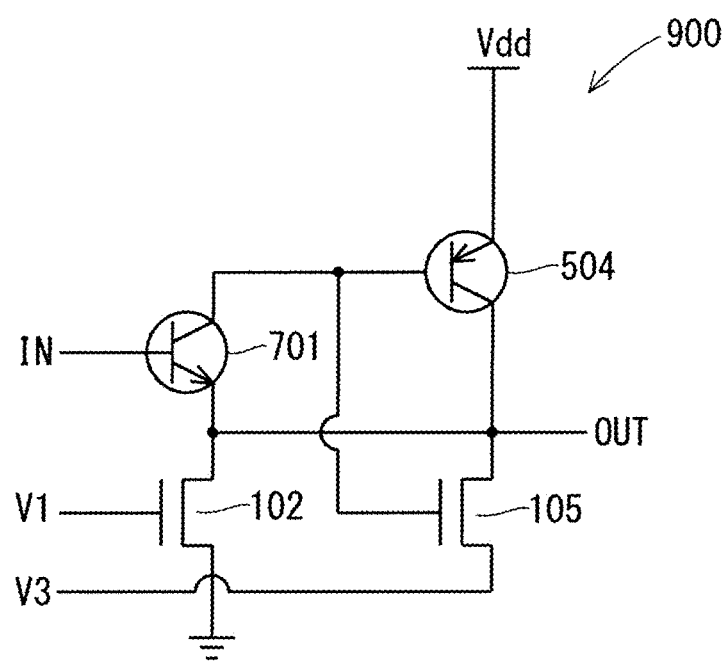

F I G. 3 2
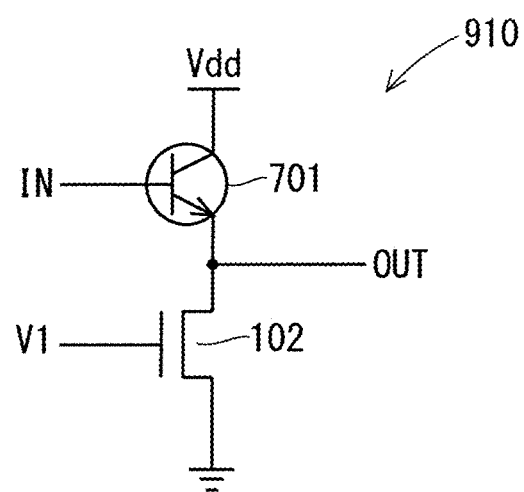

F I G. 3 3
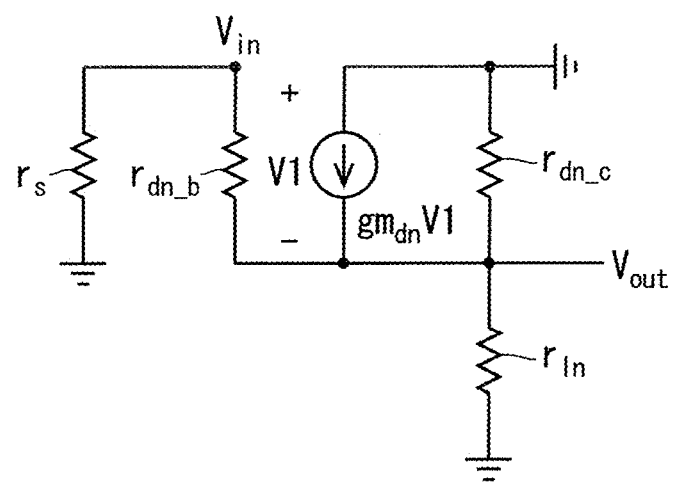

F I G. 3 5
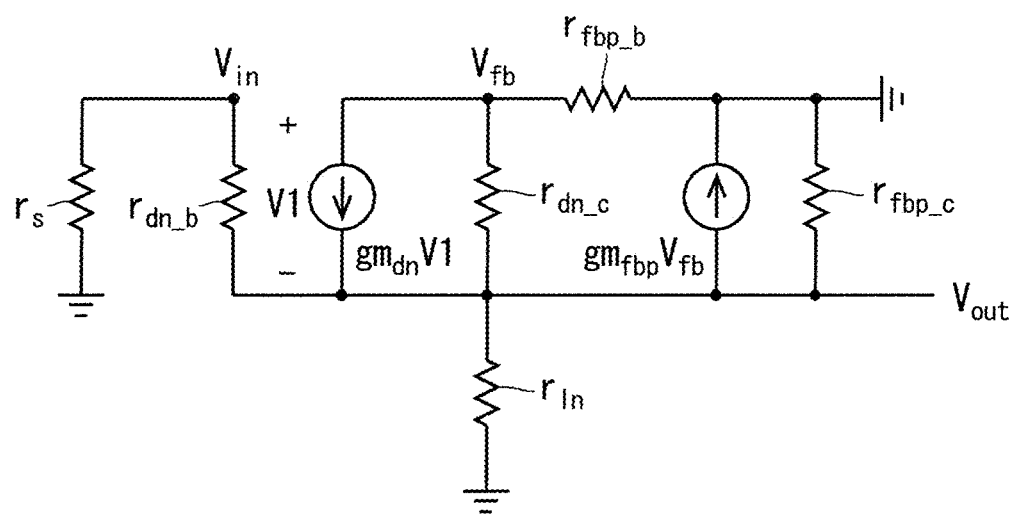

F I G. 3 8
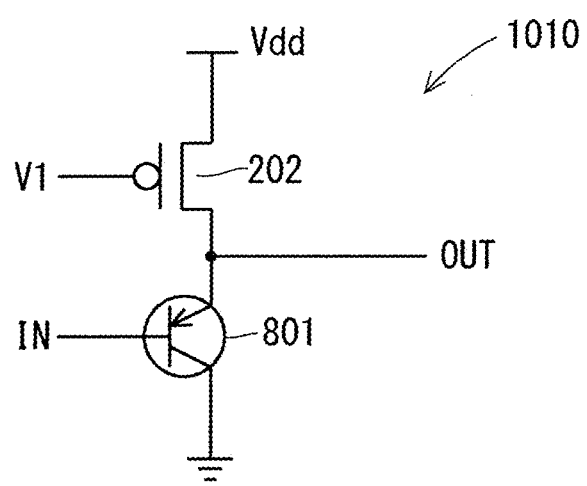

F I G. 3 9
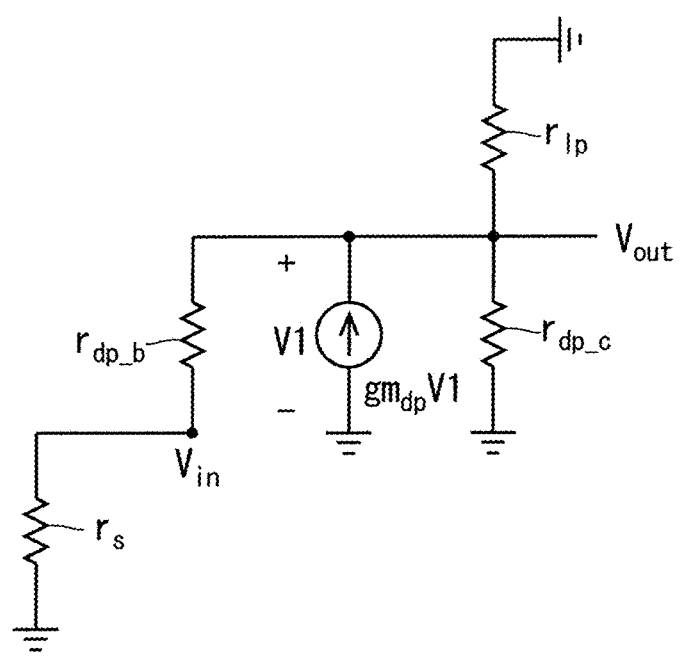

F I G. 4 1
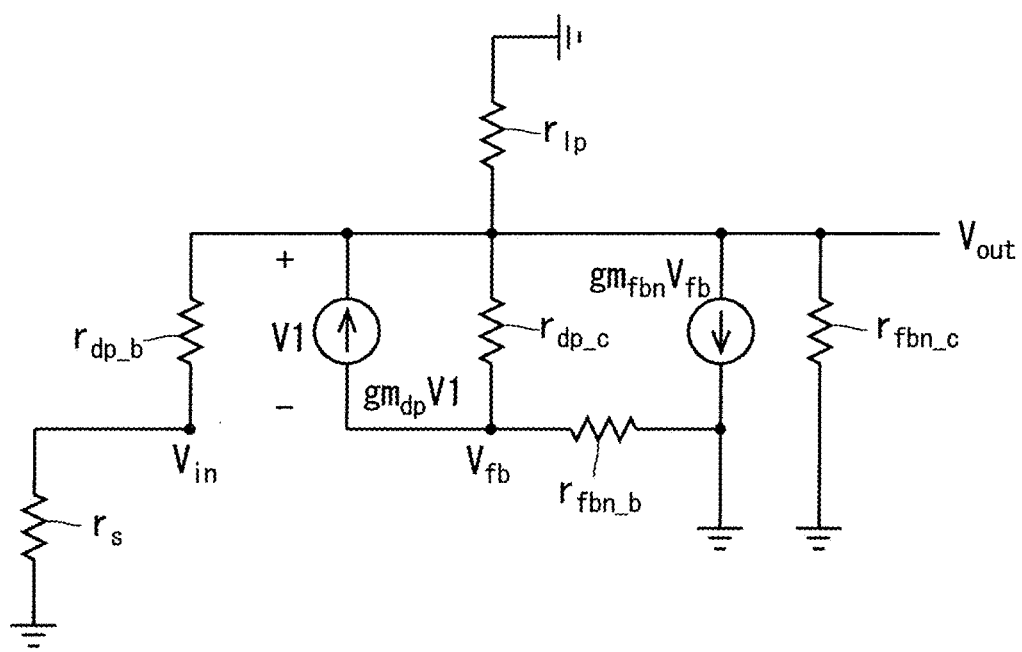

F I G. 4 5
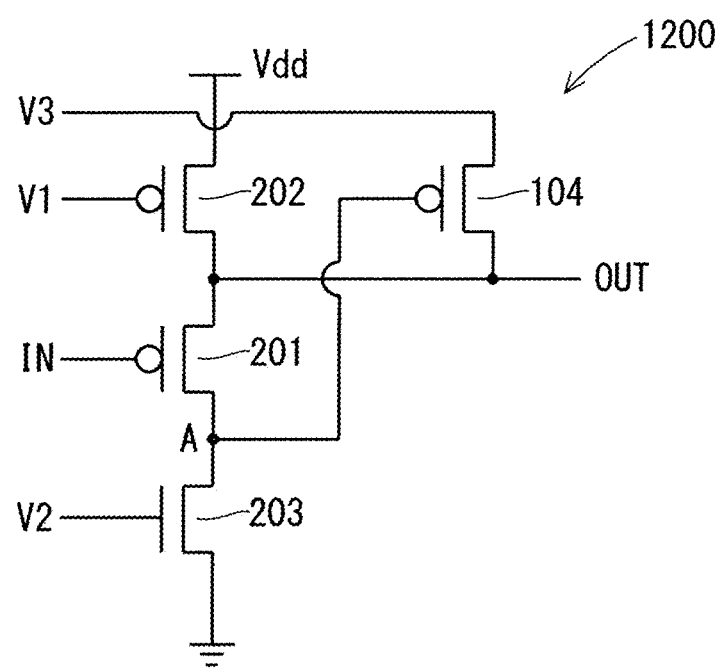

F I G. 4 6
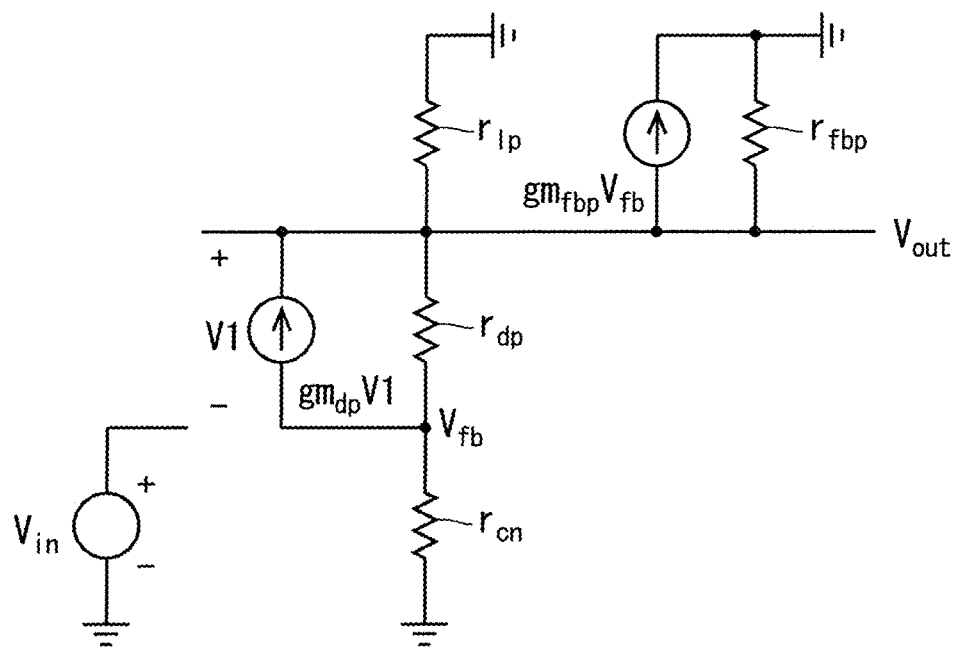

F I G. 4 7
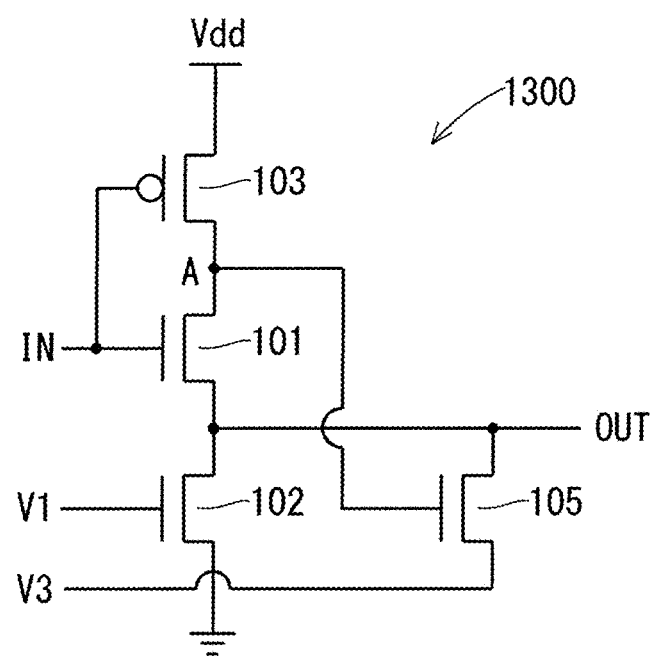

F I G. 4 9
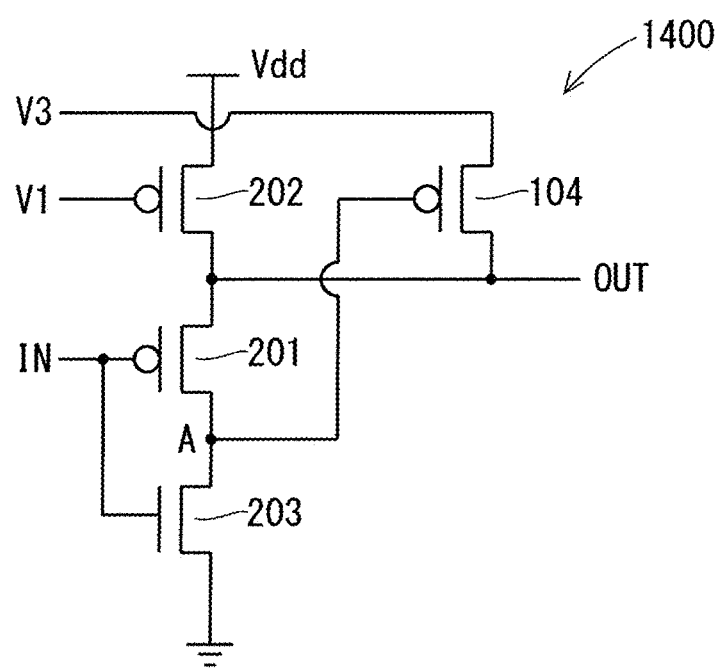

F I G. 50
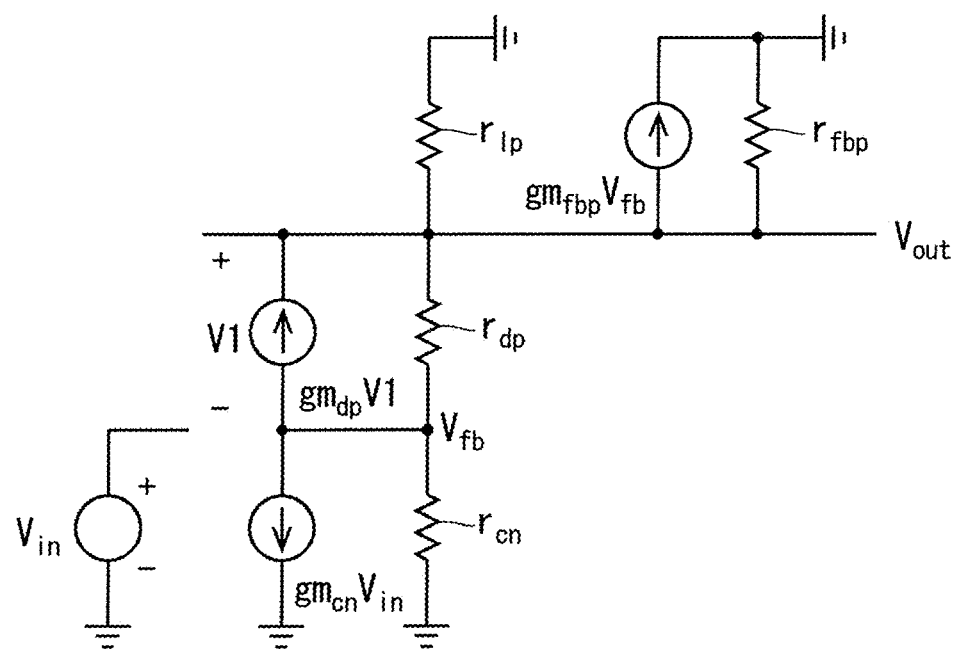

F I G. 5 4
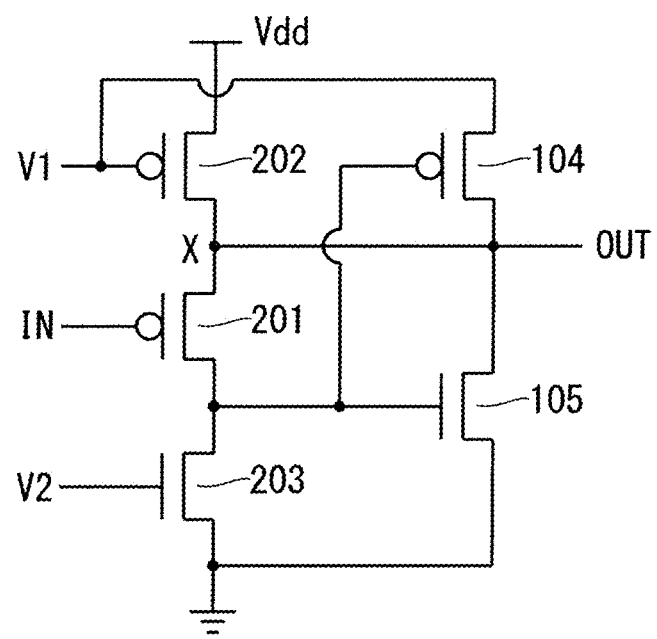

F I G. 5 5
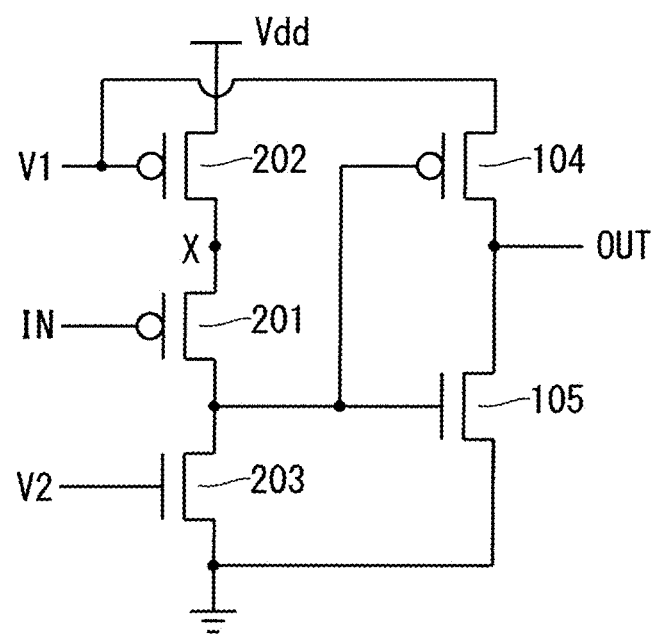

F I G. 5 7
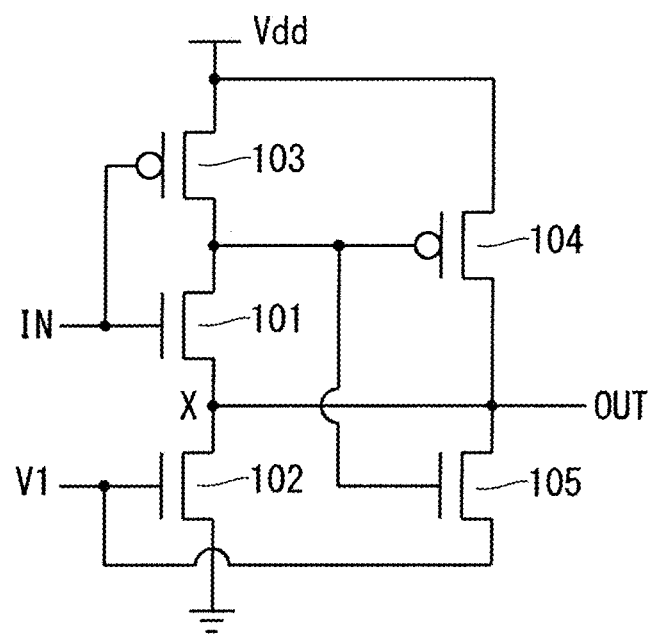

F I G. 6 0
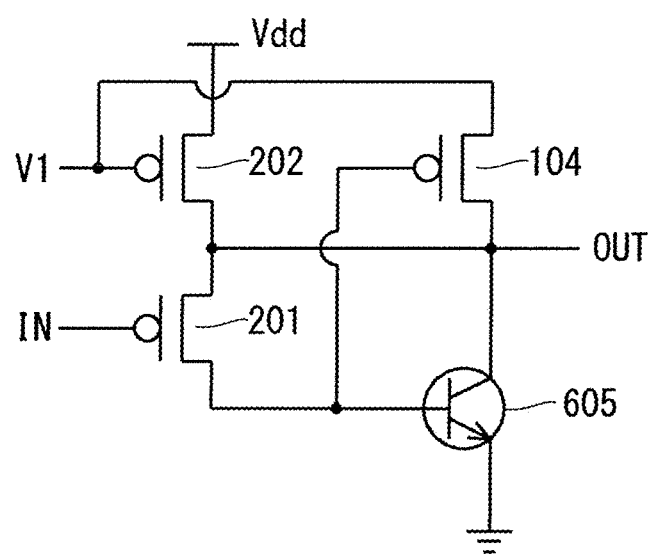

F I G. 6 3
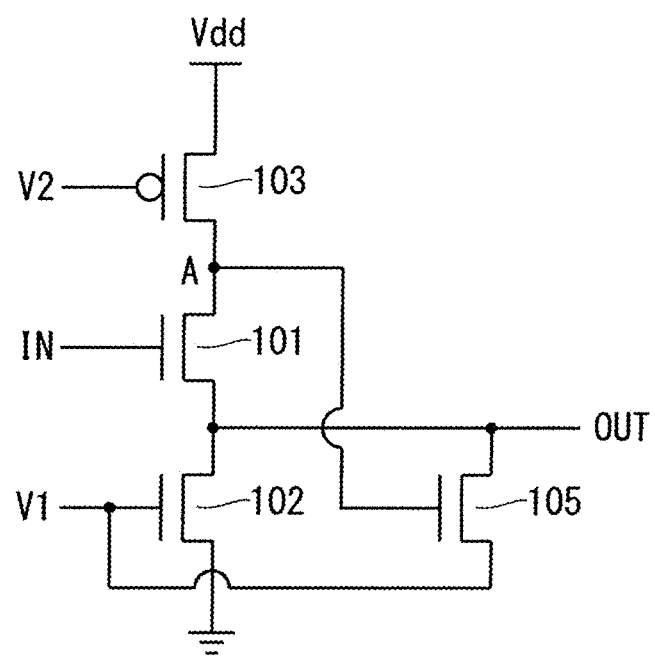

F I G. 6 5
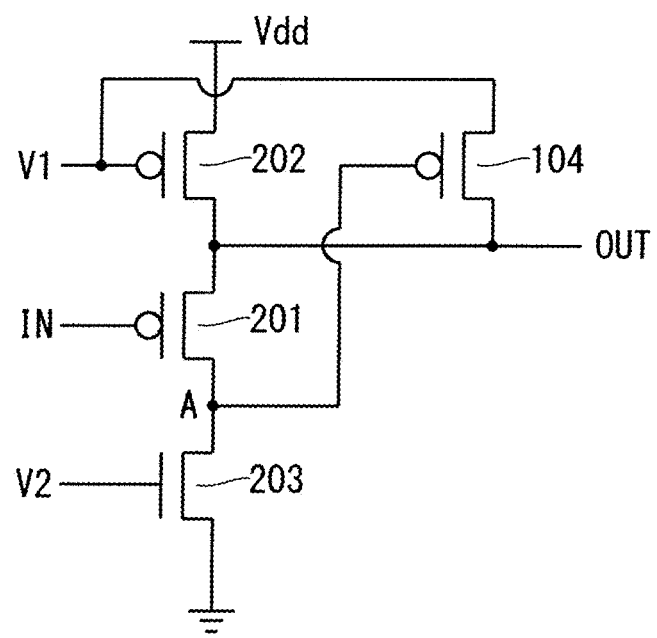

F I G. 6 6
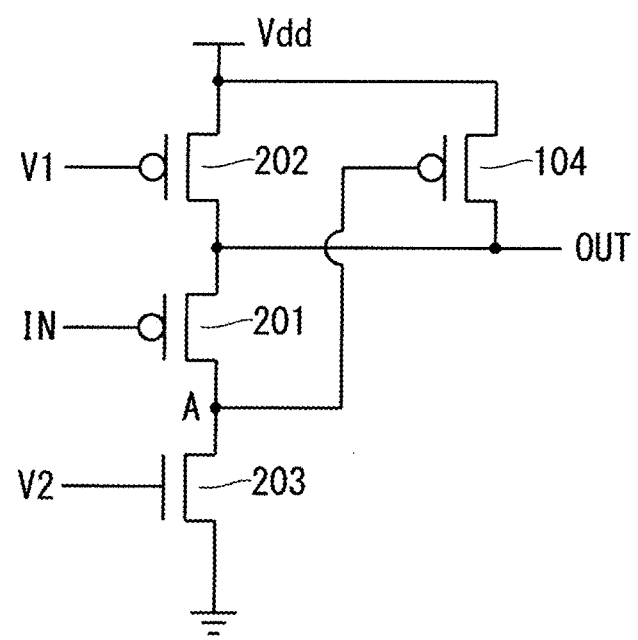

F I G. 69
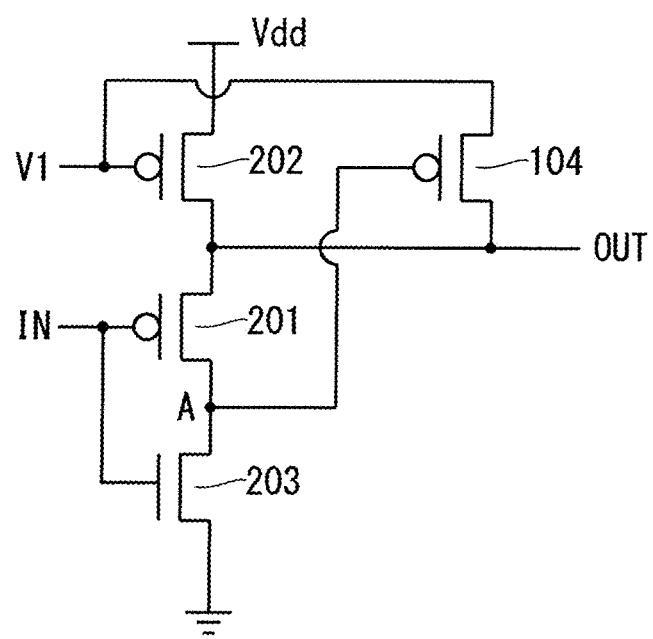

F I G. 7 0
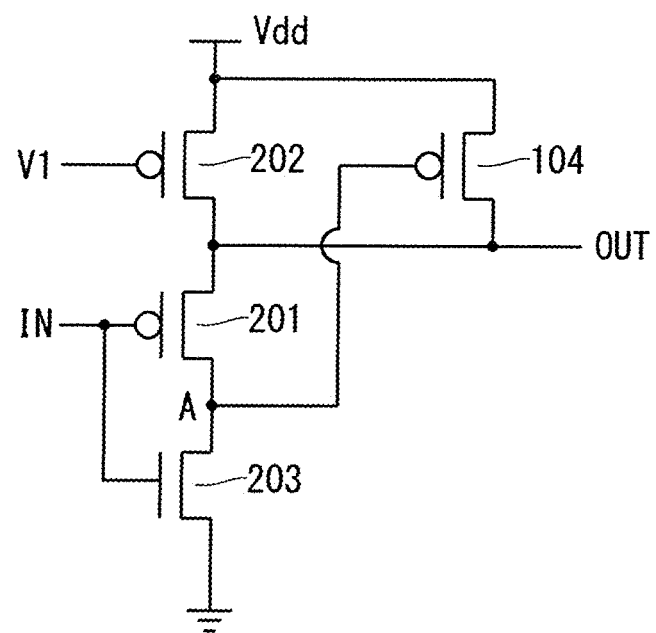

AMPLIFIER CIRCUIT AND COMPOSITE CIRCUIT

CROSS-REFERENCE TO RELATED APPLICATION

The present application is based on PCT filing PCT/JP2020/034258, filed Sep. 10, 2020, the entire contents of which are incorporated herein by reference.

TECHNICAL FIELD

The technology disclosed in the present specification relates to an amplifier circuit and a composite circuit.

BACKGROUND ART

In an electronic circuit, an amplifier circuit having a low output impedance and a large driving force of an output load is required. As such an amplifier circuit, for example, a super source follower (i.e., SSF) circuit is known.

The SSF circuit is obtained by replacing a bipolar junction transistor (i.e., BJT) with a field-effect transistor (i.e., FET) in an inverted Darlington circuit.

For example, Japanese Patent Application Laid-Open No. 2013-179077 (i.e., Patent Document 1) discloses an SSF circuit including an input transistor, a current source load transistor, a current source transistor formed of a P-type metal-oxide-semiconductor field-effect transistor (i.e., MOSFET), and a feedback transistor formed of a P-type MOSFET. Further, for example, International Publication No. WO 2019/107084 (i.e., Patent Document 2) discloses a class AB SSF circuit with a low output impedance.

PRIOR ART DOCUMENT

Patent Documents

Patent Document 1: Japanese Patent Application Laid-Open No. 2013-179077
Patent Document 2: International Publication No. WO 2019/107084

SUMMARY

Problem to be Solved by the Invention

However, in the SSF circuit disclosed in Patent Document 1, large overshoot and undershoot occur in the rising and falling of an output waveform, and hence the rising settling time and the falling settling time become longer.

The technology disclosed in the present specification has been made in view of the problems described above and is a technology for keeping the rising settling time and falling settling time short in an amplifier circuit.

Means to Solve the Problem

An amplifier circuit that is a first aspect of the technology disclosed in the present specification is an amplifier circuit that amplifies a signal input to an input terminal and outputs the amplified signal to an output terminal, the amplifier circuit including: a first transistor of a first conductivity type having a first control terminal, a first current terminal connected to a first potential, and a second current terminal connected to the output terminal; a second transistor of a second conductivity type different from the first conductivity type, the second transistor having a second control terminal connected to the input terminal, a third current terminal connected to the output terminal, and a fourth current terminal connected to the first control terminal of the first transistor; a third transistor that is a field-effect transistor of a third conductivity type, the third transistor having a third control terminal that is a gate terminal connected to a first fixed potential, a fifth current terminal that is a source terminal connected to a second potential, and a sixth current terminal that is a drain terminal connected to the output terminal; and a fourth transistor that is a field-effect transistor of a fourth conductivity type different from the first conductivity type, the fourth transistor having a fourth control terminal that is a gate terminal connected to the first control terminal of the first transistor at an equal potential, a seventh current terminal that is a source terminal connected to a third fixed potential, and an eighth current terminal that is a drain terminal connected to the output terminal.

An amplifier circuit that is a second aspect of the technology disclosed in the present specification is an amplifier circuit that amplifies a signal input to an input terminal and outputs the amplified signal to an output terminal, the amplifier including: a first transistor that is a field-effect transistor of a first conductivity type, the first transistor having a first control terminal that is a gate terminal, a first current terminal that is a source terminal connected to a first potential, and a second current terminal that is a drain terminal connected to the output terminal; a second transistor that is a field-effect transistor of a second conductivity type different from the first conductivity type, the second transistor having a second control terminal that is a gate terminal connected to the input terminal, a third current terminal that is a source terminal, and a fourth current terminal that is a drain terminal connected to the first control terminal that is a gate terminal of the first transistor; a third transistor that is a field-effect transistor of the second conductivity type, the third transistor having a third control terminal that is a gate terminal connected to a first fixed potential, a fifth current terminal that is a source terminal connected to a second potential, and a sixth current terminal that is a drain terminal connected to the third current terminal that is a source terminal of the second transistor; a fourth transistor that is a field-effect transistor of the second conductivity type, the fourth transistor having a fourth control terminal that is a gate terminal connected to the first control terminal that is a gate terminal of the first transistor at an equal potential, a seventh current terminal that is a source terminal connected to a third fixed potential, and an eighth current terminal that is a drain terminal connected to the output terminal; a current source element that supplies a current to the fourth current terminal that is a drain terminal of the second transistor; a differential amplifier having a first differential input terminal connected to a connection point between the third current terminal that is the source terminal of the second transistor and the sixth current terminal that is the drain terminal of the third transistor, the differential amplifier having a second differential input terminal connected to the output terminal; and a switching device capable of switching whether or not to connect the first differential input terminal and the second differential input terminal of the differential amplifier.

A composite circuit according to a third aspect of the technology disclosed in the present specification is a composite circuit including: the amplifier circuit; and an evaluation circuit used to determine the first fixed potential and the second fixed potential to satisfy a condition that no current flows between the output terminal and a connection point between the third current terminal of the second transistor and the sixth current terminal that is the drain terminal of the third transistor. The evaluation circuit includes a sixth transistor that is a field-effect transistor of a first conductivity type, the sixth transistor having a sixth control terminal that is a gate terminal, an eleventh current terminal that is a source terminal connected to the first potential, and a twelfth current terminal that is a drain terminal connected to the output terminal, a seventh transistor that is a field-effect transistor of a second conductivity type different from the first conductivity type, the seventh transistor having a seventh control terminal that is a gate terminal connected to the input terminal, a thirteenth current terminal that is a source terminal, and a fourteenth current terminal that is a drain terminal connected to the sixth control terminal that is a gate terminal of the sixth transistor, an eighth transistor that is a field-effect transistor of the second conductivity type different from the first conductivity type, the eighth transistor having an eighth control terminal that is a gate terminal connected to the first fixed potential, a fifteenth current terminal that is a source terminal connected to the second potential, and a sixteenth current terminal that is a drain terminal connected to the thirteenth current terminal that is a source terminal of the seventh transistor, a ninth transistor that is a field-effect transistor of the second conductivity type, the ninth transistor having a ninth control terminal that is a gate terminal connected to the sixth control terminal that is a gate terminal of the sixth transistor at an equal potential, a seventeenth current terminal that is a source terminal connected to a third fixed potential, and an eighteenth current terminal that is a drain terminal connected to the output terminal, and a current source element that supplies a current to the fourteenth current terminal that is a drain terminal of the seventh transistor.

An amplifier circuit that is a fourth aspect of the technology disclosed in the present specification is an amplifier circuit that amplifies a signal input to an input terminal and outputs the amplified signal to an output terminal, the amplifier circuit including: a first transistor of a first conductivity type having a first control terminal, a first current terminal connected to a third fixed potential, and a second current terminal connected to the output terminal; a second transistor of the first conductivity type having a second control terminal connected to the input terminal, a third current terminal connected to the output terminal, and a fourth current terminal connected to the first control terminal of the first transistor; and a third transistor that is a field-effect transistor of a third conductivity type, the third transistor having a third control terminal that is a gate terminal connected to a first fixed potential, a fifth current terminal that is a source terminal connected to a second potential, and a sixth current terminal that is a drain terminal connected to the output terminal.

An amplifier circuit that is a fifth aspect of the technology disclosed in the present specification is an amplifier circuit that amplifies a signal input to an input terminal and outputs the amplified signal to an output terminal, the amplifier circuit including: a first field-effect transistor of a first conductivity type having a first gate terminal, a first source terminal connected to a third fixed potential, and a first drain terminal connected to the output terminal; a second field-effect transistor of a first conductivity type having a second gate terminal connected to the input terminal, a second source terminal connected to the output terminal, and a second drain terminal connected to the first gate terminal of the first field-effect transistor; a third field-effect transistor of a third conductivity type having a third gate terminal connected to a first fixed potential, a third source terminal connected to a second potential, and a third drain terminal connected to the output terminal; and a fourth field-effect transistor of a fourth conductivity type different from the first conductivity type, the fourth field-effect transistor having a fourth gate terminal connected to the input terminal, a fourth source terminal connected to a first potential, and a fourth drain terminal connected to the second drain terminal of the second field-effect transistor.

Effects of the Invention

According to at least the first, second, third, fourth, and fifth aspects of the technology disclosed in the present specification, the rising settling time and the falling settling time can be kept short in the amplifier circuit.

Further, objects, features, aspects, and advantages relating to the technology disclosed in the present specification will be more apparent from the following detailed description and the accompanying drawings.

BRIEF DESCRIPTION OF DRAWINGS

FIG. 3 is a diagram illustrating an example of the small signal equivalent circuit of the source follower circuit illustrated in FIG. 2.

FIG. 6 is a diagram illustrating an example of the small signal equivalent circuit of the amplifier circuit of FIG. 1.

FIG. 8 is a diagram illustrating an example of a configuration of an amplifier circuit according to a first modification of the embodiment.

FIG. 10 is a graph illustrating a relationship between an input voltage and a through current in a complementary metal-oxide-semiconductor (CMOS) inverter including a feedback P-type FET and a feedback N-type FET.

FIG. 13 is a diagram illustrating an example of the small signal equivalent circuit of the source follower circuit in FIG. 12.

FIG. 16 is a diagram illustrating an example of the small signal equivalent circuit of the amplifier circuit of FIG. 11.

FIG. 17 is a diagram illustrating an example of a configuration of an amplifier circuit according to a first modification of the embodiment.

FIG. 18 is a diagram illustrating an example of a configuration of an amplifier circuit according to a second modification of the embodiment.

FIG. 19 is a diagram illustrating an example of a configuration of an amplifier circuit according to an embodiment.

FIG. 20 is a diagram illustrating an example of the small signal equivalent circuit of the amplifier circuit of FIG. 19.

FIG. 22 is a diagram illustrating an example of the small signal equivalent circuit of the amplifier circuit of FIG. 21.

FIG. 23 is a diagram illustrating an example of a configuration of an amplifier circuit according to an embodiment.

FIG. 25 is a diagram illustrating an example of the small signal equivalent circuit of the FET-input ID circuit of FIG. 24.

FIG. 27 is a diagram illustrating an example of a configuration of an amplifier circuit according to an embodiment.

FIG. 29 is a diagram illustrating an example of the small signal equivalent circuit of the FET-input ID circuit of FIG. 28.

FIG. 30 is a diagram illustrating an example of the small signal equivalent circuit of the amplifier circuit of FIG. 27.

FIG. 31 is a diagram illustrating an example of a configuration of an amplifier circuit according to an embodiment.

FIG. 32 is a diagram illustrating an example of a configuration of a conventional emitter follower circuit.

FIG. 33 is a diagram illustrating an example of the small signal equivalent circuit of the emitter follower circuit of FIG. 32.

FIG. 35 is a diagram illustrating an example of the small signal equivalent circuit of the ID circuit of FIG. 34.

FIG. 38 is a diagram illustrating an example of a configuration of a conventional emitter follower circuit.

FIG. 39 is a diagram illustrating an example of the small signal equivalent circuit of the emitter follower circuit of FIG. 38.

FIG. 41 is a diagram illustrating an example of the small signal equivalent circuit of the ID circuit of FIG. 40.

FIG. 45 is a diagram illustrating an example of a configuration of an amplifier circuit according to an embodiment.

FIG. 46 is a diagram illustrating an example of the small signal equivalent circuit of the amplifier circuit of FIG. 45.

FIG. 47 is a diagram illustrating an example of a configuration of an amplifier circuit according to an embodiment.

FIG. 49 is a diagram illustrating an example of a configuration of an amplifier circuit according to an embodiment.

FIG. 50 is a diagram illustrating an example of the small signal equivalent circuit of the amplifier circuit of FIG. 49.

FIG. 54 is a diagram illustrating a modification of the configuration illustrated in FIG. 11.

FIG. 55 is a diagram illustrating a modification of the configuration illustrated in FIG. 17.

FIG. 57 is a diagram illustrating a modification of the configuration illustrated in FIG. 19.

FIG. 60 is a diagram illustrating a modification of the configuration illustrated in FIG. 27.

FIG. 63 is a diagram illustrating a modification of the configuration illustrated in FIG. 43.

FIG. 65 is a diagram illustrating a modification of the configuration illustrated in FIG. 45.

FIG. 66 is a diagram illustrating another modification of the configuration illustrated in FIG. 45.

FIG. 69 is a diagram illustrating a modification of the configuration illustrated in FIG. 49.

FIG. 70 is a diagram illustrating another modification of the configuration illustrated in FIG. 49.

DESCRIPTION OF EMBODIMENTS

Figure 1:
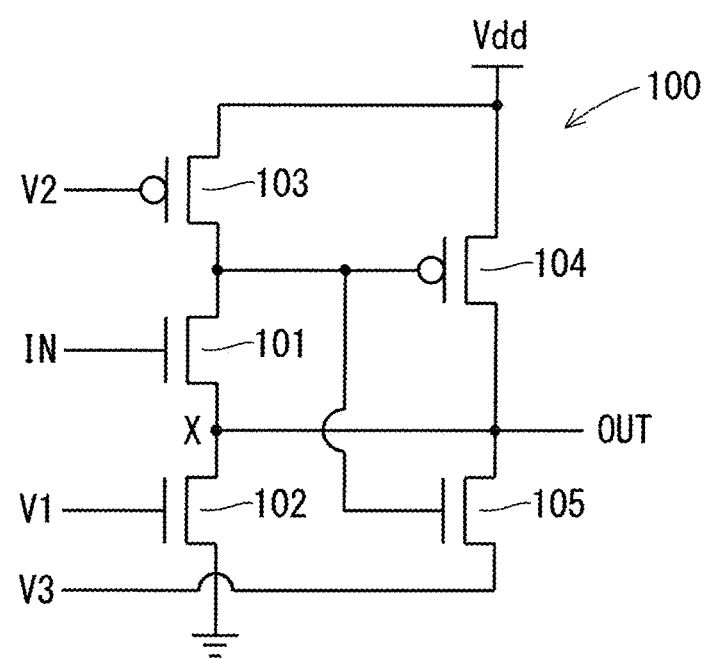
FIG. 1 is a diagram schematically illustrating an example of a configuration of an amplifier circuit according to an embodiment.

Hereinafter, embodiments will be described with reference to the attached drawings. In the following embodiments, detailed features and the like are also shown for the description of the technology, but those are merely examples, and not all of those are necessarily essential features for enabling the embodiments to be carried out.

Note that the drawings are schematically shown, and omission of the configuration or simplification of the configuration may be made in the drawings as appropriate for the convenience of description. The interrelationships among sizes and positions of configurations and the like shown in different drawings are not necessarily accurately described but may be changed as appropriate. Even in drawings such as plan views that are not cross-sectional views, hatching may be given to facilitate understanding of the contents of the preferred embodiments.

In the description shown below, similar components are shown with the same symbol, and it is assumed that this also applies to the names and functions of those components. Accordingly, detailed descriptions of those may be omitted to avoid duplication.

In the description described below, when it is stated that a certain component is "provided", "included", or "provided", it is not an exclusive expression to exclude the existence of other components, unless otherwise specified.

Further, in the description described below, even when an ordinal number such as "first" or "second" is used, these terms are to be used for the sake of convenience to facilitate understanding of the contents of the embodiments, and the order or the like which may occur by these ordinal numbers is not restrictive.

First Embodiment

Hereinafter, an amplifier circuit and a composite circuit according to the present embodiment will be described.
<Configuration of Amplifier Circuit>

FIG. 1 is a diagram schematically illustrating an example of a configuration of an amplifier circuit 100 according to the present embodiment. The amplifier circuit 100 is one form of a source follower circuit. The amplifier circuit 100 can be employed as, for example, an electronic circuit that drives the image sensor.

The amplifier circuit 100 includes a driving N-type FET 101, a load FET 102, a current source FET 103, a feedback P-type FET 104, and a feedback N-type FET 105. Here, the driving N-type FET 101, the load FET 102, and the feedback N-type FET 105 are formed of N-type FETs. The current source FET 103 and the feedback P-type FET 104 are formed of P-type FETs.

Here, "N-type" and "P-type" representing the conductivity type of the FET are examples of "first conductivity type", "second conductivity type", "third conductivity type", and "fourth conductivity type". The first conductivity type may be N-type and the second conductivity type may be P-type, or vice versa. The first conductivity type may be N-type, and the fourth conductivity type may be P-type, or vice versa.

The source (i.e., source terminal) of the load FET 102 is connected to GND, and the drain (i.e., drain terminal) of the load FET 102 is connected to the source of the driving N-type FET 101.

The drain of the current source FET 103 is connected to the drain of the driving N-type FET 101, and the source of the current source FET 103 is connected to a power supply.

That is, the current source FET 103, the driving N-type FET 101, and the load FET 102 are connected in series between the power supply and the GND.

Note that the above "power supply" represents a power supply terminal or a power supply potential, and the "GND" represents a ground potential. The "power supply" and the "GND" are examples of the "first potential" and the "second potential". The first potential may be the power supply and the second potential may be the GND, or vice versa.

An input terminal IN of the amplifier circuit 100 is connected to a gate (i.e., gate terminal) of the driving N-type FET 101. A fixed potential V1 is input to the gate of the load FET 102. Thereby, the load FET 102 functions as a constant current source.

Note that the "gate", "source", and "drain" of the FET are examples of a "control terminal", a "current terminal", and the like.

The connection point between the source of the driving N-type FET 101 and the drain of the load FET 102 is connected to an output terminal OUT.

Further, the source of the feedback P-type FET 104 is connected to a power supply, and the drain of the feedback P-type FET 104 is connected to the drain of the feedback N-type FET 105.

The source of the feedback N-type FET 105 is connected to a fixed potential V3. Both the gate of the feedback P-type FET 104 and the gate of the feedback N-type FET 105 are connected at an equal potential to the connection point between the drain of the current source FET 103 and the drain of the driving N-type FET 101.

The connection point between the drain of the feedback P-type FET 104 and the drain of the feedback N-type FET 105 is connected to the output terminal OUT.
<Operation of Amplifier Circuit>

The small signal operation of the amplifier circuit 100 will be described while being compared with the small signal operations of the conventional source follower circuit and the SSF circuit.

Figure 2:
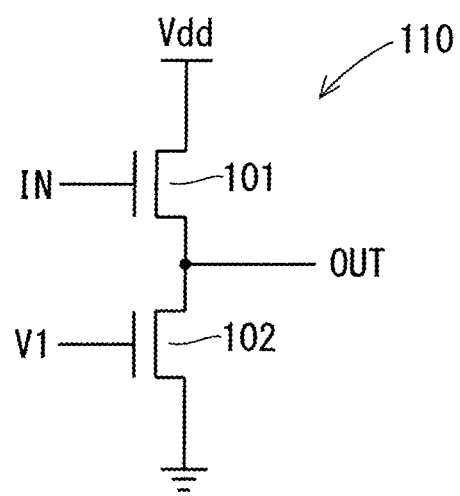
FIG. 2 is a diagram illustrating an example of a configuration of a conventional source follower circuit.

FIG. 2 is a diagram illustrating an example of a configuration of a conventional source follower circuit 110. In FIG. 2, the source of the load FET 102 is connected to the GND, and the drain of the load FET 102 is connected to the source of the driving N-type FET 101. The drain of the driving N-type FET 101 is connected to the power supply.

That is, the driving N-type FET 101 and the load FET 102 are disposed in series between the power supply and the GND.

The connection point between the source of the driving N-type FET 101 and the drain of the load FET 102 is connected to an output terminal OUT. The gate of the load FET 102 is connected to the fixed potential V1, and the load FET 102 functions as a constant current source.

As compared with the amplifier circuit 100 illustrated in FIG. 1, the source follower circuit 110 corresponds to a configuration in which the current source FET 103, the feedback P-type FET 104, and the feedback N-type FET 105 are omitted from the amplifier circuit 100.

FIG. 3 is a diagram illustrating an example of the small signal equivalent circuit of the source follower circuit 110 illustrated in FIG. 2. The output resistance of the source follower circuit 110 is expressed by the following expression (1).

$$\frac{V_{out}}{I_{out}} = r_{dn} \mathbin{/\mkern-5mu/} r_{ln} \mathbin{/\mkern-5mu/} \frac{1}{gm_{dn}} \tag{1}$$

Here, $r_{dn}$ represents the output resistance of the driving N-type FET 101, $r_{ln}$ represents the output resistance of the load FET 102, and $gm_{dn}$ represents the transconductance of the driving N-type FET 101. In addition, in expression (1), the symbol "//" is defined by the following expression (2).

$$A \mathbin{/\mkern-5mu/} B = \frac{AB}{A+B} \tag{2}$$

In an ideal FET without channel length modulation, $r_{in} \to \infty$ and $gm_{dn} \gg 1$, so that expression (1) can be approximated as the following expression (3).

$$\frac{V_{out}}{I_{out}} = \frac{1}{gm_{dn}} \quad (3)$$

Figure 4:
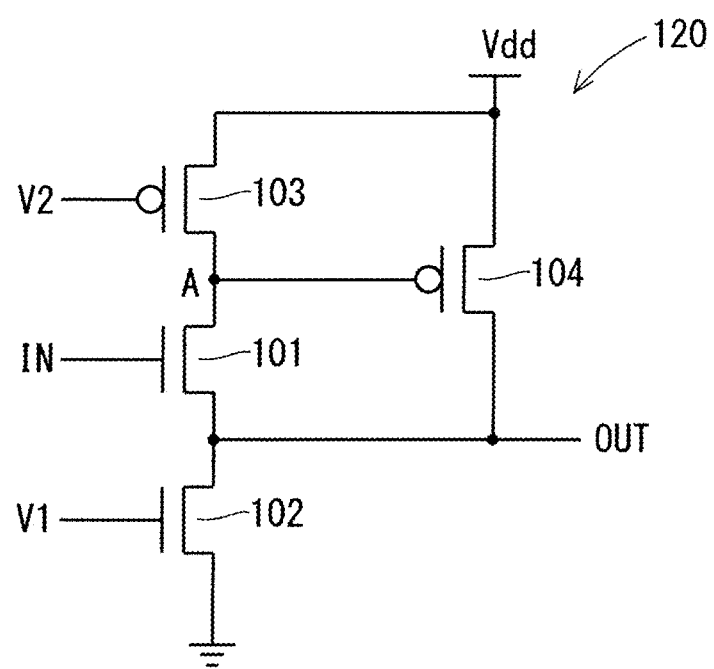
FIG. 4 is a diagram illustrating an example of a configuration of an SSF circuit.

FIG. 4 is a diagram illustrating an example of the configuration of the SSF circuit 120. An SSF circuit 120 illustrated in FIG. 4 corresponds to a configuration in which the current source FET 103 and the feedback P-type FET 104 are added to the source follower circuit 110 illustrated in FIG. 3. Further, as compared with the amplifier circuit 100 illustrated in FIG. 1, the SSF circuit 120 illustrated in FIG. 4 corresponds to a configuration in which the feedback N-type FET 105 is omitted from the amplifier circuit 100.

Figure 5:
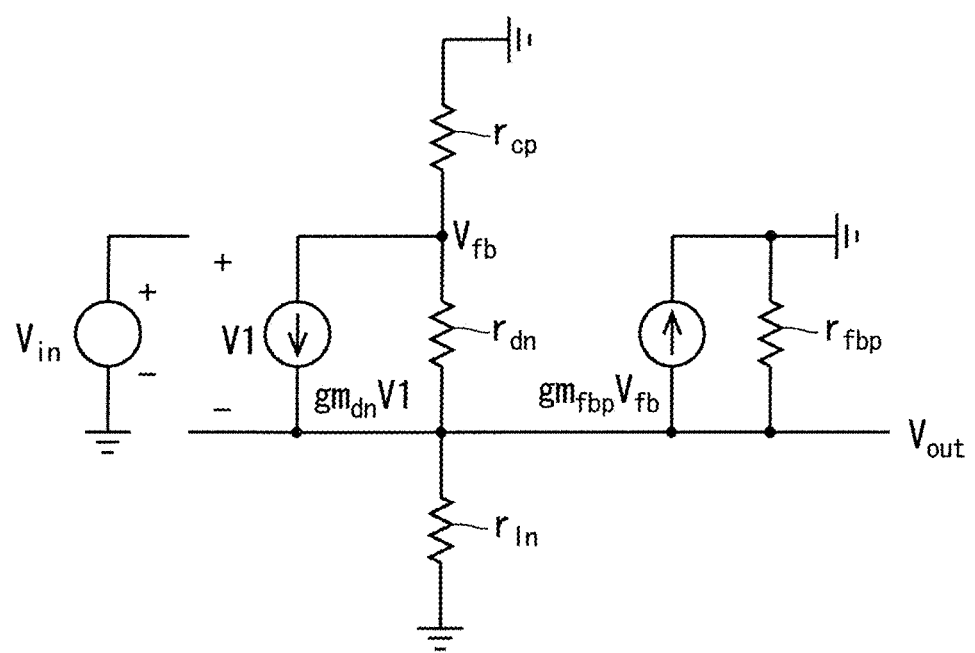
FIG. 5 is a diagram illustrating an example of the small signal equivalent circuit of the SSF circuit illustrated in FIG. 4.

FIG. 5 is a diagram illustrating an example of the small signal equivalent circuit of the SSF circuit 120 illustrated in FIG. 4. From Kirchhoff's current law at the drain of the driving N-type FET 101 and the output terminal, the following expressions (4) and (5) hold.

$$V_{fb}/r_{cp} = \frac{V_{out} - V_{fb}}{r_{dn}} + gm_{dn}(V_{out} - V_{in}) \quad (4)$$

$$I_{out} = (gm_{fbp} + 1/r_{cp})V_{fb} + (1/r_{fbp} + 1/r_{in})V_{out} \quad (5)$$

Here, $V_{fb}$ represents the drain voltage of the driving N-type FET 101, $r_{cp}$ represents the output resistance of the current source FET 103, $gm_{fbp}$ represents the transconductance of the feedback P-type FET 104, and $r_{fbp}$ represents the output resistance of the feedback P-type FET 104.

When $V_{in} = 0$, the output resistance can be calculated from expressions (4) and (5) as in the following expression (6).

$$\frac{V_{out}}{I_{out}} = r_{In}//r_{fpb}//\frac{r_{dn} + r_{cp}}{(1 + gm_{dn}r_{dn})(1 + gm_{fbp}r_{cp})} \quad (6)$$

In an ideal FET without channel length modulation, $r_{in} \to \infty$, $r_{cp} \to \infty$, $gm_{dn}r_{dn} \gg 1$, and $gm_{fbp}r_{fbp} \gg 1$, so that expression (6) can be approximated as the following expression (7).

$$\frac{V_{out}}{I_{out}} = \frac{1}{gm_{dn}r_{dn}gm_{fbp}} \quad (7)$$

Comparing expression (7) with expression (3) shows that the output resistance is reduced to $1/r_{dn}/gm_{fbp}$ times that of the source follower circuit 110 in the SSF circuit 120. Therefore, the driving force of the output load in the SSF circuit 120 is higher than that in the source follower circuit 110.

Next, referring back to FIG. 4, the small signal operation of the SSF circuit 120 will be described.

When the voltage of the input terminal rises, the gate voltage of the driving N-type FET 101 rises, so that the source-drain current of the driving N-type FET 101 increases. As a result, the source voltage of the driving N-type FET 101 rises, and the drain voltage falls. With the output terminal being connected to the source of the driving N-type FET 101, the rise in the source voltage of the driving N-type FET 101 is, in other words, the rise in the voltage of the output terminal.

At the same time, as the drain voltage of the driving N-type FET 101 falls, the gate voltage of the feedback P-type FET 104 falls, and the source-drain current increases. Here, with the load FET 102 being the constant current source, the source-drain current of the driving N-type FET 101 turns to decrease according to Kirchhoff's current law at the output terminal. This suppresses the rise in the source voltage and the fall in the drain voltage of the driving N-type FET 101. The suppression of the rise in the source voltage of the driving N-type FET 101 is, in other words, the suppression of the rise in the voltage of the output terminal.

Conversely, when the voltage of the input terminal falls, the gate voltage of the driving N-type FET 101 falls, so that the source-drain current of the driving N-type FET 101 decreases. As a result, the source voltage of the driving N-type FET 101 falls, and the drain voltage rises. The fall in the source voltage of the driving N-type FET 101 is, in other words, the fall in the voltage of the output terminal. At the same time, as the drain voltage of the driving N-type FET 101 rises, the gate voltage of the feedback P-type FET 104 rises, and the source-drain current decreases. With the load FET 102 being the constant current source, the source-drain current of the driving N-type FET 101 turns to increase according to Kirchhoff's current law at the output terminal. This suppresses the fall in the source voltage and the rise in the drain voltage of the driving N-type FET 101. The suppression of the fall in the source voltage of the driving N-type FET 101 is, in other words, the suppression of the fall in the voltage of the output terminal.

As described above, in the SSF circuit 120, the output fluctuation rapidly shifts from a transient state to a steady state as compared with the source follower circuit 110.

Next, a method for driving the SSF circuit 120 will be described.

A ground potential is applied to the source of the load FET 102, and a power supply potential Vdd is applied to the source of the current source FET 103 and the source of the feedback P-type FET 104. By applying the fixed potential V1 to the gate of the load FET 102, the load FET 102 is operated in the saturation region to serve as the constant current source, and by applying the fixed potential V2 to the gate of the current source FET 103, the current source FET 103 is operated in the saturation region to serve as the constant current source. However, it is assumed that the relationship of Vdd>V2>V1>ground potential (GND) is satisfied.

Here, the fixed potential V1, the fixed potential V2, the fixed potential V3, and the like are examples of a "first fixed potential", a "second fixed potential", a "third fixed potential", and the like.

In this state, an input signal is input to the input terminal connected to the gate of the driving N-type FET 101, and an output signal is output from the output terminal connected to the source of the driving N-type FET 101.

Next, the small signal operation of the amplifier circuit 100 according to the present embodiment will be described. FIG. 6 is a diagram illustrating an example of the small signal equivalent circuit of the amplifier circuit 100 of FIG. 1. From Kirchhoff's current law at the drain of the driving N-type FET 101 and the output terminal, expression (4) and the following expression (8) hold.

$$I_{out} = (gm_{fbn} + gm_{fbp} + 1/r_{cp})V_{fb} + (1/r_{fbn} + 1/r_{fbp} + 1/r_{in})V_{out} \quad (8)$$

Here, $gm_{fbn}$ is the transconductance of the feedback N-type FET 105, and $r_{fbn}$ is the output resistance of the feedback N-type FET 105.

When $V_{in}=0$, the output resistance can be calculated from expressions (4) and (8) as in the following expression (9).

$$\frac{V_{out}}{I_{out}} = r_{ln}//r_{fbn}//r_{fbp}//\frac{r_{dn}+r_{cp}}{(1+gm_{dn}r_{dn})(1+gm_{fbn}r_{cp}+gm_{fbp}r_{cp})} \quad (9)$$

In an ideal FET without channel length modulation, $r_{in}\to\infty$, $r_{cp}\to\infty$, $gm_{dn}r_{dn}>>1$, $gm_{fbp}r_{fbp}>>1$, and $gm_{fbn}r_{fbn}>>1$, so that expression (9) can be approximated as the following expression (10).

$$\frac{V_{out}}{I_{out}} = \frac{1}{gm_{dn}r_{dn}(gm_{fbn}+gm_{fbp})} \quad (10)$$

Comparing expression (10) with expression (7) shows that the output resistance is reduced to $gm_{fbp}/(gm_{fbn}+gm_{fbp})$ times that of the SSF circuit 120 in the amplifier circuit 100. Therefore, the driving force of the output load in the amplifier circuit 100 is higher than that in the SSF circuit 120.

Next, referring back to FIG. 1, the small signal operation of the amplifier circuit 100 will be described.

When the voltage of the input terminal rises, the gate voltage of the driving N-type FET 101 rises, so that the source-drain current of the driving N-type FET 101 increases. As a result, the source voltage of the driving N-type FET 101 rises, and the drain voltage falls. The rise in the source voltage of the driving N-type FET 101 is, in other words, the rise in the voltage of the output terminal.

At the same time, as the drain voltage of the driving N-type FET 101 falls, the gate voltage of the feedback P-type FET 104 falls and the source-drain current increases, and the gate voltage of the feedback N-type FET 105 falls and the source-drain current decreases. Here, with the load FET 102 being the constant current source, the source-drain current of the driving N-type FET 101 turns to decrease according to Kirchhoff's current law at the output terminal. This suppresses the rise in the source voltage and the fall in the drain voltage of the driving N-type FET 101. The suppression of the rise in the source voltage of the driving N-type FET 101 is, in other words, the suppression of the rise in the voltage of the output terminal.

Conversely, when the voltage of the input terminal falls, the gate voltage of the driving N-type FET 101 falls, so that the source-drain current of the driving N-type FET 101 decreases. As a result, the source voltage of the driving N-type FET 101 falls, and the drain voltage rises. The fall in the source voltage of the driving N-type FET 101 is, in other words, the fall in the voltage of the output terminal.

At the same time, as the drain voltage of the driving N-type FET 101 rises, the gate voltage of the feedback P-type FET 104 rises and the source-drain current decreases, and the gate voltage of the feedback N-type FET 105 rises and the source-drain current increases. With the load FET 102 being the constant current source, the source-drain current of the driving N-type FET 101 turns to increase according to Kirchhoff's current law at the output terminal. This suppresses the fall in the source voltage and the rise in the drain voltage of the driving N-type FET 101. The suppression of the fall in the source voltage of the driving N-type FET 101 is, in other words, the suppression of the fall in the voltage of the output terminal.

Figure 7:
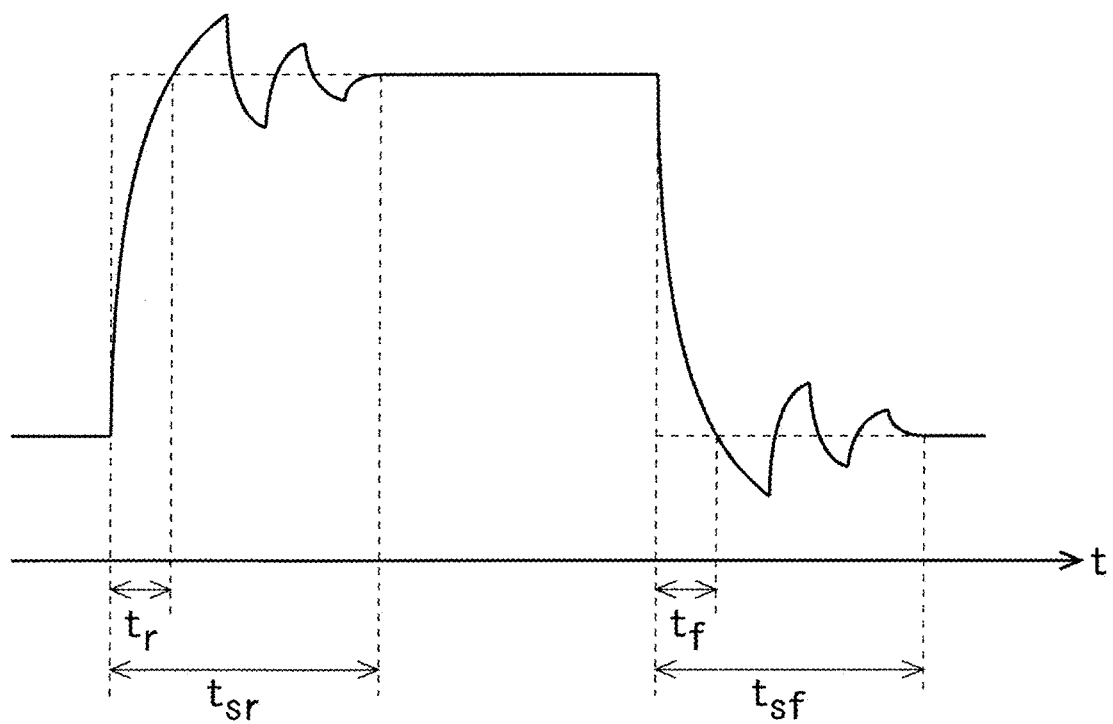
FIG. 7 is a schematic diagram illustrating an example of an output waveform of an amplifier circuit.

As described above, in the amplifier circuit 100 according to the present embodiment, the output feedback speed becomes higher than in the SSF circuit 120 because of the addition of the feedback N-type FET 105, and the output fluctuation quickly shifts from the transient state to the steady state. In particular, the output feedback speed becomes higher at the falling edge than at the rising edge of the output waveform. Therefore, in the output waveform of the amplifier circuit 100, the rising and falling become steep, while the overshoot and undershoot of the rising and falling are reduced, and the oscillation of the output waveform is also reduced. As a result, as illustrated in FIG. 7, a rising time $t_r$ and a falling time $t_f$ of the output waveform of the amplifier circuit 100 are shortened, and an amplifier circuit capable of transmitting a faster clock signal can be obtained. In addition, a rising settling time $t_{sr}$ and a falling settling time $t_{sf}$ are shortened, and an amplifier circuit capable of driving a larger output load can be obtained. Note that FIG. 7 is a schematic diagram illustrating an example of the output waveform of the amplifier circuit 100. In FIG. 7, the vertical axis represents signal output, and the horizontal axis represents time.

In the amplifier circuit 100, the gate-source voltages of the feedback P-type FET 104 and the feedback N-type FET 105 are equalized, so that an inverter including a feedback transistor with symmetrical design parameters (threshold voltage, ratio of gate length to gate width, gate oxide film capacitance, etc.) can be configured, and the degree of freedom in design and versatility are enhanced.

Next, a method for driving the amplifier circuit 100 will be described.

A ground potential is applied to the source of the load FET 102, and a power supply potential Vdd is applied to the source of the current source FET 103 and the source of the feedback P-type FET 104. By applying the fixed potential V1 to the gate of the load FET 102, the load FET 102 is operated in the saturation region to serve as the constant current source. By applying the fixed potential V2 to the gate of the current source FET 103, the current source FET 103 is operated in the saturation region to serve as the constant current source. By applying the fixed potential V3 to the source of the feedback N-type FET 105, the gate-source voltage is lowered. However, it is assumed that the relationships of Vdd>V2>V1>ground potential (GND) and $V_A \geq V3 \geq$ ground potential (GND) are satisfied.

In this state, an input signal is input to the input terminal connected to the gate of the driving N-type FET 101, and an output signal is output from the output terminal connected to the source of the driving N-type FET 101.

The conventional amplifier circuit as disclosed in Patent Document 2 (International Publication No. WO 2019/107084) has a lower output impedance than a normal SSF, and hence the amplifier circuit has a high driving force and is suitable for high-speed signal transmission or large external load driving. Further, impedance matching with a subsequent stage circuit is easy. Moreover, in the waveform of the output signal, the rising and falling times are short because the rising and falling are steep, and on the contrary, the settling time is short because overshooting and undershooting hardly occur in the rising and falling, or ringing due to oscillation hardly occurs.

However, in such a conventional amplifier circuit, with the design conditions being not optimized, the rising characteristic and the falling characteristic of the output waveform are asymmetric and not shortest, power consumption is large, and hot carriers are often generated. An object of the amplifier circuit 100 according to the present embodiment is to perform large signal analysis in the case of the steady state $I_{out}=0$ of the circuit and to provide an amplifier circuit with optimized design conditions.

Hereinafter, the large-signal operation of the amplifier circuit 100 will be described while being compared with the large-signal operations of the conventional source follower circuit and the SSF circuit. For simplicity, the channel length modulation effect and the substrate bias effect are not considered here. The threshold voltages $Vth_{dn}$, $Vth_{ln}$, and $Vth_{fbn}$ of the driving N-type FET 101, the load FET 102, and the feedback N-type FET 105 are positive values, and the gain coefficients $\beta_{dn}$, $\beta_{ln}$, and $\beta_{fbn}$ thereof are positive values. The threshold voltages $Vth_{cp}$ and $Vth_{fbp}$ of the current source FET 103 and the feedback P-type FET 104 are negative values, and the gain coefficients $\beta_{cp}$ and $\beta_{fbp}$ thereof are positive values.

In FIG. 2 illustrating an example of the configuration of the conventional source follower circuit 110, the gate-source voltage of the driving N-type FET 101 is $V_{gsdn}=V_{in}-V_{out}$, and the gate-source voltage of the load FET 102 is $V_{gs_{ln}}=V1$.

Therefore, when $\beta_x=\mu_x C_x W_x/L_x$, the drain-source currents $Ids_{dn}$ and $Ids_{ln}$ of the driving N-type FET 101 and the load FET 102 at the time of operating in the saturation region are expressed by the following expressions (101) and (102).

$$Ids_{dn} = \frac{1}{2}\beta_{dn}(Vin - Vout - Vth_{dn})^2 \qquad (101)$$

$$Ids_{ln} = \frac{1}{2}\beta_{ln}(V1 - Vth_{ln})^2 \qquad (102)$$

In FIG. 2, $Ids_{dn}=Ids_{ln}$ and hence the relational expression between $V_{out}$ and $V_{in}$ is as in the following expression (103).

$$Vout = Vin - Vth_{dn} - \sqrt{\frac{\beta_{ln}}{\beta_{dn}}}(V1 - Vth_{ln}) \qquad (103)$$

This expression shows that $V_{out} \neq V_{in}$, and there is an offset voltage $V_{os}$ expressed by the following expression (104).

$$Vos = Vth_{dn} + \sqrt{\frac{\beta_{ln}}{\beta_{dn}}}(V1 - Vth_{ln}) \qquad (104)$$

In FIG. 4 illustrating an example of the configuration of the SSF circuit 120, the gate-source voltage of the current source FET 103 is $Vgs_{cp}=V2-Vdd-Vth_{cp}$, and the gate-source voltage of the feedback P-type FET 104 is $Vgs_{fbp}=V_{in}-V_{out}$. Therefore, the drain-source currents $Ids_{cp}$ and $Idsf_{bp}$ of the current source FET 103 and the feedback P-type FET 104 at the time of operating in the saturation region are expressed by the following expressions (105) and (106).

$$Ids_{cp} = -\frac{1}{2}\beta_{cp}(V2 - Vdd - Vth_{cp})^2 \qquad (105)$$

$$Ids_{fbp} = -\frac{1}{2}\beta_{fbp}(V_A - Vdd - Vth_{fbp})^2 \qquad (106)$$

Here, $V_A$ represents a voltage at a node (connection point) A illustrated in FIG. 4 as an example.

In FIG. 4, $Ids_{dn}=-Ids_{cp}$, and hence the relational expression between $V_{out}$ and $V_{in}$ is as in the following expression (107).

$$Vout = Vin - Vth_{dn} + \sqrt{\frac{\beta_{cp}}{\beta_{dn}}}(V2 - Vdd - Vth_{cp}) \qquad (107)$$

This expression shows that $V_{out} \neq V_{in}$, and there is an offset voltage Vos expressed by the following expression (108).

$$Vos = Vth_{dn} - \sqrt{\frac{\beta_{cp}}{\beta_{dn}}}(V2 - Vdd - Vth_{cp}) \qquad (108)$$

In FIG. 1 illustrating an example of the configuration of the amplifier circuit 100 according to the present embodiment, the gate-source voltage of the feedback N-type FET 105 is $V_A-V3-Vth_{fbn}$, so that the drain-source current $Ids_{fbn}$ when the feedback N-type FET 105 operates in the saturation region is expressed by the following expression (109).

$$Ids_{fbn} = \frac{1}{2}\beta_{fbn}(V_A - V3 - Vth_{fbn})^2 \qquad (109)$$

In FIG. 1, $Ids_{dn}=-Ids_{cp}$, and hence the relational expression between $V_{out}$ and $V_{in}$ is as in the following expression (110).

$$Vout = Vin - Vth_{dn} + \sqrt{\frac{\beta_{cp}}{\beta_{dn}}}(V2 - Vdd - Vth_{cp}) \qquad (110)$$

This expression shows that $V_{out} \neq V_{in}$, and there is an offset voltage Vos expressed by the following expression (111).

$$Vos = Vth_{dn} - \sqrt{\frac{\beta_{cp}}{\beta_{dn}}}(V2 - Vdd - Vth_{cp}) \qquad (111)$$

In FIG. 1, the current flowing between the source of the driving N-type FET 101 and the drain of the load FET 102, and the current flowing between the drain of the feedback P-type FET 104 and the drain of the feedback N-type FET 105 are set as 10. In addition, the current flowing in and out of the output terminal OUT is set as $I_{out}$. When the amplifier circuit 100 is operating in the transient state, $I_{out} \neq 0$, but when the amplifier circuit is operating in the steady state, $I_{out}=0$.

Unlike the conventional SSF circuit 120, the amplifier circuit 100 in the present embodiment has I0=0 in the steady state ($I_{out}=0$). That is, in the steady state, no current flows between the output terminal OUT and the connection point (node X) between the source of the driving N-type FET 101 and the drain of the load FET 102. In addition, in the amplifier circuit 100, I0 satisfies $-1$ µA≤I0≤+1 µA in the steady state ($I_{out}=0$).

In contrast, in the conventional SSF circuit 120, I0≠0 in both the steady state ($I_{out}=0$) and the transient state ($I_{out} \neq 0$).

Here, when the channel length modulation effect is added to expressions (102) and (105), the following expressions (112) and (113) are obtained, respectively.

$$Ids_{ln} = \frac{1}{2}\beta_{ln}(V1 - Vth_{ln})^2(1 + \lambda_{ln}Vout) \quad (112)$$

$$Ids_{cp} = -\frac{1}{2}\beta_{cp}(V2 - Vdd - Vth_{cp})^2(1 + \lambda_{cp}(V_A - Vdd)) \quad (113)$$

Here, $\lambda_{ln}$ is the channel length modulation coefficient of the load FET 102, and $\lambda_{cp}$ is the channel length modulation coefficient of the current source FET 103.

When I0=0, no current of the driving N-type FET 101, the load FET 102, and the current source FET 103 flows in and out between the feedback P-type FET 104 and the feedback N-type FET 105, so that $Ids_{ln}=-Ids_{cp}$ is satisfied, and the relationship of the following expression (114) holds between the fixed potential V1 that is the gate voltage of the load FET 102 and the fixed potential V2 that is the gate voltage of the current source FET 103.

$$\sqrt{\beta(1+\lambda_{in}V_{out})}(V1-Vth_{in})=\\ \sqrt{\beta_{cp}(1+\lambda_{cp}(V_A-Vdd))}(V2-Vdd-Vth_{cp}) \quad (114)$$

In particular, when there is no channel length modulation effect, that is, when $\lambda_{ln}=\lambda_{cp}=0$, the relationship of the following expression (115) holds between V1 and V2.

$$\sqrt{\beta_{ln}}(V1-Vth_{ln})=-\sqrt{\beta_{cp}}(V2-Vdd-Vth_{cp}) \quad (115)$$

In particular, when $Vth_{ln}=-Vth_{cp}$ and $\beta_{ln}=\beta_{cp}$, the relational expression between V1 and V2 is the following expression (116).

$$V1+V2=Vdd \quad (116)$$

Similarly, when I0=0, no current of the feedback P-type FET 104 or the feedback N-type FET 105 flows in and out between the driving N-type FET 101, the load FET 102, and the current source FET 103, and thus, similarly to the steady state of the CMOS inverter, $-Idsf_{bb}=Ids_{fbn}$ is satisfied. Therefore, the following relational expression (117) holds between the threshold voltages $Vth_{fbp}$ and $Vth_{fbn}$ and between the gain coefficients $\beta_{fbp}$ and $\beta_{fbn}$.

$$-Vth_{fbp}=Vth_{fbn} \text{ and } \beta_{fbp}=\beta_{fbn} \quad (117)$$

Therefore, I0=0 is theoretically satisfied when expressions (115) and (117) are satisfied, but due to manufacturing variation in an actual circuit, I0=0 may be deviated slightly. In that case, V1 or V2 can be adjusted by the method described below to set I0=0.

FIG. 8 is a diagram illustrating an example of a configuration of an amplifier circuit 150 according to a first modification of the present embodiment. In the amplifier circuit 150, the source of the driving N-type FET 101 and the drain of the load FET 102 (illustrated node X) are not connected to the drain of the feedback P-type FET 104 and the drain of the feedback N-type FET 105 (output terminal OUT) as compared with the amplifier circuit 100.

A differential amplifier or a galvanometer connected between the node X of the amplifier circuit 150 and the output terminal OUT serves as a Wheatstone bridge. In order to set I0=0 in this Wheatstone bridge, V1 or V2 may be changed such that the output of the differential amplifier becomes 0 V or the pointer of the galvanometer becomes 0 point.

Here, when the amplifier circuit 100 and the amplifier circuit 150 are in the vicinity on the same chip, the condition of V1 or V2 at which I0=0 in the amplifier circuit 150 is considered to be equal to the condition of V1 or V2 at which I0=0 in the amplifier circuit 100. Therefore, after the condition of V1 or V2 that I0=0 is extracted using the amplifier circuit 150, the condition can be applied to the amplifier circuit 100 to set I0=0. Alternatively, after V1 or V2 is adjusted in the amplifier circuit 150 such that I0=0, the node X and the output terminal OUT of the amplifier circuit 150 may be short-circuited and used.

For example, the amplifier circuit 150 may be a test element group (TEG) circuit used to extract a condition of at least one of V1 and V2 in which I0=0. In addition, the amplifier circuit 100 and the amplifier circuit 150 functioning as a TEG circuit may be a composite circuit formed on the same chip (same semiconductor device, same integrated circuit, etc.).

Figure 9:
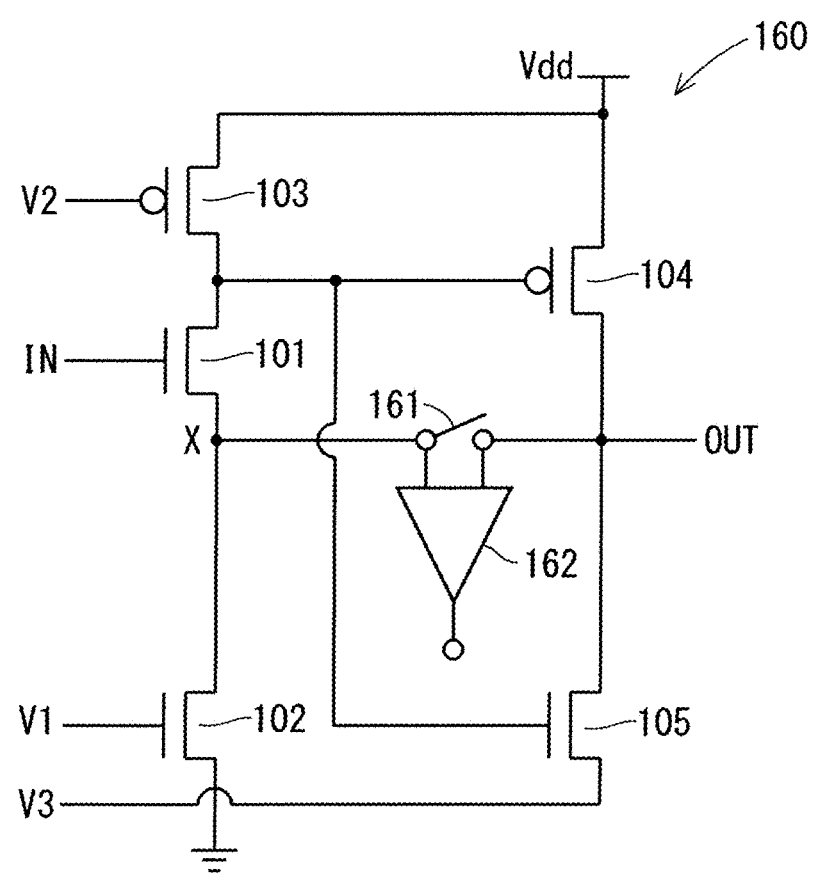
FIG. 9 is a diagram illustrating an example of a configuration of an amplifier circuit according to a second modification of the embodiment.

FIG. 9 is a diagram illustrating an example of a configuration of an amplifier circuit 160 according to a second modification of the present embodiment. The amplifier circuit 160 further includes a switch 161 (switching device) and a differential amplifier 162 as compared with the amplifier circuit 100.

The switch 161 and the differential amplifier 162 are connected between the node X (connection point between the source of the driving N-type FET 101 and the drain of the load FET 102) and the output terminal OUT. In order to set I0=0 in the amplifier circuit 160, the switch 161 is turned off to disconnect the node X and the output terminal OUT, and V1 or V2 is adjusted such that the output voltage of the differential amplifier 162 becomes 0 V. When the amplifier circuit 160 is used, the switch 161 is turned on to short-circuit the node X and the output terminal OUT.

As described above, in the amplifier circuit 100, the node X and the output terminal OUT may be configured to be short-circuited afterwards, that is, after V1 or V2 is adjusted such that I0=0.

As described above, in the amplifier circuit 100, the amplifier circuit 150, and the amplifier circuit 160 in the present embodiment, unlike the conventional SSF circuit 120, I0=0 in the steady state $I_{out}=0$, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced. That is, the rising and falling characteristics of the output waveforms of the amplifier circuit 100, the amplifier circuit 150, and the amplifier circuit 160 are symmetric and shortest, and the power consumption of the amplifier circuit 100, the amplifier circuit 150, and the amplifier circuit 160 is reduced.

The amplifier circuit 100 according to the present embodiment will be further described with reference to FIG. 10. In the amplifier circuit 100, unlike the conventional SSF circuit 120, the feedback P-type FET 104 and the feedback N-type FET 105 are of enhancement type (normally off). Here, for simplicity, a case of $Vth=-Vth_{fbp}=Vth_{fbn}$ and $\beta=\alpha_{fbp}=\beta_{fbn}$ will be described. Generally, when Vth>0, the FET is called enhancement type (normally off), and when Vth≤0, the FET is called depletion type (normally on).

FIG. 10 is a graph illustrating a relationship between an input voltage and a through current in the CMOS inverter including the feedback P-type FET 104 and the feedback N-type FET 105. In FIG. 10, the vertical axis represents a current value, and the horizontal axis represents a voltage value. As illustrated in an example in FIG. 10, a maximum value Imax of the through current is expressed by the following expression (118).

$$I_{max} = \frac{\beta}{2}\left(\frac{Vdd - V3}{2} - Vth\right)^2 \quad (118)$$

Further, a time constant τ of the CMOS inverter including the feedback P-type FET 104 and the feedback N-type FET 105 is expressed by the following expression (119). Here, τ corresponds to a rising time and a falling time. $C_{out}$ is the load capacity of the output terminal.

$$\tau = \frac{Cout}{\beta(Vdd - V3 - Vth)} \tag{119}$$

It can be seen from expressions (118) and (119) that there is a trade-off in which Imax decreases but τ increases (delay increases) as Vth increases, and a trade-off in which Imax decreases but τ increases as β decreases. Therefore, which of Vth and β should be controlled when Imax is decreased while an increase in τ is suppressed is examined, and the driving conditions of the feedback P-type FET 104 and the feedback N-type FET 105 are optimized. It should be noted that, although Imax can be reduced by controlling Vdd–V3, Vdd–V3 has a constraint of determining the voltage range of $V_{in}$.

Imax is a quadratic expression of Vth, and τ is a linear expression of Vth. Thus, the degree of decrease in Imax due to an increase in Vth is large, and the degree of increase in τ is small. In contrast, since both Imax and τ are linear expressions of β, and hence the degree of decrease in Imax due to a decrease in β is equal to the degree of increase in τ. Therefore, in order to decrease Imax while suppressing an increase in τ, for example, Vth may be increased instead of decreasing β.

As described above, in the amplifier circuit 100 according to the present embodiment, since the feedback P-type FET 104 and the feedback N-type FET 105 are of the enhancement type (normally off), the threshold voltage Vth= −Vth$_{fbp}$=Vth$_{fbn}$ becomes larger than 0 unlike the depletion type (normally on). Therefore, the through current of the CMOS inverter including the feedback P-type FET 104 and the feedback N-type FET 105 is reduced, and the power consumption of the amplifier circuit 100 is reduced.

Furthermore, in the amplifier circuit 100 according to the present embodiment, unlike the conventional SSF circuit 120, the driving N-type FET 101, the load FET 102, and the current source FET 103 are of the depletion type (normally on). Here, for simplicity, a case where Vth= −Vth$_{cp}$=Vth$_{ln}$=Vth$_{dn}$, β=β$_{cp}$=β$_{ln}$=β$_{dn}$ will be described.

When the driving N-type FET 101 and the current source FET 103 operate in the saturation region, expression (107) holds, so that the relationship between $V_{in}$ and $V_{out}$ of the amplifier circuit 100 is linear. However, when the driving N-type FET 101 and the current source FET 103 operate in the linear region, the linearity of the relationship between $V_{in}$ and $V_{out}$ decreases because the relationship deviates from expression (107). Therefore, in order to maintain the linearity of the input/output characteristics of the amplifier circuit 100, the driving N-type FET 101, the load FET 102, and the current source FET 103 are optimized on the assumption that the FET operates in the saturation region.

The condition that the FET operates in the saturation region is Vds≥Vgs−Vth≥0 in the N-type FET, and Vds≤Vgs+Vth≤0 in the P-type FET. Therefore, the driving N-type FET 101, the load FET 102, and the current source FET 103 operate in the saturation region when the following three expressions (120), (121), and (122) hold.

$$Vds_{in} \geq Vgs_{in} - Vth \geq 0 \tag{120}$$

$$Vds_{dn} \geq Vgs_{dn} - Vth \geq \tag{121}$$

$$Vds_{cp} \leq Vgs_{cp} + Vth \leq 0 \tag{122}$$

Here, Vds$_{ln}$=V$_{out}$, Vds$_{dn}$=V$_A$−V$_{out}$, and Vds$_{cp}$=V$_A$−Vdd; and Vgs$_{ln}$=V1, V$_{gsdn}$=V$_{in}$−V$_{out}$, and Vgs$_{cp}$=V2−Vdd. When these are substituted into expressions (120), (121), and (122), the following expressions (123), (124), and (125) are obtained.

$$Vout \geq V1 - Vth \geq 0 \tag{123}$$

$$V_A \geq Vin - Vth \geq Vout \tag{124}$$

$$V_A \leq V2 + Vth \leq Vdd \tag{125}$$

Furthermore, expressions (123), (124), and (125) are summarized as the following expression (126).

$$0 \leq V1 - Vth \leq Vin - Vth \leq V2 + Vth \leq Vdd \tag{126}$$

From expression (126), the driving N-type FET 101, the load FET 102, and the current source FET 103 operate in the saturation region at V1≤V$_{in}$≤V2+2Vth, and in this case, the linearity of the relationship between $V_{in}$ and $V_{out}$ is maintained. Here, the lower limit value of V1 is Vth and the upper limit value of V2 is Vdd−Vth, and hence the maximum range of $V_{in}$ is Vth≤V$_{in}$≤Vdd+Vth (the voltage range is Vdd).

Thus, by reducing Vth, the $V_{in}$ range in which the relationship between $V_{in}$ and $V_{out}$ is linear is shifted downward as a whole. Therefore, the hot-carrier generation pf the N-type FET can be reduced. Similarly to $V_{in}$, $V_{out}$(=Vds$_{ln}$) also shifts downward as a whole, and Ids$_{ln}$ is reduced by the channel length modulation effect λVds$_{ln}$, so that power consumption is reduced.

As described above, in the amplifier circuit 100 according to the present embodiment, since the driving N-type FET 101 and the current source FET 103 are of the depletion type (normally on), the threshold voltage Vth=− Vth$_{cp}$=Vth$_{ln}$=Vth$_{dn}$ is 0 or less unlike the enhancement type (normally off). Therefore, the input voltage of the amplifier circuit 100 can be reduced, and the power consumption of the amplifier circuit 100 and the hot-carrier generation can be reduced.

As described above, according to the amplifier circuit 100 of the present embodiment, the CMOS inverter input/output characteristics including the feedback P-type FET 104 and the feedback N-type FET 105 are symmetrical, and an extra steady current in the amplifier circuit is reduced. Therefore, the rising and falling characteristics of the output waveform are symmetrical and shortened, and the power consumption can be reduced. Further, the through current flowing through the CMOS inverter including the feedback P-type FET 104 and the feedback N-type FET 105 is reduced, and hence the power consumption is reduced. Moreover, since the range in which the input/output characteristics are linear is shifted as a whole, the power consumption of the amplifier circuit is reduced, and the hot-carrier generation can be reduced.

Second Embodiment

An amplifier circuit and a composite circuit according to the present embodiment will be described. In the following description, components similar to the components described in the above-described embodiment will be shown with the same reference numerals, and a detailed description thereof will be omitted as appropriate.

<Configuration of Amplifier Circuit>

Figure 11:
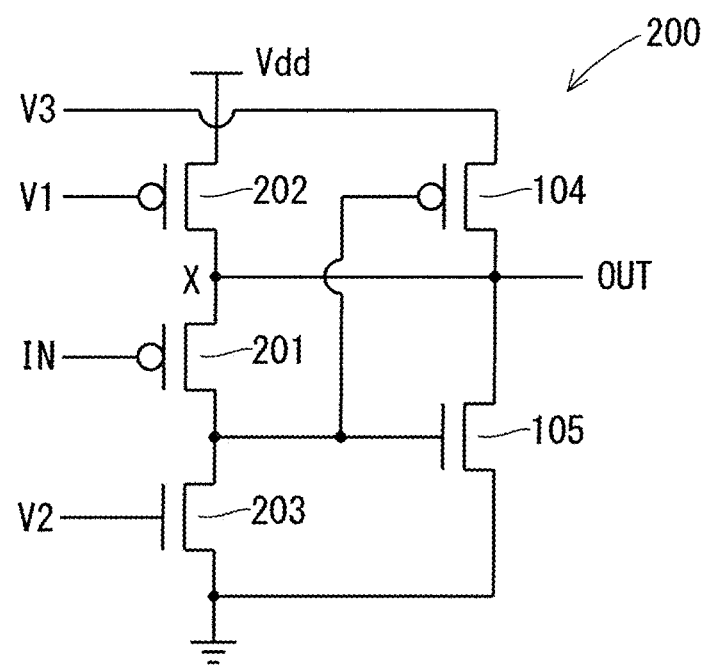
FIG. 11 is a diagram illustrating an example of a configuration of an amplifier circuit according to an embodiment.

FIG. 11 is a diagram illustrating an example of a configuration of an amplifier circuit 200 according to the present embodiment. The amplifier circuit 200 is one form of a source follower circuit. In the amplifier circuit 200 of the present embodiment, unlike the amplifier circuit 100 of the first embodiment, the driving FET is a P-type FET.

The amplifier circuit 200 includes a driving P-type FET 201, a load FET 202, a current source FET 203, a feedback P-type FET 104, and a feedback N-type FET 105. The driving P-type FET 201, the load FET 202, and the feedback P-type FET 104 are formed of P-type FETs. The current source FET 203 and the feedback N-type FET 105 are formed of N-type FETs.

The source of the load FET 202 is connected to the power supply, and the drain of the load FET 202 is connected to the source of the driving P-type FET 201. The drain of the current source FET 203 is connected to the drain of the driving P-type FET 201, and the source of the current source FET 203 is connected to the GND.

The input terminal IN of the amplifier circuit 200 is connected to the gate of the driving P-type FET 201. The fixed potential V1 is input to the gate of the load FET 202. Thereby, the load FET 202 functions as a constant current source.

The connection point between the source of the driving P-type FET 201 and the drain of the load FET 202 is connected to the output terminal OUT.

The source of the feedback P-type FET 104 is connected to the fixed potential V3, and the drain of the feedback P-type FET 104 is connected to the drain of the feedback N-type FET 105. The source of feedback N-type FET 105 is connected to the GND. The gates of the feedback P-type FET 104 and the feedback N-type FET 105 are connected at equal potential to the connection point between the drain of the current source FET 203 and the drain of the driving P-type FET 201.

The connection point between the drain of the feedback P-type FET 104 and the drain of the feedback N-type FET 105 is connected to the output terminal OUT.

<Operation of Amplifier Circuit>

Next, the operation principle of the amplifier circuit 200 will be described while being compared with the operation principles of the conventional source follower circuit and the SSF circuit.

Figure 12:
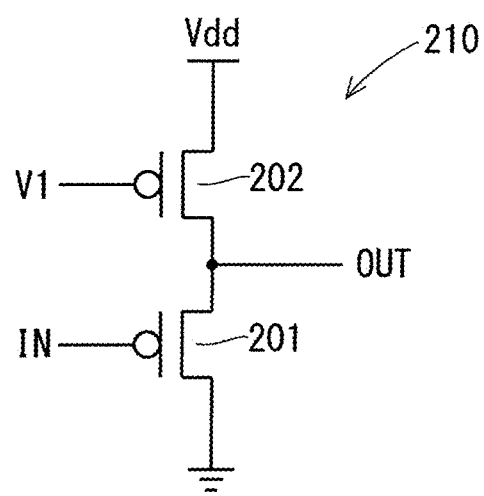
FIG. 12 is a diagram illustrating an example of a configuration of a conventional source follower circuit.

FIG. 12 is a diagram illustrating an example of a configuration of a conventional source follower circuit 210. In FIG. 12, the source of the load FET 202 is connected to the power supply, and the drain of the load FET 202 is connected to the source of the driving P-type FET 201. The drain of the driving P-type FET 201 is connected to the GND. The connection point between the source of the driving P-type FET 201 and the drain of the load FET 202 is connected to the output terminal OUT. The gate of the load FET 202 is connected to the fixed potential V1, and the load FET 202 functions as a constant current source.

FIG. 13 is a diagram illustrating an example of the small signal equivalent circuit of the source follower circuit 210 of FIG. 12. The output resistance of the source follower circuit 210 is expressed by the following expression (11).

$$\frac{V_{out}}{I_{out}} = r_{dp}//r_{lp}//\frac{1}{gm_{dp}} \quad (11)$$

Here, $r_{dp}$ is the output resistance of the driving P-type FET 201, $r_{lp}$ is the output resistance of the load FET 202, and $gm_{dp}$ is the transconductance of the driving P-type FET 201.

In an ideal FET without channel length modulation, $r_{in} \to \infty$ and $gm_{dn} \gg 1$, so that expression (11) can be approximated as the following expression (12).

$$\frac{V_{out}}{I_{out}} = \frac{1}{gm_{dp}} \quad (12)$$

Figure 14:
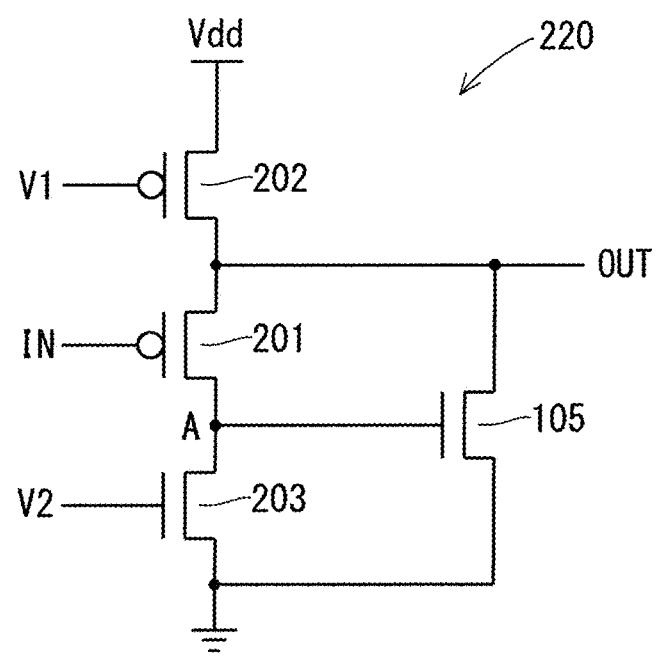
FIG. 14 is a diagram illustrating an example of a configuration of an SSF circuit.

FIG. 14 is a diagram illustrating an example of the configuration of the SSF circuit 220. The SSF circuit 220 of FIG. 14 has a configuration in which the current source FET 203 and the feedback N-type FET 105 are added to the source follower circuit 210 of FIG. 12. As compared with the amplifier circuit 200 of FIG. 11, the SSF circuit 220 of FIG. 14 has a configuration in which the feedback P-type FET 104 is omitted from the amplifier circuit 200.

Figure 15:
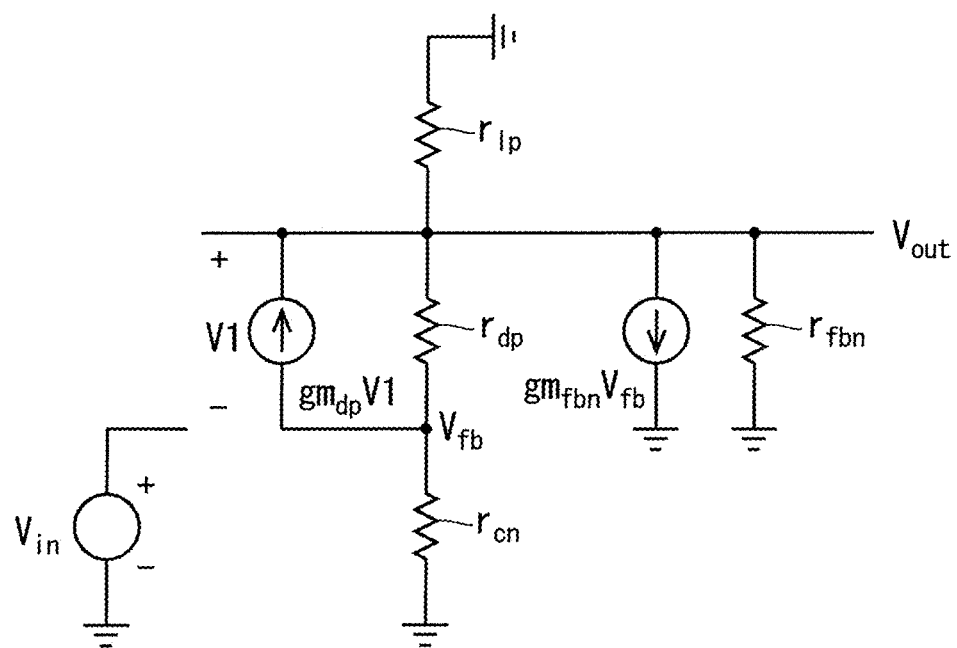
FIG. 15 is a diagram illustrating an example of the small signal equivalent circuit of the SSF circuit in FIG. 14.

FIG. 15 is a diagram illustrating an example of the small signal equivalent circuit of the SSF circuit 220 of FIG. 14. From Kirchhoff's current law at the drain of the driving P-type FET 201 and the output terminal, the following expressions (13) and (14) hold.

$$V_{fb}/r_{cn} = \frac{V_{out} - V_{fb}}{r_{dp}} + gm_{dp}(V_{out} - V_{in}) \quad (13)$$

$$I_{out} = (gm_{fbn} + 1/r_{cn})V_{fb} + (1/r_{fbn} + 1/r_{lp})V_{out} \quad (14)$$

Here, $r_{cn}$ is the output resistance of the current source FET 203.

When $V_{in}=0$, the output resistance can be calculated from expressions (13) and (14) as in the following expression (15).

$$\frac{V_{out}}{I_{out}} = r_{lp}//r_{fbn}//\frac{r_{dp} + r_{cn}}{(1 + gm_{dp}r_{dp})(1 + gm_{fbn}r_{cn})} \quad (15)$$

In an ideal FET without channel length modulation, $r_{lp} \to \infty$, $r_{cn} \to \infty$, $gm_{dp}r_{dp} \gg 1$, and $gm_{fbn}r_{fbn} \gg 1$, so that expression (15) can be approximated as the following expression (16).

$$\frac{V_{out}}{I_{out}} = \frac{1}{gm_{dp}r_{dp}gm_{fbn}} \quad (16)$$

Comparing expression (16) with expression (12) shows that, in the SSF circuit 220, the output resistance is reduced to $1/r_{dp}gm_{fbn}$ times that of the source follower circuit 210. Therefore, the driving force of the output load in the SSF circuit 220 is higher than that in the source follower circuit 210.

Next, referring back to FIG. 14, the small signal operation of the SSF circuit 220 will be described.

When the voltage of the input terminal rises, the gate voltage of the driving P-type FET 201 rises, so that the source-drain current of the driving P-type FET 201 decreases. As a result, the source voltage of the driving P-type FET 201 rises, and the drain voltage falls. With the output terminal being connected to the source of the driving P-type FET 201, the rise in the source voltage of the driving P-type FET 201 is, in other words, the rise in the voltage of the output terminal.

At the same time, as the drain voltage of the driving P-type FET 201 falls, the gate voltage of the feedback N-type FET 105 falls, and the source-drain current decreases. Here, with the load FET 202 being the constant current source, the source-drain current of the driving P-type FET 201 turns to increase according to Kirchhoff's current law at the output terminal. This suppresses the rise in the source voltage and the fall in the drain voltage of the driving P-type FET 201. The suppression of the rise in the source voltage of the driving P-type FET 201 is, in other words, the suppression of the rise in the voltage of the output terminal.

Conversely, when the voltage of the input terminal falls, the gate voltage of the driving P-type FET 201 falls, so that the source-drain current of the driving P-type FET 201 increases. As a result, the source voltage of the driving P-type FET 201 falls, and the drain voltage rises. The fall in the source voltage of the driving P-type FET 201 is, in other words, the fall in the voltage of the output terminal. At the same time, as the drain voltage of the driving P-type FET 201 rises, the gate voltage of the feedback N-type FET 105 rises, and the source-drain current increases. With the load FET 202 being the constant current source, the source-drain current of the driving P-type FET 201 turns to decrease according to Kirchhoff's current law at the output terminal. This suppresses the fall in the source voltage and the rise in the drain voltage of the driving P-type FET 201. The suppression of the fall in the source voltage of the driving P-type FET 201 is, in other words, the suppression of the fall in the voltage of the output terminal.

As described above, in the SSF circuit 220, the output fluctuation rapidly shifts from the transient state to the steady state as compared with the source follower circuit 210.

Next, a method for driving the SSF circuit 220 will be described.

The power supply potential Vdd is applied to the source of the load FET 202, and the ground potential is applied to the source of the current source FET 203 and the source of the feedback N-type FET 105. By applying the fixed potential V1 to the gate of the load FET 202, the load FET 202 is operated in the saturation region to serve as the constant current source, and by applying the fixed potential V2 to the gate of the current source FET 203, the current source FET 203 is operated in the saturation region to serve as the constant current source. However, it is assumed that the relationship of Vdd>V1>V2>ground potential (GND) is satisfied.

In this state, an input signal is input to the input terminal connected to the gate of the driving P-type FET 201, and an output signal is output from the output terminal connected to the source of the driving P-type FET 201.

Next, the operation principle of the amplifier circuit 200 according to the present embodiment will be described. FIG. 16 is a diagram illustrating an example of the small signal equivalent circuit of the amplifier circuit 200 of FIG. 11. From Kirchhoff's current law at the drain of the driving P-type FET 201 and the output terminal, expression (13) and the following expression (17) hold.

$$I_{out} = (gm_{fbn} + gm_{fbp} + 1/r_{cn})V_{fb} + (1/r_{fbn} + 1/r_{fbp} + 1/r_{lp})V_{out} \tag{17}$$

When $V_{in}=0$, the output resistance can be calculated from expressions (13) and (17) as in the following expression (18).

$$\frac{V_{out}}{I_{out}} = r_{lp}//r_{fbn}//r_{fbp}// \frac{r_{dp}+r_{cn}}{(1+gm_{dp}r_{dp})(1+gm_{fbn}r_{cn}+gm_{fbp}r_{cn})} \tag{18}$$

In an ideal FET without channel length modulation, $r_{lp} \to \infty$, $r_{cn} \to \infty$, $gm_{dp}r_{dp} \gg 1$, $gm_{fbn}r_{fbn} \gg 1$, and $gm_{fbp}r_{fbp} \gg 1$, so that expression (18) can be approximated as the following expression (19).

$$\frac{V_{out}}{I_{out}} = \frac{1}{gm_{dp}r_{dp}(gm_{fbn}+gm_{fbp})} \tag{19}$$

Comparing expression (19) with expression (16) shows that the output resistance is reduced to $gm_{fbn}/(gm_{fbn}+gm_{fbp})$ times that of the SSF circuit 220 in the amplifier circuit 200. Therefore, the driving force of the output load in the amplifier circuit 200 is higher than that in the SSF circuit 220.

Next, referring back to FIG. 11, the small signal operation of the amplifier circuit 200 will be described.

When the voltage of the input terminal rises, the gate voltage of the driving P-type FET 201 rises, so that the source-drain current of the driving P-type FET 201 decreases. As a result, the source voltage of the driving P-type FET 201 rises, and the drain voltage falls. The rise in the source voltage of the driving P-type FET 201 is, in other words, the rise in the voltage of the output terminal.

At the same time, as the drain voltage of the driving P-type FET 201 falls, the gate voltage of the feedback P-type FET 104 falls and the source-drain current increases, and the gate voltage of the feedback N-type FET 105 falls and the source-drain current decreases. Here, with the load FET 202 being the constant current source, the source-drain current of the driving P-type FET 201 turns to increase according to Kirchhoff's current law at the output terminal. This suppresses the rise in the source voltage and the fall in the drain voltage of the driving P-type FET 201. The suppression of the rise in the source voltage of the driving P-type FET 201 is, in other words, the suppression of the rise in the voltage of the output terminal.

Conversely, when the voltage of the input terminal falls, the gate voltage of the driving P-type FET 201 falls, so that the source-drain current of the driving P-type FET 201 increases. As a result, the source voltage of the driving P-type FET 201 falls, and the drain voltage rises. The fall in the source voltage of the driving P-type FET 201 is, in other words, the fall in the voltage of the output terminal.

At the same time, as the drain voltage of the driving P-type FET 201 rises, the gate voltage of the feedback P-type FET 104 rises and the source-drain current decreases, and the gate voltage of the feedback N-type FET 105 rises and the source-drain current increases. With the load FET 202 being the constant current source, the source-drain current of the driving P-type FET 201 turns to decrease according to Kirchhoff's current law at the output terminal. This suppresses the fall in the source voltage and the rise in the drain voltage of the driving P-type FET 201. The suppression of the fall in the source voltage of the driving P-type FET 201 is, in other words, the suppression of the fall in the voltage of the output terminal.

As described above, in the amplifier circuit 200 according to the present embodiment, the output feedback speed is higher than in the SSF circuit 220 because of the addition of the feedback P-type FET 104, and the output fluctuation quickly shifts from the transient state to the steady state. In particular, the output feedback speed is higher at the rising edge than at the falling edge of the output waveform. Therefore, in the output waveform of the amplifier circuit 200, the rising and falling become steep, while the overshoot and undershoot of the rising and falling are reduced, and the oscillation of the output waveform is also reduced. As a result, the rising time $t_r$ and the falling time $t_f$ of the output waveform of the amplifier circuit 200 are shortened, and an amplifier circuit capable of transmitting a faster clock signal can be obtained. In addition, the rising settling time $t_{sr}$ and the falling settling time $t_{sf}$ are shortened, and an amplifier circuit capable of driving a larger output load can be obtained.

In the amplifier circuit 200, the gate-source voltages of the feedback P-type FET 104 and the feedback N-type FET 105 are equalized, so that an inverter including a feedback transistor with symmetrical design parameters (threshold voltage, ratio of gate length to gate width, gate oxide film capacitance, etc.) can be configured, and the degree of freedom in design and versatility are enhanced.

Next, a method for driving the amplifier circuit 200 will be described.

The power supply potential Vdd is applied to the source of the load FET 202, and the ground potential is applied to the source of the current source FET 203 and the source of the feedback N-type FET 105. By applying the fixed potential V1 to the gate of the load FET 202, the load FET 202 is operated in the saturation region to serve as the constant current source. By applying the fixed potential V2 to the gate of the current source FET 203, the current source FET 203 is operated in the saturation region to serve as the constant current source. By applying the fixed potential V3 to the source of the feedback P-type FET 104, the gate-source voltage is lowered. However, it is assumed that the relationships of Vdd>V1>V2>ground potential (GND) and Vdd≥V3≥$V_A$ are satisfied.

In this state, an input signal is input to the input terminal connected to the gate of the driving P-type FET 201, and an output signal is output from the output terminal connected to the source of the driving P-type FET 201.

Hereinafter, the large-signal operation of the amplifier circuit 200 will be described while being compared with the large-signal operations of the conventional source follower circuit and the SSF circuit. For simplicity, the channel length modulation effect and the substrate bias effect are not considered here. In addition, the threshold voltages $Vth_{dp}$, $Vth_{lp}$, and $Vth_{fbp}$ of the driving P-type FET 201, the load FET 202, and the feedback P-type FET 104 are negative values, and the gain coefficients $\beta_{dp}$, $\beta_{lp}$, and $\beta_{fbp}$ thereof are positive values. The threshold voltages $Vth_{cn}$ and $Vth_{fbn}$ of the current source FET 203 and the feedback N-type FET 105 are positive values, and the gain coefficients $\beta_{cn}$ and $\beta_{fbn}$ thereof are positive values.

In FIG. 12 illustrating an example of the configuration of the conventional source follower circuit 210, the gate-source voltage of the driving P-type FET 201 is $Vgs_{dp}=V_{in}-V_{out}$, and the gate-source voltage of the load FET 202 is $Vgs_{slp}=V1-Vdd$.

Therefore, when $\beta_x=\mu_x C_x W_x/L_x$, the drain-source currents $Ids_{dp}$ and $Ids_{lp}$ of the driving P-type FET 201 and the load FET 202 at the time of operating in the saturation region are expressed by the following expressions (201) and (202).

$$Ids_{dp} = -\frac{1}{2}\beta_{dp}(Vin - Vout - Vth_{dp})^2 \quad (201)$$

$$Ids_{lp} = -\frac{1}{2}\beta_{lp}(V1 - Vdd - Vth_{lp})^2 \quad (202)$$

In FIG. 12, $-Ids_{dn}=-Ids_{ln}$, and hence the relational expression between $V_{out}$ and $V_{in}$ is as in the following expression (203).

$$Vout = Vin - Vth_{dp} - \sqrt{\frac{\beta_{lp}}{\beta_{dp}}}(V1 - Vdd - Vth_{lp}) \quad (203)$$

This expression shows that $V_{out} \neq V_{in}$, and there is an offset voltage Vos expressed by the following expression (204).

$$Vos = Vth_{dp} + \sqrt{\frac{\beta_{lp}}{\beta_{dp}}}(V1 - Vdd - Vth_{lp}) \quad (204)$$

In FIG. 14 illustrating an example of the configuration of the SSF circuit 220, the gate-source voltage of the current source FET 203 is $Vg_{scn}=V2-Vth_{cn}$, and the gate-source voltage of the feedback N-type FET 105 is $Vgs_{fbn}=V_A-Vdd-Vth_{fbn}$. Therefore, the drain-source currents $Ids_{cn}$ and $Ids_{fbn}$ of the current source FET 203 and the feedback N-type FET 105 at the time of operating in the saturation region are expressed by the following expressions (205) and (206).

$$Ids_{cn} = \frac{1}{2}\beta_{cn}(V2 - Vth_{cn})^2 \quad (205)$$

$$Ids_{fbn} = \frac{1}{2}\beta_{fbn}(V_A - Vth_{fbn})^2 \quad (206)$$

In FIG. 14, $-Ids_{dp}=Ids_{cn}$, and hence the relational expression between $V_{out}$ and $V_{in}$ is as in the following expression (207).

$$Vout = Vin - Vth_{dp} - \sqrt{\frac{\beta_{cn}}{\beta_{dp}}}(V2 - Vth_{cn}) \quad (207)$$

This expression shows that $V_{out} \neq V_{in}$, and there is an offset voltage Vos expressed by the following expression (208).

$$Vos = Vth_{dp} + \sqrt{\frac{\beta_{cn}}{\beta_{dp}}}(V2 - Vth_{cn}) \quad (208)$$

In FIG. 11 illustrating the example of the configuration of the amplifier circuit 200 according to the present embodiment, the gate-source voltage of the feedback P-type FET 104 is $V_A-Vdd-Vth_{fbp}$, so that the drain-source current $Idsf_{bp}$ when the feedback P-type FET 104 operates in the saturation region is expressed by the following expression (209).

$$Ids_{fbp} = -\frac{1}{2}\beta_{fbp}(V_A - V3 - Vth_{fbp})^2 \quad (209)$$

In FIG. 11, $-Ids_{dp}=Ids_{cn}$, and hence the relational expression between $V_{out}$ and $V_{in}$ is as in the following expression (210).

$$Vout = Vin - Vth_{dp} - \sqrt{\frac{\beta_{cn}}{\beta_{dp}}}(V2 - Vth_{cn}) \quad (210)$$

This expression shows that $V_{out} \neq V_{in}$, and there is an offset voltage Vos expressed by the following expression (211).

$$Vos = Vth_{dp} + \sqrt{\frac{\beta_{cn}}{\beta_{dp}}}(V2 - Vth_{cn}) \quad (211)$$

In FIG. 11, the current flowing between the source of the driving P-type FET 201 and the drain of the load FET 202, and the current flowing between the drain of the feedback P-type FET 104 and the drain of the feedback N-type FET 105 are set as I0. In addition, the current flowing in and out of the output terminal OUT is set as $I_{out}$. When the amplifier circuit 200 is operating in the transient state, $I_{out} \neq 0$, but when the amplifier circuit is operating in the steady state, $I_{out}=0$.

Unlike the conventional SSF circuit 220, the amplifier circuit 200 in the present embodiment has I0=0 in the steady state ($I_{out}=0$). In addition, in the amplifier circuit 200, I0 satisfies $-1$ µA$\leq$I0$\leq$+1 µA in the steady state ($I_{out}=0$).

In contrast, in the conventional SSF circuit 220, I0$\neq$0 in both the steady state ($I_{out}=0$) and the transient state ($I_{out} \neq 0$).

Here, when the channel length modulation effect is added to expressions (202) and (205), the following expressions (212) and (213) are obtained, respectively.

$$Ids_{lp} = -\frac{1}{2}\beta_{lp}(V1 - Vdd - Vth_{lp})^2(1 + \lambda_{lp}(Vout - Vdd)) \quad (212)$$

$$Ids_{cn} = \frac{1}{2}\beta_{cn}(V2 - Vth_{cn})^2(1 + \lambda_{cn}V_A) \quad (213)$$

Here, $\lambda_{lp}$ is the channel length modulation coefficient of the load FET 202, and $\lambda_{cn}$ is the channel length modulation coefficient of the current source FET 203.

When I0=0, no current of the driving P-type FET 201, the load FET 202, and the current source FET 203 flows in and out between the feedback P-type FET 104 and the feedback N-type FET 105, so that $Ids_{lp}=-Ids_{cn}$ is satisfied, and the relationship of the following expression (214) holds between the fixed potential V1 that is the gate voltage of the load FET 202 and the fixed potential V2 that is the gate voltage of the current source FET 203.

$$-\sqrt{\beta_{lp}(1+\lambda_{lp}(Vout-Vdd))}(V1-Vdd-Vth_{lp}) = \sqrt{\beta_{cn}(1+\lambda_{cn}V_A)}(V2-Vth_{cn}) \quad (214)$$

In particular, when there is no channel length modulation effect, that is, when $\lambda_{lp}=\lambda_{cn}=0$, the relationship of the following expression (215) holds between V1 and V2.

$$-\sqrt{\beta_{lp}}(V1-Vdd-Vth_{lp})=\sqrt{\beta_{cn}}(V2-Vth_{cn}) \quad (215)$$

In particular, when $Vth_{lp}=-Vth_{cn}$ and $\beta_{lp}=\beta_{cn}$, the relational expression between V1 and V2 is expressed by the following expression (223).

$$V1+V2=Vdd \quad (223)$$

Similarly, when I0=0, no current of the feedback P-type FET 104 and the feedback N-type FET 105 flows in and out between the driving N-type FET 101, the load FET 102, and the current source FET 103, and thus, similarly to the steady state of the CMOS inverter, $-Idsf_{bp}=Ids_{fbn}$ is satisfied.

Therefore, the following relational expression (224) holds between the threshold voltages $Vth_{fbp}$ and $Vth_{fbn}$ and between the gain coefficients $\beta_{fbp}$ and $\beta_{fbn}$.

$$-Vth_{fbp}=Vth_{fbn} \text{ and } \beta_{fbp}=\beta_{fbn} \quad (224)$$

Therefore, I0=0 is theoretically satisfied when expressions (215) and (224) are satisfied, but due to manufacturing variation in an actual circuit, I0=0 may be deviated slightly. In that case, V1 or V2 can be adjusted by the method described below to set I0=0.

FIG. 17 is a diagram illustrating an example of a configuration of an amplifier circuit 250 according to a first modification of the present embodiment. In the amplifier circuit 250, the source of the driving P-type FET 201 and the drain of the load FET 202 (illustrated node X) are not connected to the drain of the feedback P-type FET 104 and the drain of the feedback N-type FET 105 (output terminal OUT) as compared with the amplifier circuit 200.

A differential amplifier or a galvanometer connected between the node X of the amplifier circuit 250 and the output terminal OUT serves as a Wheatstone bridge. In order to set I0=0 in this Wheatstone bridge, V1 or V2 may be changed such that the output of the differential amplifier becomes 0 V or the pointer of the galvanometer becomes 0 point.

Here, when the amplifier circuit 200 and the amplifier circuit 250 are in the vicinity on the same chip, the condition of V1 or V2 at which I0=0 in the amplifier circuit 250 is considered to be equal to the condition of V1 or V2 at which I0=0 in the amplifier circuit 200. Therefore, after the condition of V1 or V2 that I0=0 is extracted using the amplifier circuit 250, the condition can be applied to the amplifier circuit 200 to set I0=0. Alternatively, after V1 or V2 is adjusted in the amplifier circuit 250 such that I0=0, the node X and the output terminal OUT of the amplifier circuit 250 may be short-circuited and used.

For example, the amplifier circuit 250 may be a TEG circuit used to extract a condition of at least one of V1 and V2 in which I0=0. In addition, the amplifier circuit 200 and the amplifier circuit 250 functioning as a TEG circuit may be a composite circuit formed on the same chip.

FIG. 18 is a diagram illustrating an example of a configuration of an amplifier circuit 260 according to a second modification of the present embodiment. The amplifier circuit 260 further includes a switch 261 (switching device) and a differential amplifier 262 as compared with the amplifier circuit 200.

The switch 261 and the differential amplifier 262 are connected between the node X and the output terminal OUT. In order to set I0=0 in the amplifier circuit 260, the switch 261 is turned off to disconnect the node X and the output terminal OUT, and V1 or V2 is adjusted such that the output voltage of the differential amplifier 262 becomes 0 V. When the amplifier circuit 260 is used, the switch 261 is turned on to short-circuit the node X and the output terminal OUT.

As described above, in the amplifier circuit 200, the node X and the output terminal OUT may be configured to be short-circuited afterwards, that is, after V1 or V2 is adjusted such that I0=0.

As described above, in the amplifier circuit 200, the amplifier circuit 250, and the amplifier circuit 260 in the present embodiment, unlike the conventional SSF circuit 120, I0=0 in the steady state $I_{out}=0$, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced. That is, the rising and falling characteristics of the output waveforms of the amplifier circuit 200, the amplifier circuit 250, and the amplifier circuit 260 are symmetric and shortest, and the power consumption of the amplifier circuit 200, the amplifier circuit 250, and the amplifier circuit 260 is reduced.

In the amplifier circuit 200, unlike the conventional SSF circuit 220, the feedback P-type FET 104 and the feedback N-type FET 105 are of the enhancement type (normally off). In the present embodiment as well, the graph illustrating the relationship between the input voltage and the through current in the CMOS inverter including the feedback P-type FET 104 and the feedback N-type FET 105 is similar to that in FIG. 10, and the maximum value Imax of the through current is expressed by expression (118) described above. Further, the time constant τ of the CMOS inverter including the feedback P-type FET 104 and the feedback N-type FET 105 is expressed by expression (119) described above. As described above, in order to decrease Imax while suppressing an increase in τ, for example, Vth may be increased instead of decreasing β.

As described above, in the amplifier circuit 200 according to the present embodiment, since the feedback P-type FET 104 and the feedback N-type FET 105 are of the enhancement type (normally off), the threshold voltage Vth=−Vth$_{fbp}$=Vth$_{fbn}$ becomes larger than 0 unlike the depletion type (normally on). Therefore, the through current of the CMOS inverter including the feedback P-type FET 104 and the feedback N-type FET 105 is reduced, and the power consumption of the amplifier circuit 200 is reduced.

Furthermore, in the amplifier circuit 200 according to the present embodiment, unlike the conventional SSF circuit 220, the driving P-type FET 201, the load FET 202, and the current source FET 203 are of the depletion type (normally on). Here, for simplicity, a case of Vth=Vth$_{cn}$=−Vth$_{lp}$=−Vth$_{dp}$ and β=β$_{cn}$=β$_{lp}$=β$_{dp}$ will be described.

When the driving P-type FET 201 and the current source FET 203 operate in the saturation region, expression (207) holds, so that the relationship between V$_{in}$ and V$_{out}$ of the amplifier circuit 200 is linear. However, when the driving P-type FET 201 and the current source FET 203 operate in the linear region, the linearity of the relationship between V$_{in}$ and V$_{out}$ decreases because the relationship deviates from expression (207). Therefore, in order to maintain the linearity of the input/output characteristics of the amplifier circuit 200, the driving P-type FET 201, the load FET 202, and the current source FET 203 are optimized on the assumption that the FET operates in the saturation region.

The condition that the FET operates in the saturation region is Vds≥Vgs−Vth≥0 in the N-type FET, and Vds≤Vgs+Vth≤0 in the P-type FET. Therefore, the driving P-type FET 201, the load FET 202, and the current source FET 203 operate in the saturation region when the following three expressions (225), (216), and (217) hold.

$$Vds_{lp} \le Vgs_{lp} + Vth \le 0 \quad (225)$$

$$Vds_{dp} \le Vgs_{dp} + Vth \le 0 \quad (216)$$

$$Vds_{cn} \le Vgs_{cn} - Vth \ge 0 \quad (217)$$

Here, Vds$_{lp}$=V$_{out}$−Vdd, Vds$_{slp}$=V$_A$−V$_{out}$, and Vds$_{cn}$=V$_A$; and Vg$_{slp}$=V1−Vdd, Vgs$_{dp}$=V$_{in}$−V$_{out}$, and Vgs$_{cn}$=V2. When these are substituted into expressions (225), (216), and (217), the following expressions (218), (219), and (220) are obtained.

$$Vout \le V1 + Vth \le Vdd \quad (218)$$

$$V_A \le Vin + Vth \le Vout \quad (219)$$

$$V_A \ge V2 - Vth \ge 0 \quad (220)$$

Furthermore, expressions (218), (219), and (220) are summarized as the following expression (221).

$$0 \le V2 - Vth \le Vin + Vth \le V1 + Vth \le Vdd \quad (221)$$

From expression (221), the driving P-type FET 201, the load FET 202, and the current source FET 203 operate in the saturation region at V2−2Vth≤V$_{in}$≤V1, and in this case, the linearity of the relationship between V$_{in}$ and V$_{out}$ is maintained. Here, the lower limit value of V2 is Vth and the upper limit value of V1 is Vdd−Vth, and hence the maximum range of V$_{in}$ is −Vth≤V$_{in}$≤Vdd (the voltage range is Vdd).

Therefore, by reducing Vth, the V$_{in}$ range in which the relationship between V$_{in}$ and V$_{out}$ is linear is shifted upward as a whole. Therefore, the hot-carrier generation pf the P-type FET can be reduced. Similarly to V$_{in}$, V$_{out}$(=Vdd+Vd$_{slp}$) also shifts upward as a whole, and Ids$_{lp}$ is reduced by the channel length modulation effect×Vd$_{slp}$, so that power consumption is reduced.

As described above, in the amplifier circuit 200 according to the present embodiment, since the driving P-type FET 201 and the current source FET 203 are of the depletion type (normally on), the threshold voltage Vth=Vth$_{cn}$=−Vth$_{lp}$=−Vth$_{dp}$ is 0 or less unlike the enhancement type (normally off). Therefore, the input voltage of the amplifier circuit 200 can be reduced, and the power consumption of the amplifier circuit 200 and the hot-carrier generation can be reduced.

As described above, according to the amplifier circuit 200 of the present embodiment, the CMOS inverter input/output characteristics including the feedback P-type FET 104 and the feedback N-type FET 105 are symmetrical, and an extra steady current in the amplifier circuit is reduced. Therefore, the rising and falling characteristics of the output waveform are symmetric and shortest, and the power consumption can be reduced. Further, the through current flowing through the CMOS inverter including the feedback P-type FET 104 and the feedback N-type FET 105 is reduced, and hence the power consumption is reduced. Moreover, since the range in which the input/output characteristics are linear is shifted as a whole, the power consumption of the amplifier circuit is reduced, and the hot-carrier generation can be reduced.

Third Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

FIG. 19 is a diagram illustrating an example of a configuration of an amplifier circuit 500 according to the present embodiment. The amplifier circuit 500 has the same configuration as the amplifier circuit 100 illustrated in FIG. 1 except for the connection of the gate of the current source FET 103. That is, the gate of the current source FET 103 is connected to the fixed potential V2 in the amplifier circuit 100, but is connected to the input terminal in the amplifier circuit 500. Thus, the driving N-type FET 101 and the current source FET 103 form an inverter circuit.

<Operation of Amplifier Circuit>

FIG. 20 is a diagram illustrating an example of the small signal equivalent circuit of the amplifier circuit 500 of FIG. 19. From Kirchhoff's current law at the drain of the driving N-type FET 101 and the output terminal, expression (20) and the following expression (26) hold.

$$V_{fb}/r_{cp} + gm_{cp}V_{in} = \frac{V_{out} - V_{fb}}{r_{dn}} + gm_{dn}(V_{out} - V_{in}) \quad (25)$$

$$I_{out} = (gm_{fbn} + gm_{fbp} + 1/r_{cp})V_{fb} + \quad (26)$$

$$(1/r_{fbn} + 1/r_{fbp} + 1/r_{ln})V_{out} + gm_{cp}V_{in}$$

When $V_{in}=0$, the output resistance can be calculated from expressions (20) and (26) as in the following expression (27).

$$\frac{V_{out}}{I_{out}} = r_{ln} // r_{fbn} // r_{fbp} // \frac{r_{dn} + r_{cp}}{(1 + gm_{dn}r_{dn})1 + gm_{fbn}r_{cp} + gm_{fbp}r_{cp}} \quad (27)$$

Expression (27) is the same as expression (9) indicating the output resistance of the amplifier circuit 100 of the first embodiment. It can thus be seen that the output resistances of the amplifier circuit 100 and the amplifier circuit 500 in the present embodiment are the same, and the driving force of the output load is also the same.

Next, referring back to FIG. 19, the small signal operation of the amplifier circuit 500 will be described.

When the voltage of the input terminal rises, the gate voltages of the driving N-type FET 101 and the current source FET 103 rise, so that the source-drain current of the driving N-type FET 101 increases, and the source-drain current of the current source FET 103 decreases. As a result, the source voltage of the driving N-type FET 101 rises and the drain voltage falls more quickly than the SSF circuit 120. The rise in the source voltage of the driving N-type FET 101 is, in other words, the rise in the voltage of the output terminal.

At the same time, as the drain voltage of the driving N-type FET 101 falls, the gate voltage of the feedback P-type FET 104 falls and the source-drain current increases, and the gate voltage of the feedback N-type FET 105 falls and the source-drain current decreases. Here, with the load FET 102 being the constant current source, the source-drain current of the driving N-type FET 101 turns to decrease according to Kirchhoff's current law at the output terminal. This suppresses the rise in the source voltage and the fall in the drain voltage of the driving N-type FET 101. The suppression of the rise in the source voltage of the driving N-type FET 101 is, in other words, the suppression of the rise in the voltage of the output terminal.

Conversely, when the voltage of the input terminal falls, the gate voltages of the driving N-type FET 101 and the current source FET 103 decrease, so that the source-drain current of the driving N-type FET 101 decreases, and the source-drain current of the current source FET 103 increases. As a result, the source voltage of the driving N-type FET 101 falls and the drain voltage rises more quickly than the SSF circuit 120. The fall in the source voltage of the driving N-type FET 101 is, in other words, the fall in the voltage of the output terminal.

At the same time, as the drain voltage of the driving N-type FET 101 rises, the gate voltage of the feedback P-type FET 104 rises and the source-drain current decreases, and the gate voltage of the feedback N-type FET 105 rises and the source-drain current increases. With the load FET 102 being the constant current source, the source-drain current of the driving N-type FET 101 turns to increase according to Kirchhoff's current law at the output terminal. This suppresses the fall in the source voltage and the rise in the drain voltage of the driving N-type FET 101. The suppression of the fall in the source voltage of the driving N-type FET 101 is, in other words, the suppression of the fall in the voltage of the output terminal.

As described above, in the amplifier circuit 500 according to the present embodiment, the output feedback speed is higher than in the SSF circuit 120 because of the addition of the feedback N-type FET 105, and the output fluctuation quickly shifts from the transient state to the steady state. In particular, the output feedback speed becomes higher at the falling edge than at the rising edge of the output waveform. Therefore, in the output waveform of the amplifier circuit 500, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 500 are shortened, and an amplifier circuit capable of transmitting a faster clock signal can be obtained. In addition, the rising settling time $t_{sr}$ and the falling settling time $t_{sf}$ are shortened, and an amplifier circuit capable of driving a larger output load can be obtained.

In the amplifier circuit 500, the gate-source voltages of the feedback P-type FET 104 and the feedback N-type FET 105 are equalized, so that an inverter including a feedback transistor with symmetrical design parameters (threshold voltage, ratio of gate length to gate width, gate oxide film capacitance, etc.) can be configured, and the degree of freedom in design and versatility are enhanced.

Next, a method for driving the amplifier circuit 500 will be described.

The ground potential is applied to the source of the load FET 102 and the source of the feedback N-type FET 105, and the power supply potential Vdd is applied to the source of the current source FET 103 and the source of the feedback P-type FET 104. By applying the fixed potential V1 to the gate of the load FET 102, the load FET 102 is operated in the saturation region to serve as the constant current source, and by applying the fixed potential V3 to the source of the feedback N-type FET 105, the gate-source voltage is lowered. However, it is assumed that the relationships of Vdd>V1>ground potential (GND) and $V_A \geq V3 \geq$ ground potential (GND) are satisfied.

In this state, an input signal is input to the input terminal connected to the gate of the driving N-type FET 101 and the gate of the current source FET 103, and an output signal is output from the output terminal connected to the source of the driving N-type FET 101.

Fourth Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

Figure 21:
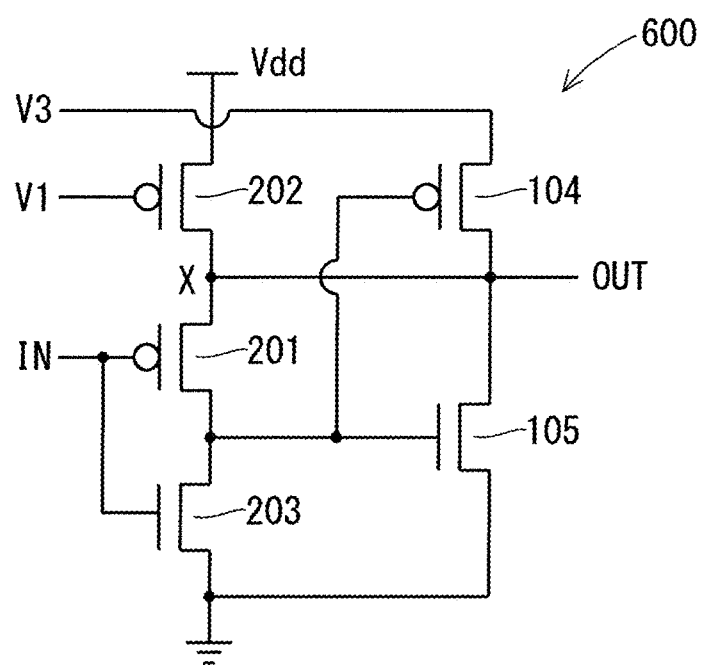
FIG. 21 is a diagram illustrating an example of a configuration of an amplifier circuit according to an embodiment.

FIG. 21 is a diagram illustrating an example of a configuration of an amplifier circuit 600 according to the present embodiment. The amplifier circuit 600 has the same configuration as the amplifier circuit 200 illustrated in FIG. 11 except for the connection of the gate of the current source FET 203. That is, the gate of the current source FET 203 is connected to the fixed potential V2 in the amplifier circuit 200, but is connected to the input terminal in the amplifier circuit 600. Thus, the driving P-type FET 201 and the current source FET 203 form an inverter circuit.

<Operation of Amplifier Circuit>

FIG. 22 is a diagram illustrating an example of the small signal equivalent circuit of the amplifier circuit 600 of FIG. 21. From Kirchhoff's current law at the drain of the driving P-type FET 201 and the output terminal, expression (23) and the following expression (28) hold.

$$V_{fb}/r_{cn} + gm_{cn}V_{in} = \frac{V_{out} - V_{fb}}{r_{dp}} + gm_{dp}(V_{out} - V_{in}) \quad (23)$$

$$I_{out} = (gm_{fbn} + gm_{fbp} + 1/r_{cn})V_{fb} + \quad (28)$$
$$(1/r_{fbn} + 1/r_{fbp} + 1/r_{lp})V_{out} + gm_{cn}V_{in}$$

When $V_{in}=0$, the output resistance can be calculated from expressions (23) and (28) as in the following expression (29).

$$\frac{V_{out}}{I_{out}} = r_{lp} \,//\, r_{fbn} \,//\, r_{fbp} \,//\, \frac{r_{dp} + r_{cn}}{(1 + gm_{dp}r_{dp})(1 + gm_{fbn}r_{cn} + gm_{fbp}r_{cn})} \quad (29)$$

Expression (29) is the same as expression (18) indicating the output resistance of the amplifier circuit 200 of the second embodiment. It can thus be seen that the output resistances of the amplifier circuit 200 and the amplifier circuit 600 in the present embodiment are the same, and the driving force of the output load is also the same.

Next, referring back to FIG. 21, the small signal operation of the amplifier circuit 600 will be described.

When the voltage of the input terminal rises, the gate voltages of the driving P-type FET 201 and the current source FET 203 rise, so that the source-drain current of the driving P-type FET 201 decreases, and the source-drain current of the current source FET 203 increases. As a result, the source voltage of the driving P-type FET 201 rises and the drain voltage falls more quickly than the SSF circuit 220. The rise in the source voltage of the driving P-type FET 201 is, in other words, the rise in the voltage of the output terminal.

At the same time, as the drain voltage of the driving P-type FET 201 falls, the gate voltage of the feedback P-type FET 104 falls and the source-drain current increases, and the gate voltage of the feedback N-type FET 105 falls and the source-drain current decreases. Here, with the load FET 202 being the constant current source, the source-drain current of the driving P-type FET 201 turns to increase according to Kirchhoff's current law at the output terminal. This suppresses the rise in the source voltage and the fall in the drain voltage of the driving P-type FET 201. The suppression of the rise in the source voltage of the driving P-type FET 201 is, in other words, the suppression of the rise in the voltage of the output terminal.

Conversely, when the voltage of the input terminal falls, the gate voltages of the driving P-type FET 201 and the current source FET 203 decrease, so that the source-drain current of the driving P-type FET 201 increases, and the source-drain current of the current source FET 203 decreases. As a result, the source voltage of the driving P-type FET 201 falls and the drain voltage rises more quickly than the SSF circuit 220. The fall in the source voltage of the driving P-type FET 201 is, in other words, the fall in the voltage of the output terminal.

At the same time, as the drain voltage of the driving P-type FET 201 rises, the gate voltage of the feedback P-type FET 104 rises and the source-drain current decreases, and the gate voltage of the feedback N-type FET 105 rises and the source-drain current increases. With the load FET 202 being the constant current source, the source-drain current of the driving P-type FET 201 turns to decrease according to Kirchhoff's current law at the output terminal. This suppresses the fall in the source voltage and the rise in the drain voltage of the driving P-type FET 201. The suppression of the fall in the source voltage of the driving P-type FET 201 is, in other words, the suppression of the fall in the voltage of the output terminal.

As described above, in the amplifier circuit 600 according to the present embodiment, the output feedback speed is higher than in the SSF circuit 220 because of the addition of the feedback P-type FET 104, and the output fluctuation quickly shifts from the transient state to the steady state. In particular, the output feedback speed is higher at the rising edge than at the falling edge of the output waveform. Therefore, in the output waveform of the amplifier circuit 600, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 600 are shortened, and an amplifier circuit capable of transmitting a faster clock signal can be obtained. In addition, the rising settling time $t_{sr}$ and the falling settling time $t_{sf}$ are shortened, and an amplifier circuit capable of driving a larger output load can be obtained.

In the amplifier circuit 600, the gate-source voltages of the feedback P-type FET 104 and the feedback N-type FET 105 are equalized, so that an inverter including a feedback transistor with symmetrical design parameters (threshold voltage, ratio of gate length to gate width, gate oxide film capacitance, etc.) can be configured, and the degree of freedom in design and versatility are enhanced.

Next, a method for driving the amplifier circuit 600 will be described.

The power supply potential Vdd is applied to the source of the load FET 202 and the source of the feedback P-type FET 104, and ground potential is applied to the source of the current source FET 203 and the source of the feedback N-type FET 105. By applying the fixed potential V1 to the gate of the load FET 202, the load FET 202 is operated in the saturation region to serve as the constant current source, and by applying the fixed potential V3 to the source of the feedback P-type FET 104, the gate-source voltage is lowered. However, it is assumed that the relationships of Vdd>V1>ground potential (GND) and Vdd≥V3≥$V_A$ are satisfied.

In this state, an input signal is input to the input terminal connected to the gate of the driving P-type FET 201 and the gate of the current source FET 203, and an output signal is output from the output terminal connected to the source of the driving P-type FET 201.

Fifth Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

FIG. 23 is a diagram illustrating an example of a configuration of an amplifier circuit 700 according to the present embodiment. The amplifier circuit 700 is one form of a Darlington circuit. The amplifier circuit 700 includes a driving N-type FET 101, a load FET 102, a feedback N-type FET 105, and a feedback PNP bipolar transistor (bipolar junction transistor (BJT)) 504.

The source of the load FET 102 is connected to the GND, and the drain of the load FET 102 is connected to the source of the driving N-type FET 101.

The drain of the driving N-type FET 101 is connected to the base of the feedback PNP-type BJT 504. The input terminal IN of the amplifier circuit 100 is connected to the gate of the driving N-type FET 101. The fixed potential V1 is input to the gate of the load FET 102.

Here, "PNP type" and "NPN type" representing the conductivity type of the BJT are examples of "first conductivity type", "second conductivity type", "third conductivity type", and "fourth conductivity type". The first conductivity type may be a PNP type, and the second conductivity type may be an NPN type, or vice versa. The first conductivity type may be a PNP type, and the fourth conductivity type may be an NPN type, or vice versa.

Each of the "base", "emitter", and "collector" of the BJT is an example of a "control terminal", a "current terminal", or the like.

The connection point between the source of the driving N-type FET 101 and the drain of the load FET 102 is connected to an output terminal OUT.

The emitter of the feedback PNP-type BJT 504 is connected to the power supply, and the collector is connected to the drain of the feedback N-type FET 105. The source of the feedback N-type FET 105 is connected to a fixed potential V3. Both the base of the feedback PNP-type BJT 504 and the gate of the feedback N-type FET 105 are connected to the drain of the driving N-type FET 101.

The connection point between the collector of the feedback PNP-type BJT 504 and the drain of the feedback N-type FET 105 is connected to the output terminal OUT.

As compared with the amplifier circuit 100 of the first embodiment illustrated in FIG. 1, the amplifier circuit 700 has a configuration in which the feedback P-type FET 104 is changed to the feedback PNP-type BJT 504, and the current source FET 103 is removed in the amplifier circuit 100.

<Operation of Amplifier Circuit>

The small signal operation of the amplifier circuit 700 will be described in comparison with the operation principle of the conventional source follower circuit 110 (cf. FIG. 2) and the conventional FET-input inverted Darlington (ID) circuit.

Figure 24:
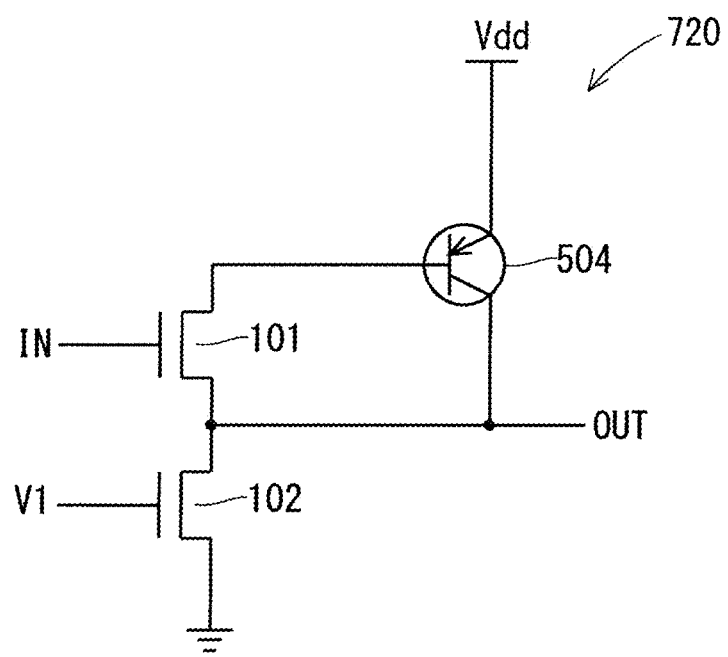
FIG. 24 is a diagram illustrating an example of a configuration of a conventional FET-input ID circuit.

FIG. 24 is a diagram illustrating an example of a configuration of a conventional FET-input ID circuit 720. The FET-input ID circuit 720 includes a feedback PNP-type BJT 504 in addition to the source follower circuit 110 illustrated in FIG. 2.

The emitter of the feedback PNP-type BJT 504 is connected to the power supply, the collector of the feedback PNP-type BJT 504 is connected to the output terminal OUT, and the base of the feedback PNP-type BJT 504 is connected to the drain of the driving N-type FET 101. Thereby, the feedback PNP-type BJT 504 forms a feedback circuit. As compared with the amplifier circuit 700 of FIG. 23, the FET-input ID circuit 720 has a configuration in which the feedback N-type FET 105 is omitted from the amplifier circuit 700.

FIG. 25 is a diagram illustrating an example of the small signal equivalent circuit of the FET-input ID circuit 720 of FIG. 24. From Kirchhoff's current law at the drain of the driving N-type FET 101 and the output terminal, the following expressions (30) and (31) hold.

$$V_{fb}/r_{fbp\_b} = \frac{V_{out} - V_{fb}}{r_{dn}} + gm_{dn}(V_{out} - V_{in}) \quad (30)$$

$$I_{out} = (gm_{fbp} + 1/r_{fbp\_b})V_{fb} + (1/r_{fbp\_c} + 1/r_{in})V_{out} \quad (31)$$

Here, $r_{fbp\_b}$ is a base resistance of the feedback PNP-type BJT 504, and $r_{fbp\_c}$ is a collector resistance of the feedback PNP-type BJT 504.

When $V_{in}=0$, the output resistance can be calculated from expressions (30) and (31) as in the following expression (32).

$$\frac{V_{out}}{I_{out}} = r_{In} // r_{fbp\_c} // \frac{r_{dn} + r_{fbp\_b}}{(1 + gm_{dn}r_{dn})(1 + gm_{fbp}r_{fbp\_b})} \quad (32)$$

In an ideal FET without channel length modulation, $r_{In} \to \infty$, $r_{dn} >> r_{fbp\_b}$, $gm_{dn}r_{dn} >> 1$, and $gm_{fbp}r_{fbp\_c} >> 1$, so that expression (32) can be approximated as the following expression (33).

$$\frac{V_{out}}{I_{out}} = \frac{1}{gm_{dn}gm_{fbp}r_{fbp\_b}} \quad (33)$$

Comparing expression (33) with expression (3) shows that the output resistance is reduced to $1/gm_{fbp}r_{fbp\_b}$ times that of the source follower circuit 110 in the FET-input ID circuit 720. Therefore, the driving force of the output load in the FET-input ID circuit 720 is higher than that in the source follower circuit 110.

Next, referring back to FIG. 24, the small signal operation of the FET-input ID circuit 720 will be described.

When the voltage of the input terminal rises, the gate voltage of the driving N-type FET 101 rises, so that the source-drain current of the driving N-type FET 101 increases. As a result, the source voltage of the driving N-type FET 101 rises, and the drain voltage falls. The rise in the source voltage of the driving N-type FET 101 is, in other words, the rise in the voltage of the output terminal.

At the same time, as the drain voltage of the driving N-type FET 101 falls, the base voltage of the feedback PNP-type BJT 504 falls, and the collector current increases. Here, with the load FET 102 being the constant current source, the source-drain current of the driving N-type FET 101 turns to decrease according to Kirchhoff's current law at the output terminal. This suppresses the rise in the source voltage and the fall in the drain voltage of the driving N-type FET 101. The suppression of the rise in the source voltage of the driving N-type FET 101 is, in other words, the suppression of the rise in the voltage of the output terminal.

Conversely, when the voltage of the input terminal falls, the gate voltage of the driving N-type FET 101 falls, so that the source-drain current of the driving N-type FET 101 decreases. As a result, the source voltage of the driving N-type FET 101 falls, and the drain voltage rises. The fall in the source voltage of the driving N-type FET 101 is, in other words, the fall in the voltage of the output terminal. At the same time, as the drain voltage of the driving N-type FET 101 rises, the base voltage of the feedback PNP-type BJT 504 rises, and the collector current decreases. Here, with the load FET 102 being the constant current source, the source-drain current of the driving N-type FET 101 turns to increase according to Kirchhoff's current law at the output terminal. This suppresses the fall in the source voltage and the rise in the drain voltage of the driving N-type FET 101. The suppression of the fall in the source voltage of the driving N-type FET 101 is, in other words, the suppression of the fall in the voltage of the output terminal.

As described above, in the FET-input ID circuit 720, the output fluctuation rapidly shifts from the transient state to the steady state as compared with the source follower circuit 110.

Next, a method for driving the FET-input ID circuit 720 will be described.

The ground potential is applied to the source of the load FET 102, and the power supply potential Vdd is applied to the emitter of the feedback PNP-type BJT 504. By applying the fixed potential V1 to the gate of the load FET 102, the load FET 102 is operated in the saturation region to serve as the constant current source. However, it is assumed that the relationship of Vdd>V1>ground potential (GND) is satisfied.

In this state, an input signal is input to the input terminal connected to the gate of the driving N-type FET 101, and an output signal is output from the output terminal connected to the source of the driving N-type FET 101.

Figure 26:
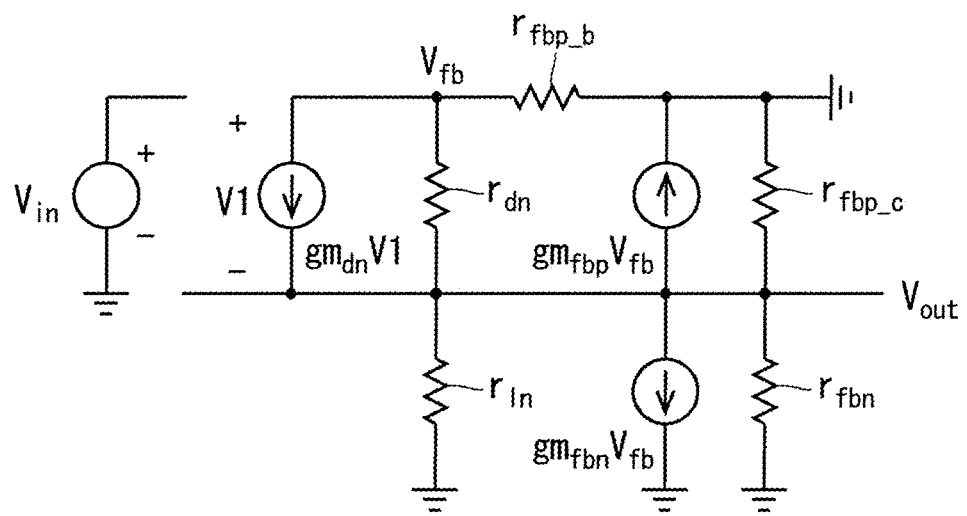
FIG. 26 is a diagram illustrating an example of the small signal equivalent circuit of the amplifier circuit of FIG. 23.

Next, the small signal operation of the amplifier circuit 700 according to the present embodiment will be described. FIG. 26 is a diagram illustrating an example of the small signal equivalent circuit of the amplifier circuit 700 of FIG. 23. From Kirchhoff's current law at the drain of the driving N-type FET 101 and the output terminal, expression (30) and the following expression (34) hold.

$$I_{out} = (gm_{fbn} + gm_{fbp} + 1/r_{fbp\_b})V_{fb} + (1/r_{fbn} + 1/r_{fbp\_c} + 1/r_{ln})V_{out} \quad (34)$$

When $V_{in}=0$, the output resistance can be calculated from expressions (30) and (34) as in the following expression (35).

$$\frac{V_{out}}{I_{out}} = r_{ln} // r_{fbn} // r_{fbp\_c} // \frac{r_{dn} + r_{fbp\_b}}{(1 + gm_{dn}r_{dn})(1 + gm_{fbn}r_{fbp\_b} + gm_{fbp}r_{fbp\_b})} \quad (35)$$

In an ideal FET without channel length modulation, $r_{ln} \to \infty$, $r_{dn} >> r_{fbp\_b}$, $gm_{dn}r_{dn} >> 1$, $gm_{fbn}r_{fbn}$, and $gm_{fbp}r_{fbp\_c} >> 1$, expression (35) can be approximated as the following expression (36).

$$\frac{V_{out}}{I_{out}} = \frac{1}{gm_{dn}(gm_{fbn} + gm_{fbp})r_{fbp\_b}} \quad (36)$$

Comparing expression (36) with expression (33) shows that the output resistance is reduced to $gm_{fbp}/(gm_{fbn}+gm_{fbp})$ times that of the FET-input ID circuit 720 in the amplifier circuit 700. Hence the driving force of the output load in the amplifier circuit 700 is higher than that in the FET-input ID circuit 720.

Next, referring back to FIG. 23, the small signal operation of the amplifier circuit 700 will be described.

When the voltage of the input terminal rises, the gate voltage of the driving N-type FET 101 rises, so that the source-drain current of the driving N-type FET 101 increases. As a result, the source voltage of the driving N-type FET 101 rises, and the drain voltage falls. The rise in the source voltage of the driving N-type FET 101 is, in other words, the rise in the voltage of the output terminal.

At the same time, as the drain voltage of the driving N-type FET 101 falls, the base voltage of the feedback PNP-type BJT 504 falls and the collector current increases, and the gate voltage of the feedback N-type FET 105 falls and the source-drain current decreases. Here, with the load FET 102 being the constant current source, the source-drain current of the driving N-type FET 101 turns to decrease according to Kirchhoff's current law at the output terminal. This suppresses the rise in the source voltage and the fall in the drain voltage of the driving N-type FET 101. The suppression of the rise in the source voltage of the driving N-type FET 101 is, in other words, the suppression of the rise in the voltage of the output terminal.

Conversely, when the voltage of the input terminal falls, the gate voltage of the driving N-type FET 101 falls, so that the source-drain current of the driving N-type FET 101 decreases. As a result, the source voltage of the driving N-type FET 101 falls, and the drain voltage rises. The fall in the source voltage of the driving N-type FET 101 is, in other words, the fall in the voltage of the output terminal.

At the same time, as the drain voltage of the driving N-type FET 101 rises, the base voltage of the feedback PNP-type BJT 504 rises and the collector current decreases, and the gate voltage of the feedback N-type FET 105 rises and the source-drain current increases. Here, with the load FET 102 being the constant current source, the source-drain current of the driving N-type FET 101 turns to increase according to Kirchhoff's current law at the output terminal. This suppresses the fall in the source voltage and the rise in the drain voltage of the driving N-type FET 101. The suppression of the fall in the source voltage of the driving N-type FET 101 is, in other words, the suppression of the fall in the voltage of the output terminal.

As described above, in the amplifier circuit 700 according to the present embodiment, the output feedback speed is higher than in the FET-input ID circuit 720 because of the addition of the feedback N-type FET 105, and the output fluctuation quickly shifts from the transient state to the steady state. In particular, the output feedback speed becomes higher at the falling edge than at the rising edge of the output waveform. Therefore, in the output waveform of the amplifier circuit 700, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 700 are shortened, and an amplifier circuit capable of transmitting a faster clock signal can be obtained. In addition, the rising settling time $t_{sr}$ and the falling settling time $t_{sf}$ are shortened, and an amplifier circuit capable of driving a larger output load can be obtained.

Next, a method for driving the amplifier circuit 700 will be described.

The ground potential is applied to the source of the load FET 102, and the power supply potential Vdd is applied to the emitter of the feedback PNP-type BJT 504. By applying the fixed potential V1 to the gate of the load FET 102, the load FET 102 is operated in the saturation region to serve as the constant current source, and by applying the fixed potential V3 to the source of the feedback N-type FET 105, the gate-source voltage is lowered. However, it is assumed that the relationships of Vdd>V1>ground potential (GND) and $V_A \geq V3 \geq$ ground potential (GND) are satisfied.

In this state, an input signal is input to the input terminal connected to the gate of the driving N-type FET 101, and an output signal is output from the output terminal connected to the source of the driving N-type FET 101.

In the present embodiment, the feedback N-type FET 105 cannot be changed to the feedback NPN-type BJT 605. This is because in this case, the emitter-base current of the feedback PNP-type BJT 504 becomes the base-emitter current of the feedback NPN-type BJT 605, and the collector current constantly flows through both the feedback PNP-type BJT 504 and the feedback NPN-type BJT 605.

Sixth Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

FIG. 27 is a diagram illustrating an example of a configuration of an amplifier circuit 800 according to the present embodiment. The amplifier circuit 800 is one form of a Darlington circuit. The amplifier circuit 800 includes a driving P-type FET 201, a load FET 202, a feedback P-type FET 104, and a feedback NPN-type BJT 605. In the amplifier circuit 800 of the present embodiment, the driving FET is a P-type FET, unlike the amplifier circuit 700 of the fifth embodiment.

The source of the load FET 202 is connected to the power supply, and the drain of the load FET 202 is connected to the source of the driving P-type FET 201.

The drain of the driving P-type FET 201 is connected to the base of the feedback NPN-type BJT 605. The input terminal IN of the amplifier circuit 800 is connected to the gate of the driving P-type FET 201. The fixed potential V1 is input to the gate of the load FET 202.

The connection point between the source of the driving P-type FET 201 and the drain of the load FET 202 is connected to the output terminal OUT.

The source of the feedback P-type FET 104 is connected to the fixed potential V3, and the drain of the feedback P-type FET 104 is connected to a collector of the feedback NPN-type BJT 605. The emitter of the feedback NPN-type BJT 605 is connected to the GND. Both the gate of the feedback P-type FET 104 and the base of the feedback NPN-type BJT 605 are connected to the drain of the driving P-type FET 201.

The connection point between the drain of the feedback P-type FET 104 and the collector of the feedback NPN-type BJT 605 is connected to the output terminal OUT.

<Operation of Amplifier Circuit>

The small signal operation of the amplifier circuit 800 will be described in comparison with the operation principle of the conventional source follower circuit 110 (cf. FIG. 2) and the conventional FET-input inverted Darlington (ID) circuit.

Figure 28:
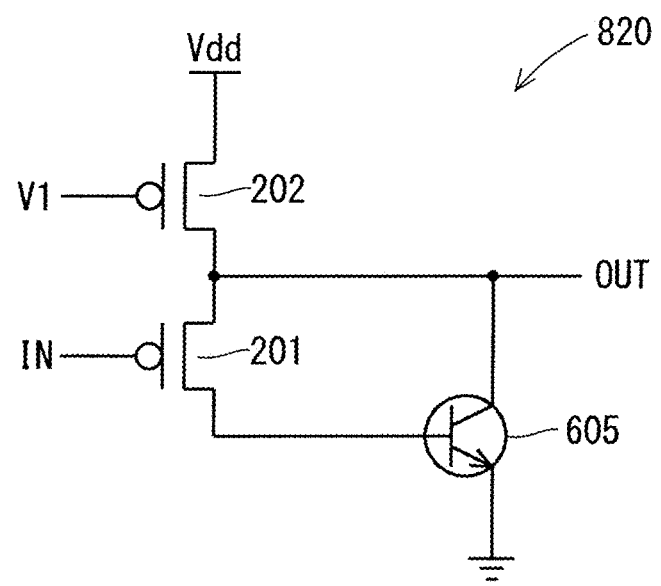
FIG. 28 is a diagram illustrating an example of a configuration of a conventional FET-input ID circuit.

FIG. 28 is a diagram illustrating an example of a configuration of a conventional FET-input ID circuit 820. The FET-input ID circuit 820 includes a feedback NPN-type BJT 605 in addition to the source follower circuit 110 illustrated in FIG. 2.

The emitter of the feedback NPN-type BJT 605 is connected to the GND, the collector of the feedback NPN-type BJT 605 is connected to the output terminal OUT, and the base of the feedback NPN-type BJT 605 is connected to the source of the driving P-type FET 201. Thereby, the feedback NPN-type BJT 605 forms a feedback circuit. As compared with the amplifier circuit 800 of FIG. 27, the FET-input ID circuit 820 has a configuration in which the feedback P-type FET 104 is omitted from the amplifier circuit 800.

FIG. 29 is a diagram illustrating an example of the small signal equivalent circuit of the FET-input ID circuit 820 of FIG. 28. From Kirchhoff's current law at the drain of the driving P-type FET 201 and the output terminal, the following expressions (37) and (38) hold.

$$V_{fb}/r_{fbn\_b} = \frac{V_{out} - V_{fb}}{r_{dp}} + gm_{dp}(V_{out} - V_{in}) \tag{37}$$

$$I_{out}(gm_{fbn}+1/r_{fbn\_b})V_{fb}+(1/r_{fbn\_c}+1/r_{lp})V_{out} \tag{38}$$

Here, $r_{fbn\_b}$ is a base resistance of the feedback NPN-type BJT 605, and $r_{fbn\_c}$ is a collector resistance of the feedback NPN-type BJT 605.

When $V_{in}=0$, the output resistance can be calculated from expressions (37) and (38) as in the following expression (39).

$$\frac{V_{out}}{I_{out}} = r_{lp} \,//\, f_{fbn\_c} \,//\, \frac{r_{dp} + r_{fbn\_b}}{(1+gm_{dp}r_{dp})(1+gm_{fbn}r_{fbn\_b})} \tag{39}$$

In an ideal FET without channel length modulation, $r_{lp} \to \infty$, $r_{dn} >> r_{fbn\_b}$, $gm_{dp}r_{dp} >> 1$, and $gm_{fbn}r_{fbn\_c} >> 1$, so that expression (39) can be approximated as the following expression (40).

$$\frac{V_{out}}{I_{out}} = \frac{1}{gm_{dp}gm_{fbn}r_{fbn\_b}} \tag{40}$$

Comparing expression (40) with expression (3) shows that the output resistance is reduced to $1/gm_{fbn}r_{fbn\_b}$ times that of the source follower circuit 110 in the FET-input ID circuit 820. Therefore, the driving force of the output load in the FET-input ID circuit 820 is higher than that in the source follower circuit 110.

Next, referring back to FIG. 28, the small signal operation of the FET-input ID circuit 820 will be described.

When the voltage of the input terminal rises, the gate voltage of the driving P-type FET 201 rises, so that the source-drain current of the driving P-type FET 201 decreases. As a result, the source voltage of the driving P-type FET 201 rises, and the drain voltage falls. The rise in the source voltage of the driving P-type FET 201 is, in other words, the rise in the voltage of the output terminal.

At the same time, as the drain voltage of the driving P-type FET 201 falls, the base voltage of the feedback NPN-type BJT 605 falls, and the collector current decreases. Here, with the load FET 202 being the constant current source, the source-drain current of the driving P-type FET 201 turns to increase according to Kirchhoff's current law at the output terminal. This suppresses the rise in the source voltage and the fall in the drain voltage of the driving P-type FET 201. The suppression of the rise in the source voltage of the driving P-type FET 201 is, in other words, the suppression of the rise in the voltage of the output terminal.

Conversely, when the voltage of the input terminal falls, the gate voltage of the driving P-type FET 201 falls, so that the source-drain current of the driving P-type FET 201 increases. As a result, the source voltage of the driving P-type FET 201 falls, and the drain voltage rises. The fall in the source voltage of the driving P-type FET 201 is, in other words, the fall in the voltage of the output terminal. At the same time, as the drain voltage of the driving P-type FET 201 rises, the base voltage of the feedback NPN-type BJT 605 rises, and the collector current increases. Here, with the load FET 202 being the constant current source, the source-drain current of the driving P-type FET 201 turns to decrease according to Kirchhoff's current law at the output terminal. This suppresses the fall in the source voltage and the rise in the drain voltage of the driving P-type FET 201. The suppression of the fall in the source voltage of the driving P-type FET 201 is, in other words, the suppression of the fall in the voltage of the output terminal.

As described above, in the FET-input ID circuit 820, the output fluctuation rapidly shifts from the transient state to the steady state as compared with the source follower circuit 110.

Next, a method for driving the FET-input ID circuit 820 will be described.

The power supply potential Vdd is applied to the source of the load FET 102, and the ground potential is applied to the emitter of the feedback NPN-type BJT 605. By applying the fixed potential V1 to the gate of the load FET 202, the load FET 202 is operated in the saturation region to serve as the constant current source. However, it is assumed that the relationship of Vdd>V1>ground potential (GND) is satisfied.

In this state, an input signal is input to the input terminal connected to the gate of the driving P-type FET 201, and an output signal is output from the output terminal connected to the source of the driving P-type FET 201.

Next, the small signal operation of the amplifier circuit 800 according to the present embodiment will be described. FIG. 30 is a diagram illustrating an example of the small signal equivalent circuit of the amplifier circuit 800 of FIG. 27. From Kirchhoff's current law at the drain of the driving P-type FET 201 and the output terminal, expression (37) and the following expression (41) hold.

$$I_{out} = (gm_{fbn} + gm_{fbp} + 1/r_{fbn\_b}) V_{fb} + (1/r_{fbn\_c} + 1/r_{fbp} + 1/r_{lp}) V_{out} \quad (41)$$

When $V_{in}=0$, the output resistance can be calculated from expressions (37) and (41) as in the following expression (42).

$$\frac{V_{out}}{I_{out}} = r_{lp} // r_{fbn\_c} // r_{fbp} // \frac{r_{dp} + r_{fbn\_b}}{(1 + gm_{dp}r_{dp})(1 + gm_{fbn}r_{fbn\_b} + gm_{fbp}r_{fbn\_b})} \quad (42)$$

In an ideal FET without channel length modulation, $r_{lp} \to \infty$, $r_{dn} \gg r_{fbn\_b}$, $gm_{dp}r_{dp} \gg 1$, $gm_{fbn}r_{fbn\_c}$, and $gm_{fbp}r_{fbp} \gg 1$, so that expression (42) can be approximated as the following expression (43).

$$\frac{V_{out}}{I_{out}} = \frac{1}{gm_{dp}(gm_{fbn} + gm_{fbp})r_{fbn\_b}} \quad (43)$$

Comparing expression (43) with expression (30) shows that the output resistance is reduced to $gm_{fbn}/(gm_{fbn}+gm_{fbp})$ times that of the FET-input ID circuit 820 in the amplifier circuit 800. Hence the driving force of the output load in the amplifier circuit 800 is higher than that in the FET-input ID circuit 820.

Next, referring back to FIG. 27, the operation principle of the amplifier circuit 800 will be described.

When the voltage of the input terminal rises, the gate voltage of the driving P-type FET 201 rises, so that the source-drain current of the driving P-type FET 201 decreases. As a result, the source voltage of the driving P-type FET 201 rises, and the drain voltage falls. The rise in the source voltage of the driving P-type FET 201 is, in other words, the rise in the voltage of the output terminal.

At the same time, as the drain voltage of the driving P-type FET 201 falls, the gate voltage of the feedback P-type FET 104 falls and the source-drain current increases, and the base voltage of the feedback NPN-type BJT 605 falls, and the collector current decreases. Here, with the load FET 202 being the constant current source, the source-drain current of the driving P-type FET 201 turns to increase according to Kirchhoff's current law at the output terminal. This suppresses the rise in the source voltage and the fall in the drain voltage of the driving P-type FET 201. The suppression of the rise in the source voltage of the driving P-type FET 201 is, in other words, the suppression of the rise in the voltage of the output terminal.

Conversely, when the voltage of the input terminal falls, the gate voltage of the driving P-type FET 201 falls, so that the source-drain current of the driving P-type FET 201 increases. As a result, the source voltage of the driving P-type FET 201 falls, and the drain voltage rises. The fall in the source voltage of the driving P-type FET 201 is, in other words, the fall in the voltage of the output terminal.

At the same time, as the drain voltage of the driving P-type FET 201 rises, the gate voltage of the feedback P-type FET 104 rises and the source-drain current decreases, and the base voltage of the feedback NPN-type BJT 605 rises and the collector current increases. Here, with the load FET 202 being the constant current source, the source-drain current of the driving P-type FET 201 turns to decrease according to Kirchhoff's current law at the output terminal. This suppresses the fall in the source voltage and the rise in the drain voltage of the driving P-type FET 201. The suppression of the fall in the source voltage of the driving P-type FET 201 is, in other words, the suppression of the fall in the voltage of the output terminal.

As described above, in the amplifier circuit 800 according to the present embodiment, the output feedback speed is higher than in the FET-input ID circuit 820 because of the addition of the feedback P-type FET 104, and the output fluctuation quickly shifts from the transient state to the steady state. In particular, the output feedback speed is higher at the rising edge than at the falling edge of the output waveform. Therefore, in the output waveform of the amplifier circuit 800, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 800 are shortened, and an amplifier circuit capable of transmitting a faster clock signal can be obtained. In addition, the rising settling time $t_{sr}$ and the falling settling time $t_{sf}$ are shortened, and an amplifier circuit capable of driving a larger output load can be obtained.

Next, a method for driving the amplifier circuit 800 will be described.

The power supply potential Vdd is applied to the source of the load FET 202, and the ground potential is applied to the emitter of the feedback NPN-type BJT 605. By applying the fixed potential V1 to the gate of the load FET 202, the load FET 202 is operated in the saturation region to serve as the constant current source, and by applying the fixed potential V3 to the source of the feedback P-type FET 104, the gate-source voltage is lowered. However, it is assumed that the relationships of Vdd>V1>ground potential (GND) and Vdd≥V3≥$V_A$ are satisfied.

In this state, an input signal is input to the input terminal connected to the gate of the driving P-type FET 201, and an output signal is output from the output terminal connected to the source of the driving P-type FET 201.

In the present embodiment, the feedback P-type FET 104 cannot be changed to the feedback PNP-type BJT 504. This is because in this case, the emitter-base current of the feedback PNP-type BJT 504 becomes the base-emitter current of the feedback NPN-type BJT 605, and the collector current constantly flows through both the feedback PNP-type BJT 504 and the feedback NPN-type BJT 605.

Seventh Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

FIG. 31 is a diagram illustrating an example of a configuration of an amplifier circuit 900 according to the present embodiment. The amplifier circuit 900 is one form of a Darlington circuit.

As compared with the amplifier circuit 700 of the fifth embodiment illustrated in FIG. 23, the amplifier circuit 900 has a configuration in which the driving N-type FET 101 is changed to a driving NPN-type BJT 701 in the amplifier circuit 700.

The collector of the driving NPN-type BJT 701 is connected to the base of the feedback PNP-type BJT 504 and the gate of the feedback N-type FET 105. The emitter of the driving NPN-type BJT 701 is connected to the drain of the load FET 102. The base of the driving NPN-type BJT 701 is connected to the input terminal IN. The connection point between the emitter of the driving NPN-type BJT 701 and the drain of the load FET 102 is connected to the output terminal OUT.

<Operation of Amplifier Circuit>

The small signal operation of the amplifier circuit 900 will be described in comparison with the operation principles of the conventional emitter follower circuit and the ID circuit.

FIG. 32 is a diagram illustrating an example of a configuration of a conventional emitter follower circuit 910. In FIG. 32, the source of the load FET 102 is connected to the GND, and the drain of the load FET 102 is connected to the emitter of the driving NPN-type BJT 701. The collector of the driving NPN-type BJT 701 is connected to the power supply. That is, the driving NPN-type BJT 701 and the load FET 102 are disposed in series between the power supply and the GND.

The connection point between the emitter of the driving NPN-type BJT 701 and the drain of the load FET 102 is connected to the output terminal OUT. The gate of the load FET 102 is connected to the fixed potential V1, and the load FET 102 functions as a constant current source.

As compared with the amplifier circuit 900 of FIG. 31, the emitter follower circuit 910 has a configuration in which the feedback PNP-type BJT 504 and the feedback N-type FET 105 are omitted from the amplifier circuit 900.

FIG. 33 is a diagram illustrating an example of the small signal equivalent circuit of the emitter follower circuit 910 of FIG. 32. The output resistance of the emitter follower circuit 910 is expressed by the following expression (44).

$$\frac{V_{out}}{I_{out}} = r_{dn\_c} // r_{In} // \frac{r_s + r_{dn\_b}}{gm_{dn} r_{dn\_b} + 1} \tag{44}$$

Here, $r_s$ is the output resistance of the signal source $V_{in}$, $gm_{dn}$ is the transconductance of the driving NPN-type BJT 701, $r_{dn\_b}$ is the base resistance of the driving NPN-type BJT 701, and $r_{dn\_c}$ is the collector resistance of the driving NPN-type BJT 701.

In an ideal FET without channel length modulation, $r_{In} \to \infty$. Further, in an ideal BJT without the early effect, $r_{dn\_c} \to \infty$ and $gm_{dn} r_{dn\_b} \gg 1$, so that expression (44) can be approximated as the following expression (45).

$$\frac{V_{out}}{I_{out}} = \frac{r_s + r_{dn\_b}}{gm_{dn} r_{dn\_b}} \tag{45}$$

Figure 34:
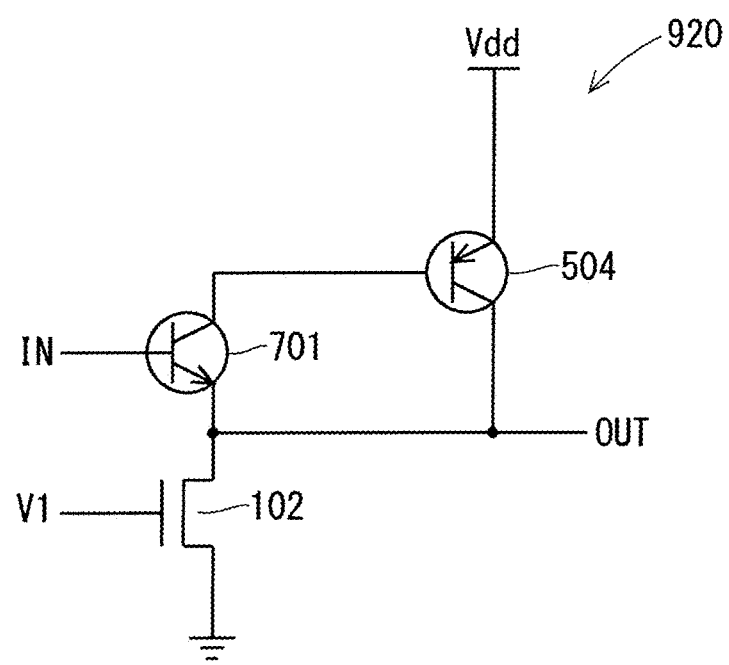
FIG. 34 is a diagram illustrating an example of a configuration of a conventional ID circuit.

FIG. 34 is a diagram illustrating an example of a configuration of a conventional ID circuit 920. The ID circuit 920 of FIG. 34 has a configuration in which a feedback PNP-type BJT 504 is added to the emitter follower circuit 910 of FIG. 32. As compared with the amplifier circuit 900 of FIG. 31, the ID circuit 920 of FIG. 34 has a configuration in which the feedback N-type FET 105 is omitted from the amplifier circuit 900.

FIG. 35 is a diagram illustrating an example of the small signal equivalent circuit of the ID circuit 920 of FIG. 34. From Kirchhoff's current law at the collector and output terminals of the driving NPN-type BJT 701, the following expressions (46) and (47) hold.

$$V_{fb} / r_{fbp\_b} = \frac{V_{out} - V_{fb}}{r_{dn\_c}} + gm_{dn}(V_{out} - V_{in}) \tag{46}$$

$$I_{out} = (gm_{fbp} + 1/r_{fbp\_b}) V_{fb} + \left(\frac{gm_{dn} r_{dn\_b} + 1}{r_s + r_{dn\_b}} + 1/r_{fbp\_c} + 1/r_{In}\right) V_{out} \tag{47}$$

When $V_{in} = 0$, the output resistance can be calculated from expressions (46) and (47) as in the following expression (48).

$$\frac{V_{out}}{I_{out}} = r_{In} // r_{fbp\_c} // \frac{r_{dn\_c} + r_{fbp\_b}}{(1 + gm_{dn} r_{dn\_c})(1 + gm_{fbp} r_{fbp\_b})} // \frac{r_s + r_{dn\_b}}{gm_{dn} r_{dn\_b} + 1} \tag{48}$$

In an ideal FET without channel length modulation, $r_{In} \to \infty$. For a BJT, $r_{dn\_c} \gg r_{fbp\_b}$. Further, $gm_{dn} r_{dn\_c} \gg 1$, $gm_{fbp} r_{fbp\_c} \gg 1$, and $gm_{dn} r_{dn\_b} \gg 1$, so that expression (48) can be approximated as the following expression (49).

$$\frac{V_{out}}{I_{out}} = \frac{1}{gm_{dn}gm_{fbp}r_{fbp\_b}} // \frac{r_s + r_{dn\_b}}{gm_{dn}r_{dn\_b}} = \quad (49)$$

$$\frac{r_s + r_{dn\_b}}{gm_{dn}[r_{dn\_b} + gm_{fbp}r_{fbp\_b}(r_s + r_{dn\_b})]}$$

Comparing expression (49) with expression (45) shows that the output resistance of the ID circuit 920 is reduced to $A_{920/910}$ times that of the emitter follower circuit 910. Here, $A_{920/910}$ is as in the following expression (50).

$$A_{920/910} = \frac{1}{1 + gm_{fbp}r_{fbp\_b}(1 + r_s/r_{dn\_b})} \quad (50)$$

Therefore, the driving force of the output load in the ID circuit 920 is higher than that in the emitter follower circuit 910.

Next, referring back to FIG. 34, the small signal operation of the ID circuit 920 will be described.

When the voltage of the input terminal rises, the base voltage of the driving NPN-type BJT 701 rises, so that the emitter current of the driving NPN-type BJT 701 increases. As a result, the emitter voltage of the driving NPN-type BJT 701 rises, and the collector voltage falls. The rise in the emitter voltage of the driving NPN-type BJT 701 is, in other words, the rise in the voltage of the output terminal.

At the same time, as the collector voltage of the driving NPN-type BJT 701 falls, the base voltage of the feedback PNP-type BJT 504 falls, and the collector current increases. Here, with the load FET 102 being the constant current source, the emitter current of the driving NPN-type BJT 701 turns to decrease according to Kirchhoff's current law at the output terminal. This suppresses the rise in the emitter voltage and the fall in the collector voltage of the driving NPN-type BJT 701. The suppression of the rise in the emitter voltage of the driving NPN-type BJT 701 is, in other words, the suppression of the rise in the voltage of the output terminal.

Conversely, when the voltage of the input terminal falls, the base voltage of the driving NPN-type BJT 701 falls, so that the emitter current of the driving NPN-type BJT 701 decreases. As a result, the emitter voltage of the driving NPN-type BJT 701 falls, and the collector voltage rises. The fall in the emitter voltage of the driving NPN-type BJT 701 is, in other words, the fall in the voltage of the output terminal. At the same time, as the collector voltage of the driving NPN-type BJT 701 rises, the base voltage of the feedback PNP-type BJT 504 rises, and the collector current decreases. Here, with the load FET 102 being the constant current source, the emitter current of the driving NPN-type BJT 701 turns to increase according to Kirchhoff's current law at the output terminal. This suppresses the fall in the emitter voltage and the rise in the collector voltage of the driving NPN-type BJT 701. The suppression of the fall in the emitter voltage of the driving NPN-type BJT 701 is, in other words, the suppression of the fall in the voltage of the output terminal.

As described above, in the ID circuit 920, the output fluctuation quickly shifts from the transient state to the steady state as compared with the emitter follower circuit 910.

Next, a method for driving the ID circuit 920 will be described.

The ground potential is applied to the source of the load FET 102, and the power supply potential Vdd is applied to the emitter of the feedback PNP-type BJT 504. By applying the fixed potential V1 to the gate of the load FET 102, the load FET 102 is operated in the saturation region to serve as the constant current source. However, it is assumed that the relationship of Vdd>V1>ground potential (GND) is satisfied.

In this state, an input signal is input to the input terminal connected to the base of the driving NPN-type BJT 701, and an output signal is output from the output terminal connected to the emitter of the driving NPN-type BJT 701.

Figure 36:
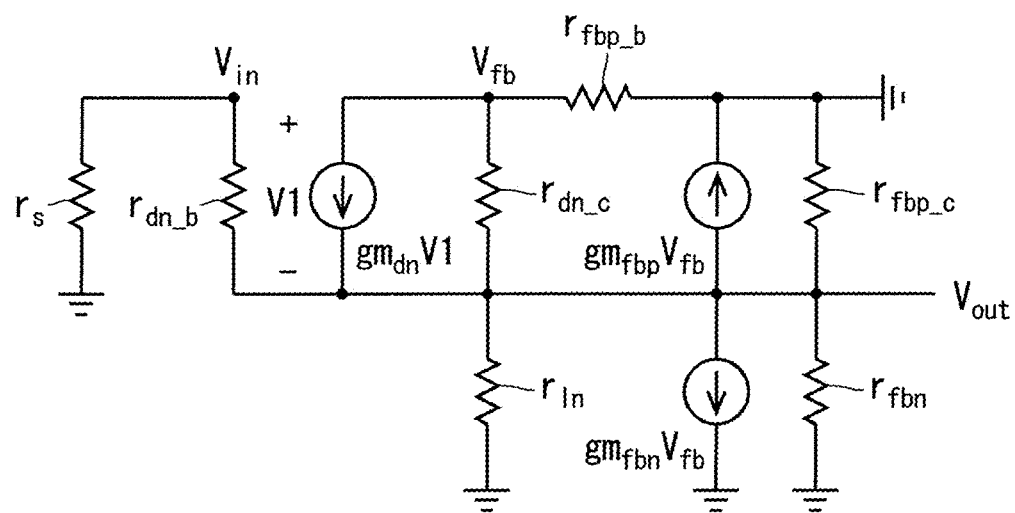
FIG. 36 is a diagram illustrating an example of the small signal equivalent circuit of the amplifier circuit of FIG. 31.

Next, the small signal operation of the amplifier circuit 900 according to the present embodiment will be described. FIG. 36 is a diagram illustrating an example of the small signal equivalent circuit of the amplifier circuit 900 of FIG. 31. From Kirchhoff's current law at the collector and output terminals of the driving NPN-type BJT 701, expression (46) and the following expression (51) hold.

$$I_{out} = (gm_{fbn} + gm_{fbp} + 1/r_{fbp\_b})V_{fb} + \quad (51)$$

$$\left(\frac{gm_{dn}r_{dn\_b} + 1}{r_s + r_{dn\_b}} + 1/r_{fbn} + 1/r_{fbp\_c} + 1/r_{ln}\right)V_{out}$$

When $V_{in}=0$, the output resistance can be calculated from expressions (46) and (51) as in the following expression (52).

$$\frac{V_{out}}{I_{out}} = r_{ln} // r_{fbn} // r_{fbp\_c} // \quad (52)$$

$$\frac{r_{dn\_c} + r_{fbp\_b}}{(1 + gm_{dn}r_{dn\_c})(1 + gm_{fbn}r_{fbp\_b} + gm_{fbp}r_{fbp\_b})} // \frac{r_s + r_{dn\_b}}{gm_{dn}r_{dn\_b} + 1}$$

In an ideal FET without channel length modulation, $r_{ln} \to \infty$. For a BJT, $r_{dn\_c} >> r_{fbp\_b}$. Further, $gm_{dn}r_{dn\_c} >> 1$, $gm_{fbn}r_{fbn} >> 1$, $gm_{fbp}r_{fbp\_c} >> 1$, and $gm_{dn}r_{dn\_b} >> 1$, so that expression (52) can be approximated as the following expression (53).

$$\frac{V_{out}}{I_{out}} = \frac{1}{gm_{dn}(gm_{fbn} + gm_{fbp})r_{fbp\_b}} // \frac{r_s + r_{dn\_b}}{gm_{dn}r_{dn\_b}} = \quad (53)$$

$$\frac{r_s + r_{dn\_b}}{gm_{dn}[r_{dn\_b} + (gm_{fbn} + gm_{fbp})r_{fbp\_b}(r_s + r_{dn\_b})]}$$

Comparing expression (53) with expression (49) shows that the output resistance of the amplifier circuit 900 is reduced to $A_{900/920}$ times that of the ID circuit 920. Here, $A_{900/920}$ is as in the following expression (54).

$$A_{900/920} = \frac{1 + gm_{fbp}r_{fbp\_b}(1 + r_s/r_{dn\_b})}{1 + (gm_{fbn} + gm_{fbp})r_{fbp\_b}(1 + r_s/r_{dn\_b})} \quad (54)$$

Therefore, the driving force of the output load in the amplifier circuit 900 is higher than that in the ID circuit 920.

Next, referring back to FIG. 31, the small signal operation of the amplifier circuit 900 will be described.

When the voltage of the input terminal rises, the base voltage of the driving NPN-type BJT 701 rises, so that the emitter current of the driving NPN-type BJT 701 increases.

As a result, the emitter voltage of the driving NPN-type BJT 701 rises, and the collector voltage falls. The rise in the emitter voltage of the driving NPN-type BJT 701 is, in other words, the rise in the voltage of the output terminal.

At the same time, as the collector voltage of the driving NPN-type BJT 701 falls, the base voltage of the feedback PNP-type BJT 504 falls and the collector current increases, and the gate voltage of the feedback N-type FET 105 falls and the source-drain current decreases. Here, with the load FET 102 being the constant current source, the emitter current of the driving NPN-type BJT 701 turns to decrease according to Kirchhoff's current law at the output terminal. This suppresses the rise in the emitter voltage and the fall in the collector voltage of the driving NPN-type BJT 701. The suppression of the rise in the emitter voltage of the driving NPN-type BJT 701 is, in other words, the suppression of the rise in the voltage of the output terminal.

Conversely, when the voltage of the input terminal falls, the base voltage of the driving NPN-type BJT 701 falls, so that the emitter current of the driving NPN-type BJT 701 decreases. As a result, the emitter voltage of the driving NPN-type BJT 701 falls, and the collector voltage rises. The fall in the emitter voltage of the driving NPN-type BJT 701 is, in other words, the fall in the voltage of the output terminal.

At the same time, as the collector voltage of the driving NPN-type BJT 701 rises, the base voltage of the feedback PNP-type BJT 504 rises and the collector current decreases, and the gate voltage of the feedback N-type FET 105 rises and the source-drain current increases. Here, with the load FET 102 being the constant current source, the emitter current of the driving NPN-type BJT 701 turns to increase according to Kirchhoff's current law at the output terminal. This suppresses the fall in the emitter voltage and the rise in the collector voltage of the driving NPN-type BJT 701. The suppression of the fall in the emitter voltage of the driving NPN-type BJT 701 is, in other words, the suppression of the fall in the voltage of the output terminal.

As described above, in the amplifier circuit 900 according to the present embodiment, the output feedback speed is higher than in the ID circuit 920 because of the addition of the feedback N-type FET 105, and the output fluctuation quickly shifts from the transient state to the steady state. In particular, the output feedback speed becomes higher at the falling edge than at the rising edge of the output waveform. Therefore, in the output waveform of the amplifier circuit 900, the rising and falling become steep, while the overshoot and undershoot of the rising and falling are reduced, and the oscillation of the output waveform is also reduced. As a result, the rising time $t_r$ and the falling time $t_f$ of the output waveform of the amplifier circuit 900 are shortened, and an amplifier circuit capable of transmitting a faster clock signal can be obtained. In addition, the rising settling time $t_{sr}$ and the falling settling time $t_{sf}$ are shortened, and an amplifier circuit capable of driving a larger output load can be obtained.

Next, a method for driving the amplifier circuit 900 will be described.

The ground potential is applied to the source of the load FET 102, and the power supply potential Vdd is applied to the emitter of the feedback PNP-type BJT 504. By applying the fixed potential V1 to the gate of the load FET 102, the load FET 102 is operated in the saturation region to serve as the constant current source, and by applying the fixed potential V3 to the source of the feedback N-type FET 105, the gate-source voltage is lowered. However, it is assumed that the relationships of Vdd>V1>ground potential (GND) and $V_A \geq V3 \geq$ ground potential (GND) are satisfied.

In this state, an input signal is input to the input terminal connected to the gate of the driving NPN-type BJT 701, and an output signal is output from the output terminal connected to the emitter of the driving NPN-type BJT 701.

In the present embodiment, the feedback N-type FET 105 cannot be changed to the feedback NPN-type BJT 605. This is because in this case, the emitter-base current of the feedback PNP-type BJT 504 becomes the base-emitter current of the feedback NPN-type BJT 605, and the collector current constantly flows through both the feedback PNP-type BJT 504 and the feedback NPN-type BJT 605.

Eighth Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

Figure 37:
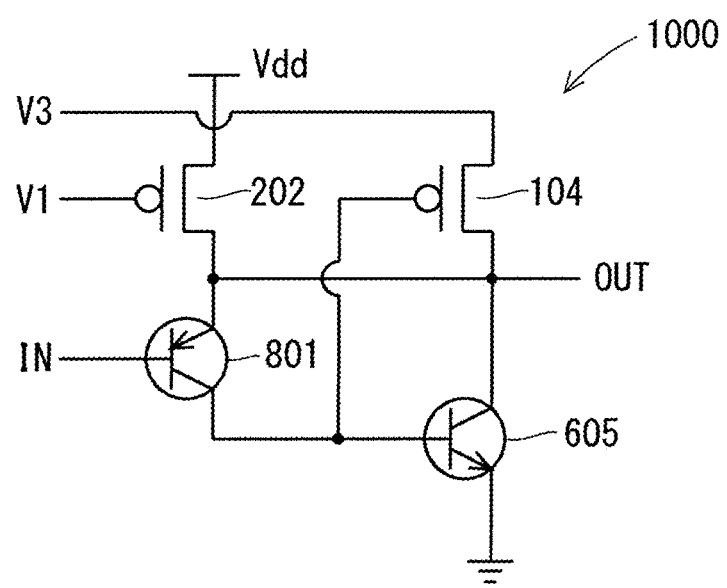
FIG. 37 is a diagram illustrating an example of a configuration of an amplifier circuit according to an embodiment.

FIG. 37 is a diagram illustrating an example of a configuration of an amplifier circuit 1000 according to the present embodiment. The amplifier circuit 1000 is one form of a Darlington circuit.

As compared with the amplifier circuit 800 of the sixth embodiment illustrated in FIG. 27, the amplifier circuit 1000 has a configuration in which the driving P-type FET 201 is changed to a driving PNP-type BJT 801 in the amplifier circuit 800.

The collector of the driving PNP-type BJT 801 is connected to the gate of the feedback P-type FET 104 and the base of the feedback NPN-type BJT 605. The emitter of the driving PNP-type BJT 801 is connected to the drain of the load FET 202. The base of the driving PNP-type BJT 801 is connected to the input terminal IN. The connection point between the emitter of the driving PNP-type BJT 801 and the drain of the load FET 202 is connected to the output terminal OUT.

<Operation of Amplifier Circuit>

The small signal operation of the amplifier circuit 1000 will be described in comparison with the operation principles of the conventional emitter follower circuit and the ID circuit.

FIG. 38 is a diagram illustrating an example of a configuration of a conventional emitter follower circuit 1010. In FIG. 38, the source of the load FET 202 is connected to the power supply, and the drain of the load FET 202 is connected to the emitter of the driving PNP-type BJT 801. The collector of the driving PNP-type BJT 801 is connected to the GND. That is, the load FET 202 and the driving PNP-type BJT 801 are disposed in series between the power supply and the GND.

The connection point between the drain of the load FET 202 and the emitter of the driving PNP-type BJT 801 is connected to the output terminal OUT. The gate of the load FET 202 is connected to the fixed potential V1, and the load FET 202 functions as a constant current source.

As compared with the amplifier circuit 1000 in FIG. 37, the emitter follower circuit 1010 has a configuration in which the feedback P-type FET 104 and the feedback NPN-type BJT 605 are omitted from the amplifier circuit 1000.

FIG. 39 is a diagram illustrating an example of the small signal equivalent circuit of the emitter follower circuit 1010 of FIG. 38. The output resistance of the emitter follower circuit 1010 is expressed by the following expression (55).

$$\frac{V_{out}}{I_{out}} = r_{dp\_c} // r_{lp} // \frac{r_s + r_{dp\_b}}{gm_{dp}r_{dp\_b} + 1} \quad (55)$$

Here, $gm_{dp}$ is the transconductance of the driving PNP-type BJT 801, $r_{dp\_b}$ is the base resistance of the driving PNP-type BJT 801, and $r_{dp\_c}$ is the collector resistance of the driving PNP-type BJT 801.

In an ideal FET without channel length modulation, $r_{lp} \to \infty$. Further, in an ideal BJT without the early effect, $r_{dp\_c} \to \infty$ and $gm_{dp}r_{dp\_b} >> 1$, so that expression (55) can be approximated as the following expression (56).

$$\frac{V_{out}}{I_{out}} = \frac{r_s + r_{dp\_b}}{gm_{dp}r_{dp\_b}} \quad (56)$$

Figure 40:
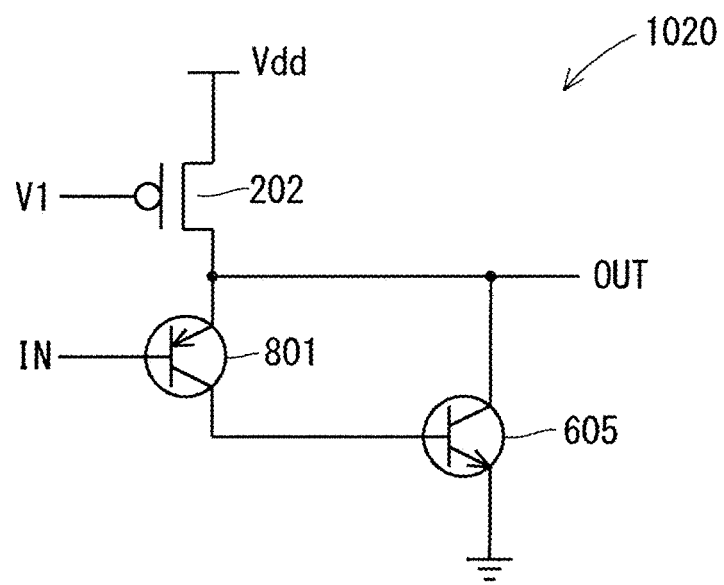
FIG. 40 is a diagram illustrating an example of a configuration of a conventional ID circuit.

FIG. 40 is a diagram illustrating an example of a configuration of a conventional ID circuit 1020. The ID circuit 1020 of FIG. 40 has a configuration in which a feedback NPN-type BJT 605 is added to the emitter follower circuit 1010 of FIG. 39. As compared with the amplifier circuit 1000 of FIG. 37, the ID circuit 1020 of FIG. 40 has a configuration in which the feedback P-type FET 104 is omitted from the amplifier circuit 1000.

FIG. 41 is a diagram illustrating an example of the small signal equivalent circuit of the ID circuit 1020 of FIG. 40. From Kirchhoff's current law at the collector and output terminals of the driving PNP-type BJT 801, the following expressions (57) and (58) hold.

$$V_{fb}/r_{fbn\_b} = \frac{V_{out} - V_{fb}}{r_{dp\_c}} + gm_{dp}(V_{out} - V_{in}) \quad (57)$$

$$I_{out} = (gm_{fbn} + 1/r_{fbn\_b})V_{fb} + \left(\frac{gm_{dp}r_{dp\_b} + 1}{r_s + r_{dp\_b}} + 1/r_{fbn\_c} + 1/r_{lp}\right)V_{out} \quad (58)$$

When $V_{in}=0$, the output resistance can be calculated from expressions (57) and (58) as in the following expression (59).

$$\frac{V_{out}}{I_{out}} = r_{lp} // r_{fbn\_c} // \frac{r_{dp\_c} + r_{fbn\_b}}{(1 + gm_{dp}r_{dp\_c})(1 + gm_{fbn}r_{fbn\_b})} // \frac{r_s + r_{dp\_b}}{gm_{dp}r_{dp\_b} + 1} \quad (59)$$

In an ideal FET without channel length modulation, $r_{lp} \to \infty$. For a BJT, $r_{dp\_c} >> r_{fbn\_b}$. Further, $gm_{dp}r_{dp\_c} >> 1$, $gm_{fbn}r_{fbn\_c} >> 1$, and $gm_{dp}r_{dp\_b} >> 1$, so that expression (59) can be approximated as the following expression (60).

$$\frac{V_{out}}{I_{out}} = \frac{1}{gm_{dp}gm_{fbn}r_{fbn\_b}} // \frac{r_s + r_{dp\_b}}{gm_{dp}r_{dp\_b}} = \quad (60)$$

$$\frac{r_s + r_{dp\_b}}{gm_{dp}[r_{dp\_b} + gm_{fbn}r_{fbn\_b}(r_s + r_{dp\_b})]}$$

Comparing expression (60) with expression (56) shows that the output resistance of the ID circuit 1020 is reduced to $A_{1020/1010}$ times that of the emitter follower circuit 1010. Here, $A_{1020/1010}$ is as in the following expression (61).

$$A_{1020/1010} = \frac{1}{1 + gm_{fbn}r_{fbn\_b}(1 + r_s/r_{dp\_b})} \quad (61)$$

Therefore, the driving force of the output load in the ID circuit 1020 is higher than that in the emitter follower circuit 1010.

Next, referring back to FIG. 40, the small signal operation of the ID circuit 1020 will be described.

When the voltage of the input terminal rises, the base voltage of the driving PNP-type BJT 801 rises, so that the emitter current of the driving PNP-type BJT 801 decreases. As a result, the emitter voltage of the driving PNP-type BJT 801 rises, and the collector voltage falls. The rise in the emitter voltage of the driving PNP-type BJT 801 is, in other words, the rise in the voltage of the output terminal.

At the same time, as the collector voltage of the driving PNP-type BJT 801 falls, the base voltage of the feedback NPN-type BJT 605 falls, and the collector current decreases. Here, with the load FET 202 being the constant current source, the emitter current of the driving PNP-type BJT 801 turns to increase according to Kirchhoff's current law at the output terminal. This suppresses the rise in the emitter voltage and the fall in the collector voltage of the driving PNP-type BJT 801. The suppression of the rise in the emitter voltage of the driving PNP-type BJT 801 is, in other words, the suppression of the rise in the voltage of the output terminal.

Conversely, when the voltage of the input terminal falls, the base voltage of the driving PNP-type BJT 801 falls, so that the emitter current of the driving PNP-type BJT 801 increases. As a result, the emitter voltage of the driving PNP-type BJT 801 falls, and the collector voltage rises. The fall in the emitter voltage of the driving PNP-type BJT 801 is, in other words, the fall in the voltage of the output terminal. At the same time, as the collector voltage of the driving PNP-type BJT 801 rises, the base voltage of the feedback NPN-type BJT 605 rises, and the collector current increases. Here, with the load FET 202 being the constant current source, the emitter current of the driving PNP-type BJT 801 turns to decrease according to Kirchhoff's current law at the output terminal. This suppresses the fall in the emitter voltage and the rise in the collector voltage of the driving PNP-type BJT 801. The suppression of the fall in the emitter voltage of the driving PNP-type BJT 801 is, in other words, the suppression of the fall in the voltage of the output terminal.

As described above, in the ID circuit 1020, the output fluctuation quickly shifts from the transient state to the steady state as compared with the emitter follower circuit 1010.

Next, a method for driving the ID circuit 1020 will be described.

The power supply potential Vdd is applied to the source of the load FET 202, and the ground potential is applied to the emitter of the feedback NPN-type BJT 605. By applying the fixed potential V1 to the gate of the load FET 202, the load FET 202 is operated in the saturation region to serve as the constant current source. However, it is assumed that the relationship of Vdd>V1>ground potential (GND) is satisfied.

In this state, an input signal is input to the input terminal connected to the base of the driving PNP-type BJT 801, and an output signal is output from the output terminal connected to the emitter of the driving PNP-type BJT 801.

Figure 42:
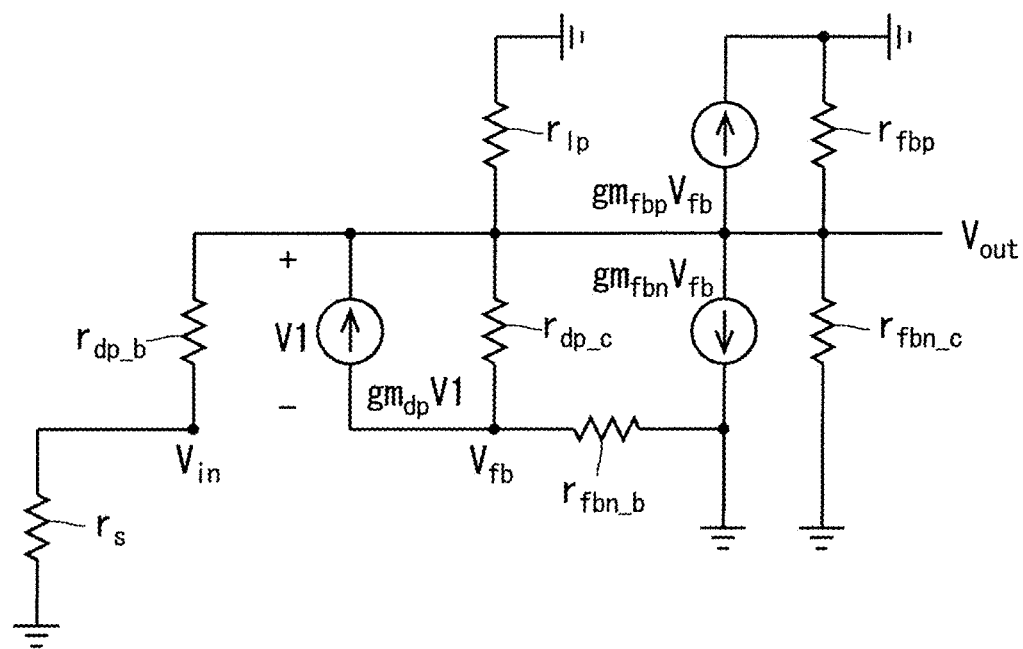
FIG. 42 is a diagram illustrating an example of the small signal equivalent circuit of the amplifier circuit of FIG. 37.

Next, the small signal operation of the amplifier circuit 1000 according to the present embodiment will be described. FIG. 42 is a diagram illustrating an example of the small signal equivalent circuit of the amplifier circuit 1000 of FIG. 37. From Kirchhoff's current law at the collector and output terminals of the driving PNP-type BJT 801, expression (57) and the following expression (62) hold.

$$I_{out} = (gm_{fbn} + gm_{fbp} + 1/r_{fbn\_b})V_{fb} + \left(\frac{gm_{dp}r_{dp\_b} + 1}{r_s + r_{dp\_b}} + 1/r_{fbn\_c} + 1/r_{fbp} + 1/r_{lp}\right)V_{out} \quad (62)$$

When $V_{in}=0$, the output resistance can be calculated from expressions (57) and (62) as in the following expression (63).

$$\frac{V_{out}}{I_{out}} = r_{lp} // r_{fbn\_c} // r_{fbp} // \frac{r_{dp\_c} + r_{fbn\_b}}{(1+gm_{dp}r_{dp\_c})(1+gm_{fbp}r_{fbn\_b}+gm_{fbn}r_{fbn\_b})} // \frac{r_s + r_{dp\_b}}{gm_{dp}r_{dp\_b}+1} \quad (63)$$

In an ideal FET without channel length modulation, $r_{ln} \to \infty$. For a BJT, $r_{dp\_c} \gg r_{fbn\_b}$. Further, $gm_{dp}r_{dp\_c} \gg 1$, $gm_{fbn}r_{fbn\_c} \gg 1$, $gm_{fbp}r_{fbp} \gg 1$, and $gm_{dp}r_{dp\_b} \gg 1$, so that expression (63) can be approximated as the following expression (64).

$$\frac{V_{out}}{I_{out}} = \frac{1}{gm_{dp}(gm_{fbn}+gm_{fbp})r_{fbn\_b}} // \frac{r_s + r_{dp\_b}}{gm_{dp}r_{dp\_b}} = \frac{r_s + r_{dp\_b}}{gm_{dp}[r_{dp\_b}+(gm_{fbn}+gm_{fbp})r_{fbn\_b}(r_s+r_{dp\_b})]} \quad (64)$$

Comparing expression (64) with expression (60) shows that the output resistance of the amplifier circuit 1000 is reduced to $A_{1000/1002}$ times that of the ID circuit 1020. Here, $A_{1000/1002}$ is as in the following expression (65).

$$A_{1000/1020} = \frac{1+gm_{fbn}r_{fbn\_b}(1+r_s/r_{dp\_b})}{1+(gm_{fbn}+gm_{fbp})r_{fbn\_b}(1+r_s/r_{dp\_b})} \quad (65)$$

Therefore, the driving force of the output load in the amplifier circuit 1000 is higher than that in the ID circuit 1020.

Next, referring back to FIG. 37, the small signal operation of the amplifier circuit 1000 will be described.

When the voltage of the input terminal rises, the base voltage of the driving PNP-type BJT 801 rises, so that the emitter current of the driving PNP-type BJT 801 decreases. As a result, the emitter voltage of the driving PNP-type BJT 801 rises, and the collector voltage falls. The rise in the emitter voltage of the driving PNP-type BJT 801 is, in other words, the rise in the voltage of the output terminal.

At the same time, as the collector voltage of the driving PNP-type BJT 801 falls, the gate voltage of the feedback P-type FET 104 falls and the source-drain current increases, and the base voltage of the feedback NPN-type BJT 605 falls, and the collector current decreases. Here, with the load FET 202 being the constant current source, the emitter current of the driving PNP-type BJT 801 turns to increase according to Kirchhoff's current law at the output terminal. This suppresses the rise in the emitter voltage and the fall in the collector voltage of the driving PNP-type BJT 801. The suppression of the rise in the emitter voltage of the driving PNP-type BJT 801 is, in other words, the suppression of the rise in the voltage of the output terminal.

Conversely, when the voltage of the input terminal falls, the base voltage of the driving PNP-type BJT 801 falls, so that the emitter current of the driving PNP-type BJT 801 increases. As a result, the emitter voltage of the driving PNP-type BJT 801 falls, and the collector voltage rises. The fall in the emitter voltage of the driving PNP-type BJT 801 is, in other words, the fall in the voltage of the output terminal.

At the same time, as the collector voltage of the driving PNP-type BJT 801 rises, the gate voltage of the feedback P-type FET 104 rises and the source-drain current decreases, and the base voltage of the feedback NPN-type BJT 605 rises, and the collector current increases. Here, with the load FET 202 being the constant current source, the emitter current of the driving PNP-type BJT 801 turns to decrease according to Kirchhoff's current law at the output terminal. This suppresses the fall in the emitter voltage and the rise in the collector voltage of the driving PNP-type BJT 801. The suppression of the fall in the emitter voltage of the driving PNP-type BJT 801 is, in other words, the suppression of the fall in the voltage of the output terminal.

As described above, in the amplifier circuit 1000 according to the present embodiment, the output feedback speed is higher than in the ID circuit 1020 because of the addition of the feedback P-type FET 104, and the output fluctuation quickly shifts from the transient state to the steady state. In particular, the output feedback speed becomes higher at the falling edge than at the rising edge of the output waveform. Therefore, in the output waveform of the amplifier circuit 1000, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 1000 are shortened, and an amplifier circuit capable of transmitting a faster clock signal can be obtained. In addition, the rising settling time $t_{sr}$ and the falling settling time $t_{sf}$ are shortened, and an amplifier circuit capable of driving a larger output load can be obtained.

Next, a method for driving the amplifier circuit 1000 will be described.

The power supply potential Vdd is applied to the source of the load FET 202, and the ground potential is applied to the emitter of the feedback NPN-type BJT 605. In addition, by applying the fixed potential V1 to the gate of the load FET 202, the load FET 202 is operated in the saturation region to serve as the constant current source, and by applying the fixed potential V3 to the source of the feedback P-type FET 104, the gate-source voltage is lowered. However, it is assumed that the relationships of Vdd>V1>ground potential (GND) and Vdd≥V3≥$V_A$ are satisfied.

In this state, an input signal is input to the input terminal connected to the base of the driving PNP-type BJT 801, and an output signal is output from the output terminal connected to the emitter of the driving PNP-type BJT 801.

In the present embodiment, the feedback P-type FET 104 cannot be changed to the feedback PNP-type BJT 504. This is because in this case, the emitter-base current of the feedback PNP-type BJT 504 becomes the base-emitter current of the feedback NPN-type BJT 605, and the collector current constantly flows through both the feedback PNP-type BJT 504 and the feedback NPN-type BJT 605.

Ninth Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

Figure 43:
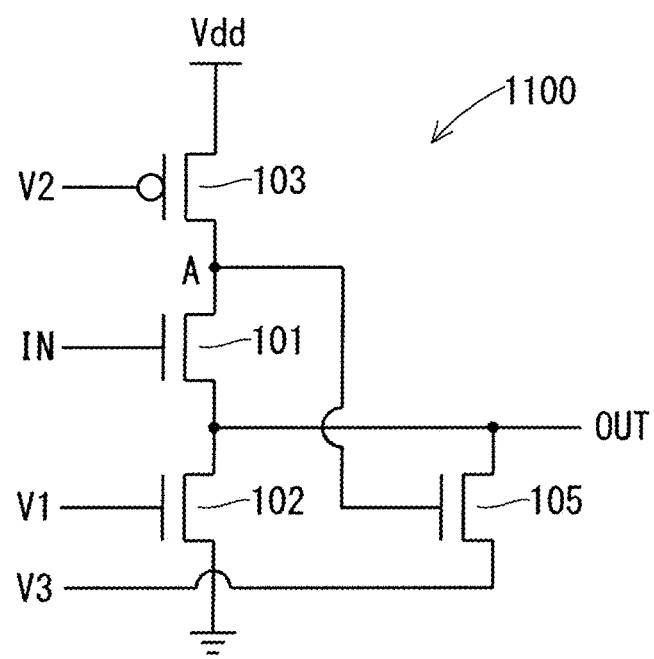
FIG. 43 is a diagram illustrating an example of a configuration of an amplifier circuit according to an embodiment.

FIG. 43 is a diagram illustrating an example of a configuration of an amplifier circuit 1100 according to the present embodiment. The amplifier circuit 1100 is one form of a source follower circuit.

The amplifier circuit 1100 includes a driving N-type FET 101, a load FET 102, a current source FET 103, and a feedback N-type FET 105. The driving N-type FET 101, the load FET 102, and the feedback N-type FET 105 are formed of N-type FETs. The current source FET 103 is a P-type FET.

The source of the load FET 102 is connected to the GND, and the drain of the load FET 102 is connected to the source of the driving N-type FET 101. The drain of the current source FET 103 is connected to the drain of the driving N-type FET 101, and the source of the current source FET 103 is connected to the power supply.

That is, the current source FET 103, the driving N-type FET 101, and the load FET 102 are disposed in series between the power supply and the GND.

The input terminal IN of the amplifier circuit 1100 is connected to the gate of the driving N-type FET 101. The fixed potential V1 is input to the gate of the load FET 102. Thereby, the load FET 102 functions as a constant current source.

The connection point between the source of the driving N-type FET 101 and the drain of the load FET 102 is connected to an output terminal OUT.

The source of the feedback N-type FET 105 is connected to a fixed potential V3. The gate of the feedback N-type FET 105 is connected to the connection point between the drain of the current source FET 103 and the drain of the driving N-type FET 101. The drain of the feedback N-type FET 105 is connected to the output terminal OUT.

<Operation of Amplifier Circuit>

Figure 44:
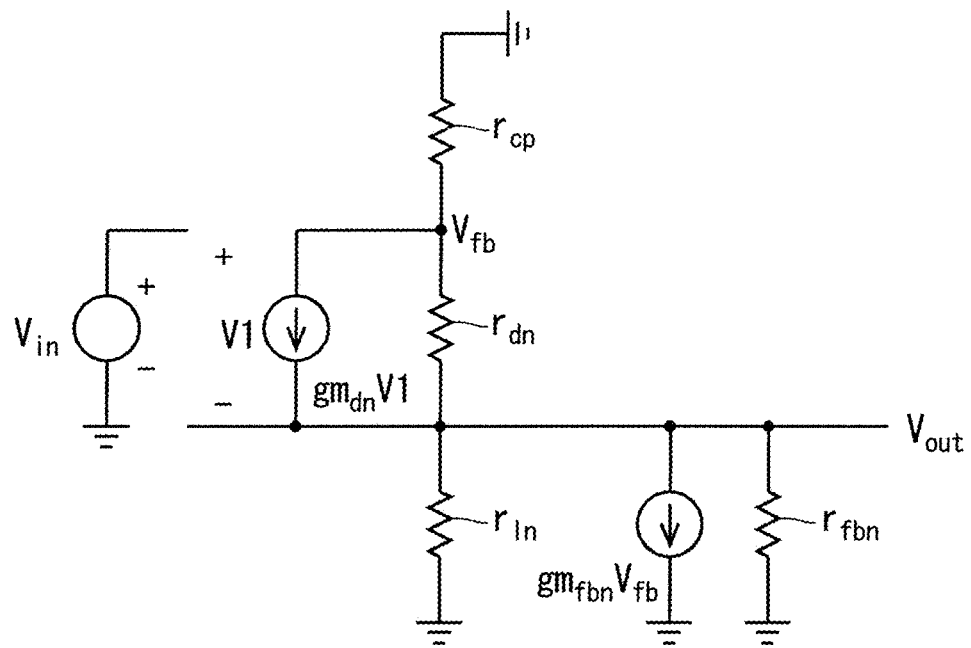
FIG. 44 is a diagram illustrating an example of the small signal equivalent circuit of the amplifier circuit of FIG. 43.

FIG. 44 is a diagram illustrating an example of the small signal equivalent circuit of the amplifier circuit 1100 of FIG. 43. From Kirchhoff's current law at the drain of the driving N-type FET 101 and the output terminal, expression (4) and the following expression (67) hold.

$$I_{out}(gm_{fbn}+1/r_{cp})V_{fb}+(1/r_{fbn}+1/r_{ln})V_{out} \quad (67)$$

When $V_{in}=0$, the output resistance can be calculated from expressions (4) and (67) as in the following expression (68).

$$\frac{V_{out}}{I_{out}} = r_{ln} // r_{fbn} // \frac{r_{dn}+r_{cp}}{(1+gm_{dn}r_{dn})(1+gm_{fbn}r_{cp})} \quad (68)$$

In an ideal FET without channel length modulation, $r_{ln} \to \infty$, $r_{cp} \to \infty$, $gm_{cn}r_{dn} \gg 1$, and $gm_{fbn}r_{fbn} \gg 1$, so that expression (68) can be approximated as the following expression (69).

$$\frac{V_{out}}{I_{out}} = \frac{1}{gm_{dn}r_{dn}gm_{fbn}} \quad (69)$$

Comparing expression (69) with expression (3) shows that the output resistance is reduced to $1/r_{dn}gm_{fbn}$ times that of the source follower circuit 110 in the amplifier circuit 1100. Therefore, the driving force of the output load in the amplifier circuit 1100 is higher than that in the source follower circuit 110.

Next, referring back to FIG. 43, the small signal operation of the amplifier circuit 1100 will be described.

When the voltage of the input terminal rises, the gate voltage of the driving N-type FET 101 rises, so that the source-drain current of the driving N-type FET 101 increases. As a result, the source voltage of the driving N-type FET 101 rises, and the drain voltage falls. The rise in the source voltage of the driving N-type FET 101 is, in other words, the rise in the voltage of the output terminal.

At the same time, as the drain voltage of the driving N-type FET 101 falls, the gate voltage of the feedback N-type FET 105 falls, and the source-drain current decreases. Here, with the load FET 102 being the constant current source, the source-drain current of the driving N-type FET 101 turns to decrease according to Kirchhoff's current law at the output terminal. This suppresses the rise in the source voltage and the fall in the drain voltage of the driving N-type FET 101. The suppression of the rise in the source voltage of the driving N-type FET 101 is, in other words, the suppression of the rise in the voltage of the output terminal.

Conversely, when the voltage of the input terminal falls, the gate voltage of the driving N-type FET 101 falls, so that the source-drain current of the driving N-type FET 101 decreases. As a result, the source voltage of the driving N-type FET 101 falls, and the drain voltage rises. The fall in the source voltage of the driving N-type FET 101 is, in other words, the fall in the voltage of the output terminal. At the same time, as the drain voltage of the driving N-type FET 101 rises, the gate voltage of the feedback N-type FET 105 rises, and the source-drain current increases. With the load FET 102 being the constant current source, the source-drain current of the driving N-type FET 101 turns to increase according to Kirchhoff's current law at the output terminal. This suppresses the fall in the source voltage and the rise in the drain voltage of the driving N-type FET 101. The suppression of the fall in the source voltage of the driving N-type FET 101 is, in other words, the suppression of the fall in the voltage of the output terminal.

As described above, in the amplifier circuit 1100 according to the present embodiment, the output feedback speed is higher than in the source follower circuit 110 because of the addition of the feedback N-type FET 105, and the output fluctuation quickly shifts from the transient state to the steady state.

In particular, the output feedback speed becomes higher at the falling edge than at the rising edge of the output waveform. Therefore, in the output waveform of the amplifier circuit 1100, the falling is steeper than that of the source follower circuit 110, while the overshoot of the rising and falling is reduced, and the oscillation of the output waveform is also reduced.

As a result, the falling time $t_f$ of the output waveform of the amplifier circuit 1100 illustrated in FIG. 7 is shortened, and an amplifier circuit capable of transmitting a faster clock signal can be obtained. In addition, the falling settling time $t_{sf}$ is shortened, and an amplifier circuit capable of driving a larger output load can be obtained.

Further, the amplifier circuit 1100 according to the present embodiment is different from the SSF circuit 120 in that the feedback N-type FET 105 is added instead of the feedback P-type FET 104.

Therefore, similarly to the SSF circuit 120, the output feedback speed increases, and the output fluctuation quickly transitions from the transient state to the steady state. However, as compared with the source follower circuit 110, the SSF circuit 120 has a higher output feedback speed at the rising edge than at the falling edge of the output waveform, whereas the amplifier circuit 1100 in the present embodiment has a higher output feedback speed at the falling edge than at the rising edge of the output waveform.

Here, the driving N-type FET 101 shortens the rising time $t_r$ and the rising settling time $t_{sr}$ of the output waveform, which is the same between the amplifier circuit 1100 according to the present embodiment and the SSF circuit 120, but in the amplifier circuit 1100 according to the present embodiment, the feedback N-type FET 105 mainly shortens the falling time $t_f$ and the falling settling time $t_{sf}$ of the output waveform, so that both the rising and falling can be shortened, and the total shortening amount is large.

In contrast, in the SSF circuit 120, since the feedback P-type FET 104 mainly shortens the rising time $t_r$ and the rising settling time $t_{sr}$ of the output waveform, although the shortening of the rising is larger than that of the amplifier circuit 1100 in the present embodiment, the falling cannot be shortened, and the total shortening amount is small.

Therefore, in the output waveform of the amplifier circuit 1100, as compared with the SSF circuit 120, the falling is steep even when the rising is slightly slow, and the rising and falling of the output waveform are shortened, while the reduction in the overshoot is enhanced even when the reduction in the undershoot is slightly weakened in the rising and falling, and the oscillation of the output waveform is also reduced.

As a result, even when the rising time $t_r$ of the output waveform of the amplifier circuit 1100 illustrated in FIG. 7 slightly increases, the falling time $t_f$ is shortened, and an amplifier circuit capable of transmitting a faster clock signal can be obtained. In addition, even when the rising settling time $t_{sr}$ slightly increases, the falling settling time $t_{sf}$ is shortened, and an amplifier circuit capable of driving a larger output load can be obtained.

Next, a method for driving the amplifier circuit 1100 will be described.

The ground potential is applied to the source of the load FET 102, and the power supply potential Vdd is applied to the source of the current source FET 103. By applying the fixed potential V1 to the gate of the load FET 102, the load FET 102 is operated in the saturation region to serve as the constant current source. By applying a fixed potential V2 to the gate of the current source FET 103, the current source FET 103 is operated in the saturation region to serve as the constant current source. By applying a fixed potential V3 to the source of the feedback N-type FET 105, the gate-source voltage is lowered. However, it is assumed that the relationships of Vdd>V2>V1>ground potential (GND) and $V_A \geq V3 \geq$ ground potential (GND) are satisfied.

In this state, an input signal is input to the input terminal connected to the gate of the driving N-type FET 101, and an output signal is output from the output terminal connected to the source of the driving N-type FET 101.

Tenth Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

FIG. 45 is a diagram illustrating an example of a configuration of an amplifier circuit 1200 according to the present embodiment. The amplifier circuit 1200 is one form of a source follower circuit. In the amplifier circuit 1200 according to the present embodiment, the driving FET is a P-type FET, unlike the amplifier circuit 1100 according to the ninth embodiment.

The amplifier circuit 1200 includes a driving P-type FET 201, a load FET 202, a current source FET 203, and a feedback P-type FET 104. The driving P-type FET 201, the load FET 202, and the feedback P-type FET 104 are formed of P-type FETs. The current source FET 203 is formed of an N-type FET.

The source of the load FET 202 is connected to the power supply, and the drain of the load FET 202 is connected to the source of the driving P-type FET 201. The drain of the current source FET 203 is connected to the drain of the driving P-type FET 201, and the source of the current source FET 203 is connected to the GND. That is, the current source FET 203, the driving P-type FET 201, and the load FET 202 are disposed in series between the power supply and the GND.

The input terminal IN of the amplifier circuit 1200 is connected to the gate of the driving P-type FET 201. The fixed potential V1 is input to the gate of the load FET 202. Thereby, the load FET 202 functions as a constant current source.

The connection point between the source of the driving P-type FET 201 and the drain of the load FET 202 is connected to the output terminal OUT.

The source of the feedback P-type FET 104 is connected to the fixed potential V3. The gate of the feedback P-type FET 104 is connected to the connection point between the drain of the current source FET 203 and the drain of the driving P-type FET 201. The drain of the feedback P-type FET 104 is connected to the output terminal OUT.

<Operation of Amplifier Circuit>

FIG. 46 is a diagram illustrating an example of the small signal equivalent circuit of the amplifier circuit 1200 of FIG. 45. From Kirchhoff's current law at the drain of the driving P-type FET 201 and the output terminal, expression (13) and the following expression (70) hold.

$$I_{out} = (gm_{fbp} + 1/r_{cn})V_{fb} + (1/r_{fbp} + 1/r_{lp})V_{out} \quad (70)$$

When $V_{in} = 0$, the output resistance can be calculated from expressions (13) and (70) as in the following expression (71).

$$\frac{V_{out}}{I_{out}} = r_{lp} // r_{fbp} // \frac{r_{dp} + r_{cn}}{(1 + gm_{dp}r_{dp})(1 + gm_{fbp}r_{cn})} \quad (71)$$

In an ideal FET without channel length modulation, $r_{lp} \to \infty$, $r_{cn} \to \infty$, $gm_{dp}r_{dp} \gg 1$, and $gm_{fbp}r_{fbp} \gg 1$, so that expression (71) can be approximated as the following expression (72).

$$\frac{V_{out}}{I_{out}} = \frac{1}{gm_{dp}r_{dp}gm_{fbp}} \quad (72)$$

Comparing expression (72) with expression (12) shows that the output resistance is reduced to $1/r_{dp}gm_{fbp}$ times that of the source follower circuit 210 in the amplifier circuit 1200. Therefore, the driving force of the output load in the amplifier circuit 1200 is higher than that in the source follower circuit 210.

Next, referring back to FIG. 45, the small signal operation of the amplifier circuit 1200 will be described.

When the voltage of the input terminal rises, the gate voltage of the driving P-type FET 201 rises, so that the source-drain current of the driving P-type FET 201 decreases. As a result, the source voltage of the driving P-type FET 201 rises, and the drain voltage falls. The rise in the source voltage of the driving P-type FET 201 is, in other words, the rise in the voltage of the output terminal.

At the same time, as the drain voltage of the driving P-type FET 201 falls, the gate voltage of the feedback N-type FET 105 falls, and the source-drain current decreases. Here, with the load FET 202 being the constant current source, the source-drain current of the driving P-type FET 201 turns to increase according to Kirchhoff's current law at the output terminal. This suppresses the rise in the source voltage and the fall in the drain voltage of the driving P-type FET 201. The suppression of the rise in the source voltage of the driving P-type FET 201 is, in other words, the suppression of the rise in the voltage of the output terminal.

Conversely, when the voltage of the input terminal falls, the gate voltage of the driving P-type FET 201 falls, so that the source-drain current of the driving P-type FET 201 increases. As a result, the source voltage of the driving P-type FET 201 falls, and the drain voltage rises. The fall in the source voltage of the driving P-type FET 201 is, in other words, the fall in the voltage of the output terminal.

At the same time, as the drain voltage of the driving P-type FET 201 rises, the gate voltage of the feedback N-type FET 105 rises, and the source-drain current increases. With the load FET 202 being the constant current source, the source-drain current of the driving P-type FET 201 turns to decrease according to Kirchhoff's current law at the output terminal. This suppresses the fall in the source voltage and the rise in the drain voltage of the driving P-type FET 201. The suppression of the fall in the source voltage of the driving P-type FET 201 is, in other words, the suppression of the fall in the voltage of the output terminal.

As described above, in the amplifier circuit 1200 according to the present embodiment, the output feedback speed is higher than in the source follower circuit 210 because of the addition of the feedback P-type FET 104, and the output fluctuation quickly shifts from the transient state to the steady state. In particular, the output feedback speed is higher at the rising edge than at the falling edge of the output waveform. Therefore, in the output waveform of the amplifier circuit 1200, the rising is steeper than that of the source follower circuit 210, while the undershoot of the rising and falling is reduced, and the oscillation of the output waveform is also reduced. As a result, as illustrated in FIG. 7, the rising time $t_r$ of the output waveform of the amplifier circuit 1200 is shortened, and an amplifier circuit capable of transmitting a faster clock signal can be obtained. In addition, the rising settling time $t_{sr}$ is shortened, and an amplifier circuit capable of driving a larger output load can be obtained.

Further, the amplifier circuit 1200 according to the present embodiment is different from the SSF circuit 220 in that the feedback P-type FET 104 is added instead of the feedback N-type FET 105.

Therefore, similarly to the SSF circuit 220, the output feedback speed increases, and the output fluctuation quickly transitions from the transient state to the steady state. However, as compared with the source follower circuit 210, the SSF circuit 220 has a higher output feedback speed at the falling edge than at the rising edge of the output waveform, whereas the amplifier circuit 1200 in the present embodiment has a higher output feedback speed at the rising edge than at the falling edge of the output waveform.

Here, the driving P-type FET 201 shortens the falling time $t_f$ and the falling settling time $t_{sf}$ of the output waveform, which is the same between the amplifier circuit 1200 according to the present embodiment and the SSF circuit 220, but in the amplifier circuit 1200 according to the present embodiment, the feedback P-type FET 104 mainly shortens the rising time $t_r$ and the rising settling time $t_{sr}$ of the output waveform, so that both the rising and falling can be shortened, and the total shortening amount is large.

In contrast, in the SSF circuit 220, since the feedback N-type FET 105 mainly shortens the falling time $t_f$ and the falling settling time $t_{sf}$ of the output waveform, although the shortening of the falling is larger than that of the amplifier circuit 1200 in the present embodiment, the falling cannot be shortened, and the total shortening amount is small.

Therefore, in the output waveform of the amplifier circuit 1200, as compared with the SSF circuit 220, the rising is steep even when the falling is slightly slow, and the rising and falling of the output waveform is shortened, while the reduction in the undershoot is enhanced even when the reduction in the overshoot is slightly weakened in the rising and falling, and the oscillation of the output waveform is also reduced.

As a result, even when the falling time $t_f$ of the output waveform of the amplifier circuit 1200 illustrated in FIG. 7 slightly increases, the rising time $t_r$ is shortened, and an amplifier circuit capable of transmitting a faster clock signal can be obtained. In addition, even when the falling settling time $t_{sf}$ slightly increases, the rising settling time $t_{sr}$ is shortened, and an amplifier circuit capable of driving a larger output load can be obtained.

Next, a method for driving the amplifier circuit 1200 will be described.

The power supply potential Vdd is applied to the source of the load FET 202, and the ground potential is applied to the source of the current source FET 203. By applying the fixed potential V1 to the gate of the load FET 202, the load FET 202 is operated in the saturation region to serve as the constant current source. By applying the fixed potential V2 to the gate of the current source FET 203, the current source FET 203 is operated in the saturation region to serve as the constant current source. By applying the fixed potential V3 to the source of the feedback P-type FET 104, the gate-source voltage is lowered. However, it is assumed that the relationships of Vdd>V1>V2>ground potential (GND) and Vdd≥V3≥$V_A$ are satisfied.

In this state, an input signal is input to the input terminal connected to the gate of the driving P-type FET 201, and an output signal is output from the output terminal connected to the source of the driving P-type FET 201.

Eleventh Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

FIG. 47 is a diagram illustrating an example of a configuration of an amplifier circuit 1300 according to the present embodiment. The amplifier circuit 1300 has the same configuration as the amplifier circuit 1100 illustrated in FIG. 43 except for the connection of the gate of the current source FET 103. That is, the gate of the current source FET 103 is connected to the fixed potential V2 in the amplifier circuit 1100, but is connected to the input terminal in the amplifier circuit 1300. Thus, the driving N-type FET 101 and the current source FET 103 form an inverter circuit.

<Operation of Amplifier Circuit>

Figure 48:
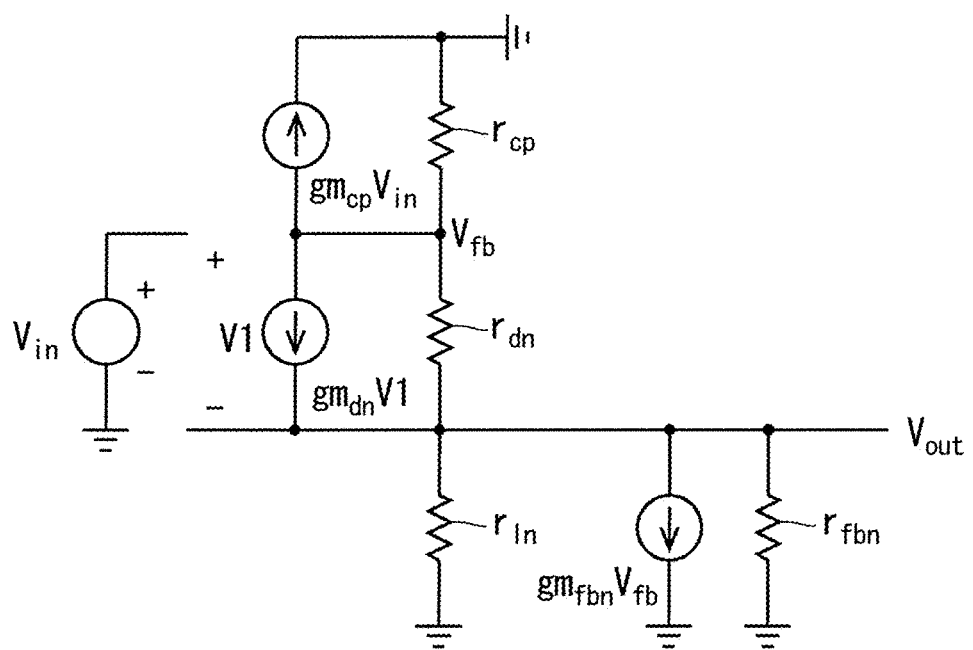
FIG. 48 is a diagram illustrating an example of the small signal equivalent circuit of the amplifier circuit of FIG. 47.

FIG. 48 is a diagram illustrating an example of the small signal equivalent circuit of the amplifier circuit 1300 of FIG. 47. From Kirchhoff's current law at the drain of the driving N-type FET 101 and the output terminal, expression (20) and the following expression (73) hold.

$$I_{out}=(gm_{fbn}+1/r_{cp})V_{fb}+(1/r_{fbn}+1/r_{ln})V_{out}+gm_{cp}V_{in} \quad (73)$$

When $V_{in}=0$, the output resistance can be calculated from expressions (20) and (73) as in the following expression (74).

$$\frac{V_{out}}{I_{out}} = r_{ln} // r_{fbn} // \frac{r_{dn} + r_{cp}}{(1 + gm_{dn}r_{dn})(1 + gm_{fbn}r_{cp})} \quad (74)$$

Expression (74) is the same as expression (68) indicating the output resistance of the amplifier circuit 1100 in the ninth embodiment. Therefore, it can be seen that the output resistances of the amplifier circuit 1100 in the ninth embodiment and the amplifier circuit 1300 in the present embodiment are the same, and the driving force of the output load is also the same.

Next, referring back to FIG. 47, the small signal operation of the amplifier circuit 1300 will be described.

When the voltage of the input terminal rises, the gate voltages of the driving N-type FET 101 and the current source FET 103 rise, so that the source-drain current of the driving N-type FET 101 increases, and the source-drain current of the current source FET 103 decreases. As a result, the source voltage of the driving N-type FET 101 rises and the drain voltage falls more quickly than the amplifier circuit 1100 in the ninth embodiment. The rise in the source voltage of the driving N-type FET 101 is, in other words, the rise in the voltage of the output terminal.

At the same time, as the drain voltage of the driving N-type FET 101 falls, the gate voltage of the feedback N-type FET 105 falls, and the source-drain current decreases. Here, with the load FET 102 being the constant current source, the source-drain current of the driving N-type FET 101 turns to decrease according to Kirchhoff's current law at the output terminal. This suppresses the rise in the source voltage and the fall in the drain voltage of the driving N-type FET 101. The suppression of the rise in the source voltage of the driving N-type FET 101 is, in other words, the suppression of the rise in the voltage of the output terminal.

Conversely, when the voltage of the input terminal falls, the gate voltages of the driving N-type FET 101 and the current source FET 103 decrease, so that the source-drain current of the driving N-type FET 101 decreases, and the source-drain current of the current source FET 103 increases. As a result, the source voltage of the driving N-type FET 101 falls and the drain voltage rises more quickly than the amplifier circuit 1100 in the ninth embodiment. The fall in the source voltage of the driving N-type FET 101 is, in other words, the fall in the voltage of the output terminal.

At the same time, as the drain voltage of the driving N-type FET 101 rises, the gate voltage of the feedback N-type FET 105 rises, and the source-drain current increases. With the load FET 102 being the constant current source, the source-drain current of the driving N-type FET 101 turns to increase according to Kirchhoff's current law at the output terminal. This suppresses the fall in the source voltage and the rise in the drain voltage of the driving N-type FET 101. The suppression of the fall in the source voltage of the driving N-type FET 101 is, in other words, the suppression of the fall in the voltage of the output terminal.

As described above, in the amplifier circuit 1300 according to the present embodiment, unlike the amplifier circuit 1100 according to the ninth embodiment, the gate of the current source FET 103 is connected to the input terminal, so that the voltage change at a node A becomes fast, and the output fluctuation quickly shifts from the transient state to the steady state. In particular, the output feedback speed becomes higher at the falling edge than at the rising edge of the output waveform. Therefore, in the output waveform of the amplifier circuit 1300, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 1300 are shortened, and an amplifier circuit capable of transmitting a faster clock signal can be obtained. In addition, the rising settling time $t_{sr}$ and the falling settling time $t_{sf}$ are shortened, and an amplifier circuit capable of driving a larger output load can be obtained.

Next, a method for driving the amplifier circuit 1300 will be described.

The ground potential is applied to the source of the load FET 102, and the power supply potential Vdd is applied to the source of the current source FET 103. By applying a fixed potential V1 to the gate of the load FET 102, the load FET 102 is operated in the saturation region to serve as the constant current source, and by applying a fixed potential V3 to the source of the feedback N-type FET 105, the gate-source voltage is lowered. However, it is assumed that the relationships of Vdd>V1>ground potential (GND) and $V_A \geq V3 \geq$ ground potential (GND) are satisfied.

In this state, an input signal is input to the input terminal connected to the gate of the driving N-type FET 101 and the gate of the current source FET 103, and an output signal is output from the output terminal connected to the source of the driving N-type FET 101.

Twelfth Embodiment

An amplifier circuit according to the present embodiment will be described. In the following description, components similar to the components described in the above-described embodiments will be shown with the same reference numerals, and a detailed description thereof will be omitted as appropriate.

<Configuration of Amplifier Circuit>

FIG. 49 is a diagram illustrating an example of a configuration of an amplifier circuit 1400 according to the present embodiment. The amplifier circuit 1400 has the same configuration as the amplifier circuit 1200 illustrated in FIG. 45 except for the connection of the gate of the current source FET 203. That is, the gate of the current source FET 203 is connected to the fixed potential V2 in the amplifier circuit 1200, but is connected to the input terminal in the amplifier circuit 1400. Thus, the driving P-type FET 201 and the current source FET 203 form an inverter circuit.

<Operation of Amplifier Circuit>

FIG. 50 is a diagram illustrating an example of the small signal equivalent circuit of the amplifier circuit 1400 of FIG. 49. From Kirchhoff's current law at the drain of the driving P-type FET 201 and the output terminal, expression (23) and the following expression (75) hold.

$$I_{out} = (gm_{fbp} + 1/r_{cn}) + (1/r_{fbp} + 1/r_{lp})V_{out} + gm_{cn}V_{in} \quad (75)$$

When $V_{in}=0$, the output resistance can be calculated from expressions (23) and (75) as in the following expression (76).

$$\frac{V_{out}}{I_{out}} = r_{lp} // r_{fbp} // \frac{r_{dp} + r_{cn}}{(1 + gm_{dp}r_{dp})(1 + gm_{fbp}r_{cn})} \quad (76)$$

Expression (76) is the same as expression (71) indicating the output resistance of the amplifier circuit 1200 in the tenth embodiment. Therefore, it can be seen that the output resistances of the amplifier circuit 1200 in the tenth embodiment and the amplifier circuit 1400 in the present embodiment are the same, and the driving force of the output load is also the same.

Next, referring back to FIG. 49, the small signal operation of the amplifier circuit 1400 will be described.

When the voltage of the input terminal rises, the gate voltages of the driving P-type FET 201 and the current source FET 203 rise, so that the source-drain current of the driving P-type FET 201 decreases, and the source-drain current of the current source FET 203 increases. As a result, the source voltage of the driving P-type FET 201 rises and the drain voltage falls more quickly than the amplifier circuit 1200 in the tenth embodiment. The rise in the source voltage of the driving P-type FET 201 is, in other words, the rise in the voltage of the output terminal.

At the same time, as the drain voltage of the driving P-type FET 201 falls, the gate voltage of the feedback P-type FET 104 falls and the source-drain current increases. Here, with the load FET 202 being the constant current source, the source-drain current of the driving P-type FET 201 turns to increase according to Kirchhoff's current law at the output terminal. This suppresses the rise in the source voltage and the fall in the drain voltage of the driving P-type FET 201. The suppression of the rise in the source voltage of the driving P-type FET 201 is, in other words, the suppression of the rise in the voltage of the output terminal.

Conversely, when the voltage of the input terminal falls, the gate voltages of the driving P-type FET 201 and the current source FET 203 decrease, so that the source-drain current of the driving P-type FET 201 increases, and the source-drain current of the current source FET 203 decreases. As a result, the source voltage of the driving P-type FET 201 falls and the drain voltage rises more quickly than the amplifier circuit 1200 in the tenth embodiment. The fall in the source voltage of the driving P-type FET 201 is, in other words, the fall in the voltage of the output terminal.

At the same time, as the drain voltage of the driving P-type FET 201 rises, the gate voltage of the feedback P-type FET 104 rises, and the source-drain current decreases. With the load FET 202 being the constant current source, the source-drain current of the driving P-type FET 201 turns to decrease according to Kirchhoff's current law at the output terminal. This suppresses the fall in the source voltage and the rise in the drain voltage of the driving P-type FET 201. The suppression of the fall in the source voltage of the driving P-type FET 201 is, in other words, the suppression of the fall in the voltage of the output terminal.

As described above, in the amplifier circuit 1400 according to the present embodiment, unlike the amplifier circuit 1200 according to the tenth embodiment, the gate of the current source FET 203 is connected to the input terminal, so that the voltage change at the node A becomes fast, and the output fluctuation quickly shifts from the transient state to the steady state. In particular, the output feedback speed is higher at the rising edge than at the falling edge of the output waveform. Therefore, in the output waveform of the amplifier circuit 1400, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 1400 are shortened, and an amplifier circuit capable of transmitting a faster clock signal can be obtained. In addition, the rising settling time $t_{sr}$ and the falling settling time $t_{sf}$ are shortened, and an amplifier circuit capable of driving a larger output load can be obtained.

Next, a method for driving the amplifier circuit 1400 will be described.

The power supply potential Vdd is applied to the source of the load FET 202, and the ground potential is applied to the source of the current source FET 203. By applying the fixed potential V1 to the gate of the load FET 202, the load FET 202 is operated in the saturation region to serve as the constant current source, and by applying the fixed potential V3 to the source of the feedback P-type FET 104, the gate-source voltage is lowered. However, it is assumed that the relationships of Vdd>V1>ground potential (GND) and Vdd≥V3≥$V_A$ are satisfied.

In this state, an input signal is input to the input terminal connected to the gate of the driving P-type FET 201 and the gate of the current source FET 203, and an output signal is output from the output terminal connected to the source of the driving P-type FET 201.

In any of the first to twelfth embodiments, the fixed potential V3 and the ground potential (alternatively, the power supply potential) may be equal. However, in that case, the gate-source voltage of either the feedback N-type FET or the feedback P-type FET does not fall.

In any of the first to twelfth embodiments, the fixed potential V1 and the fixed potential V3 may be equal to each other. That is, the terminal set at the fixed potential V3 may be connected to the fixed potential V1. In that case, the number of power supply terminals is reduced by one, thus enhancing the convenience of the circuit.

Figure 51:
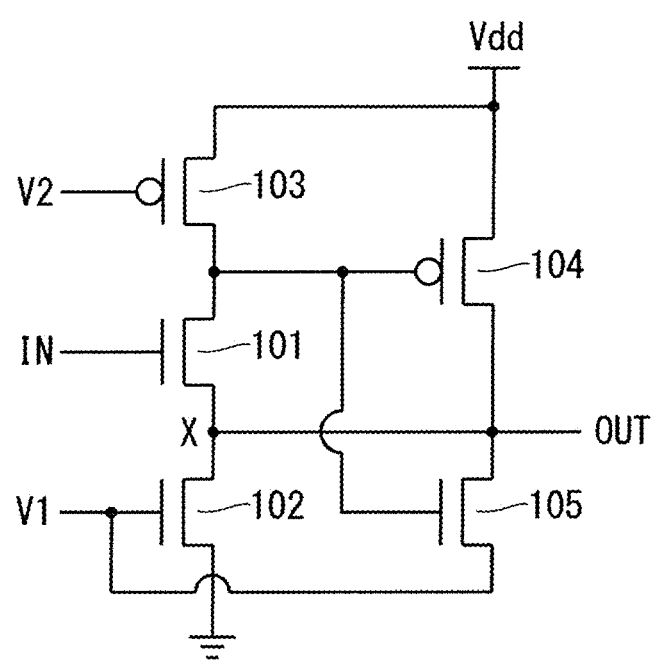
FIG. 51 is a diagram illustrating a modification of the configuration illustrated in FIG. 1.

FIG. 51 is a diagram illustrating a modification of the configuration illustrated in FIG. 1. As illustrated in the drawing, the fixed potential V3 may be omitted, and the corresponding portion may be commonly connected to the fixed potential V1.

Figure 52:
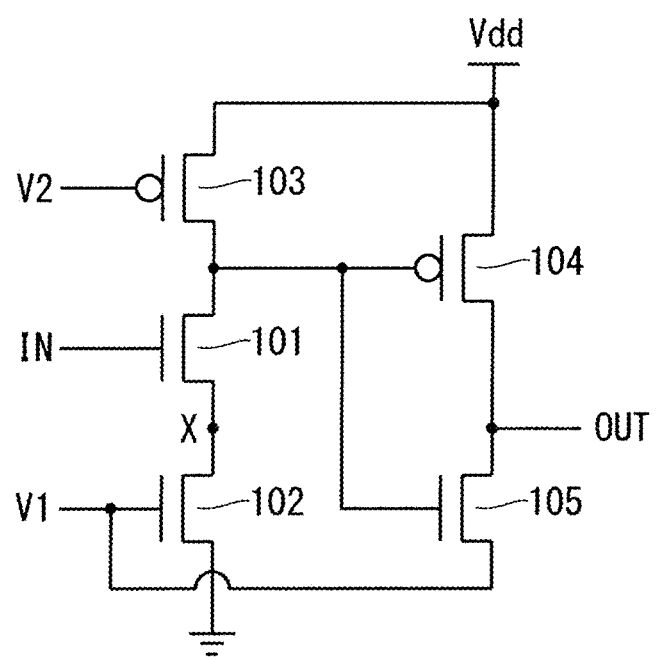
FIG. 52 is a diagram illustrating a modification of the configuration illustrated in FIG. 2.

FIG. 52 is a diagram illustrating a modification of the configuration illustrated in FIG. 2. As illustrated in the drawing, the fixed potential V3 may be omitted, and the corresponding portion may be commonly connected to the fixed potential V1.

Figure 53:
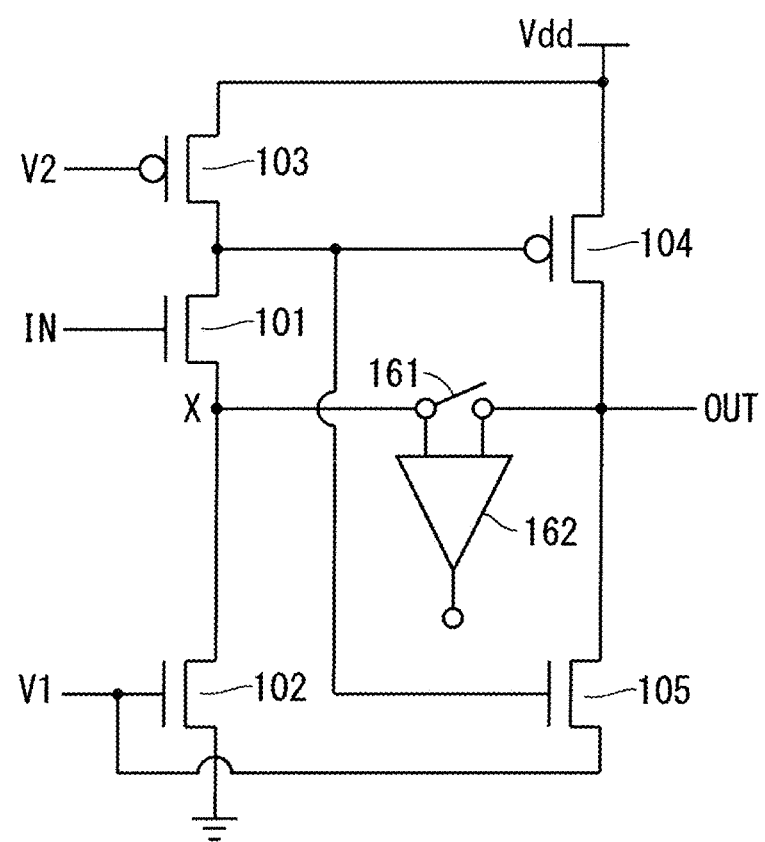
FIG. 53 is a diagram illustrating a modification of the configuration illustrated in FIG. 3.

FIG. 53 is a diagram illustrating a modification of the configuration illustrated in FIG. 3. As illustrated in the drawing, the fixed potential V3 may be omitted, and the corresponding portion may be commonly connected to the fixed potential V1.

FIG. 54 is a diagram illustrating a modification of the configuration illustrated in FIG. 11. As illustrated in the drawing, the fixed potential V3 may be omitted, and the corresponding portion may be commonly connected to the fixed potential V1.

FIG. 55 is a diagram illustrating a modification of the configuration illustrated in FIG. 17. As illustrated in the drawing, the fixed potential V3 may be omitted, and the corresponding portion may be commonly connected to the fixed potential V1.

Figure 56:
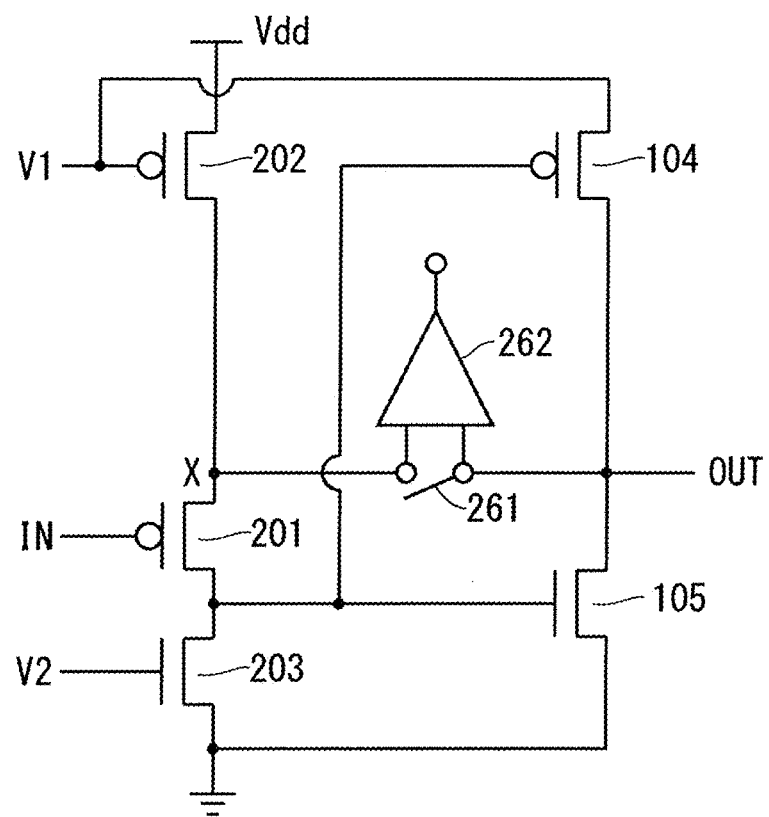
FIG. 56 is a diagram illustrating a modification of the configuration illustrated in FIG. 18.

FIG. 56 is a diagram illustrating a modification of the configuration illustrated in FIG. 18. As illustrated in the drawing, the fixed potential V3 may be omitted, and the corresponding portion may be commonly connected to the fixed potential V1.

FIG. 57 is a diagram illustrating a modification of the configuration illustrated in FIG. 19. As illustrated in the drawing, the fixed potential V3 may be omitted, and the corresponding portion may be commonly connected to the fixed potential V1.

Figure 58:
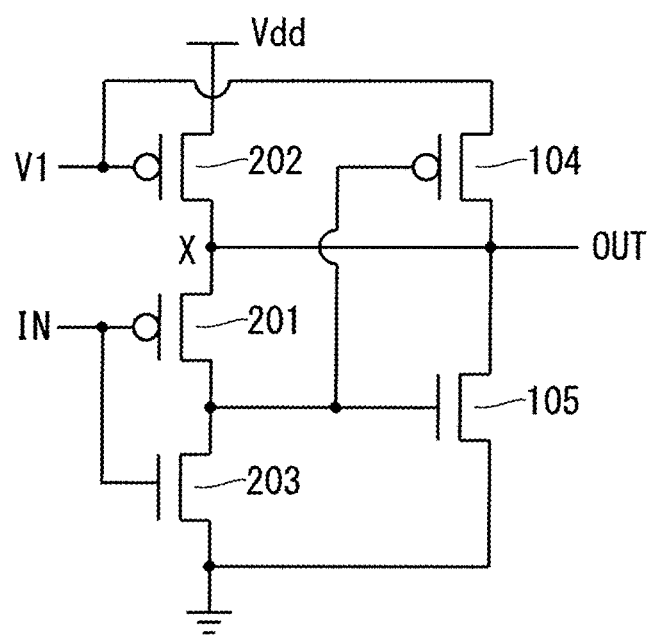
FIG. 58 is a diagram illustrating a modification of the configuration illustrated in FIG. 21.

FIG. 58 is a diagram illustrating a modification of the configuration illustrated in FIG. 21. As illustrated in the drawing, the fixed potential V3 may be omitted, and the corresponding portion may be commonly connected to the fixed potential V1.

Figure 59:
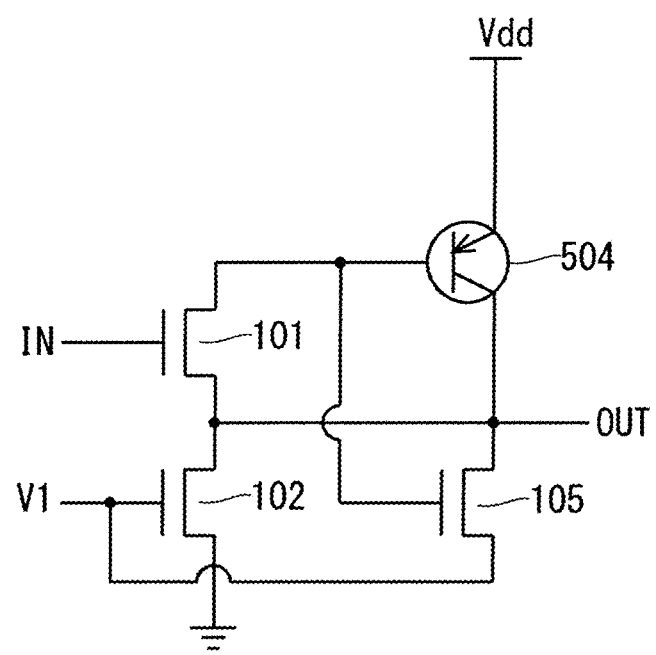
FIG. 59 is a diagram illustrating a modification of the configuration illustrated in FIG. 23.

FIG. 59 is a diagram illustrating a modification of the configuration illustrated in FIG. 23. As illustrated in the drawing, the fixed potential V3 may be omitted, and the corresponding portion may be commonly connected to the fixed potential V1.

FIG. 60 is a diagram illustrating a modification of the configuration illustrated in FIG. 27. As illustrated in the drawing, the fixed potential V3 may be omitted, and the corresponding portion may be commonly connected to the fixed potential V1.

Figure 61:
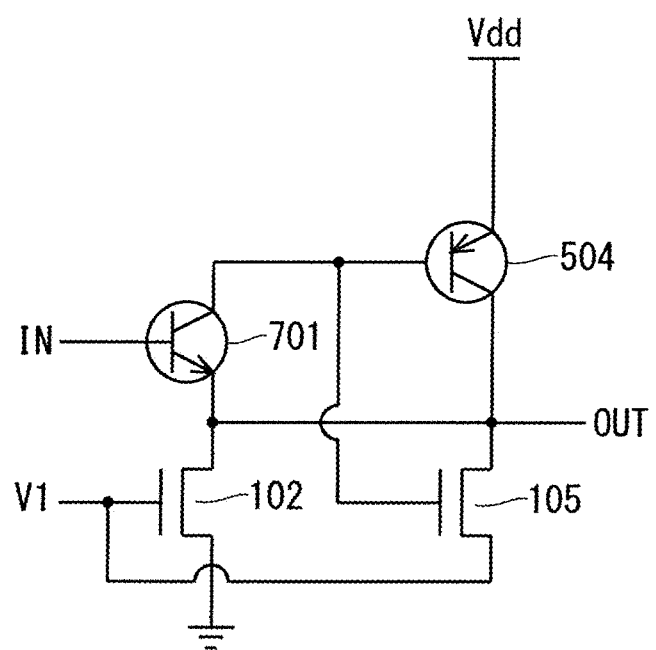
FIG. 61 is a diagram illustrating a modification of the configuration illustrated in FIG. 31.

FIG. 61 is a diagram illustrating a modification of the configuration illustrated in FIG. 31. As illustrated in the drawing, the fixed potential V3 may be omitted, and the corresponding portion may be commonly connected to the fixed potential V1.

Figure 62:
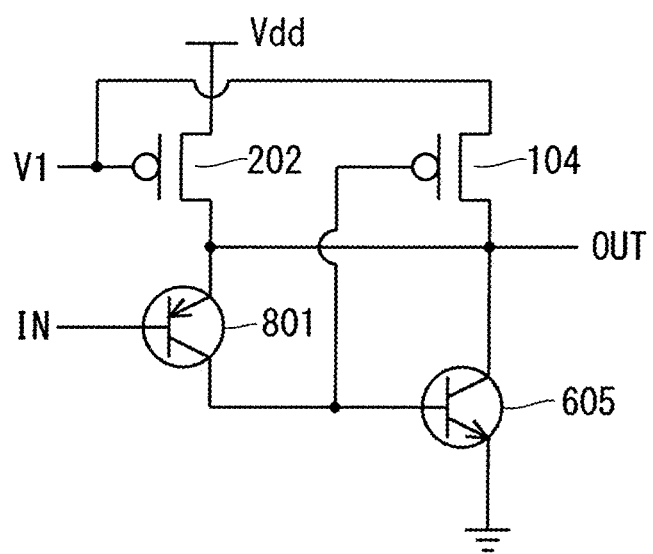
FIG. 62 is a diagram illustrating a modification of the configuration illustrated in FIG. 37.

FIG. 62 is a diagram illustrating a modification of the configuration illustrated in FIG. 37. As illustrated in the drawing, the fixed potential V3 may be omitted, and the corresponding portion may be commonly connected to the fixed potential V1.

FIG. 63 is a diagram illustrating a modification of the configuration illustrated in FIG. 43. As illustrated in the drawing, the fixed potential V3 may be omitted, and the corresponding portion may be commonly connected to the fixed potential V1.

Figure 64:
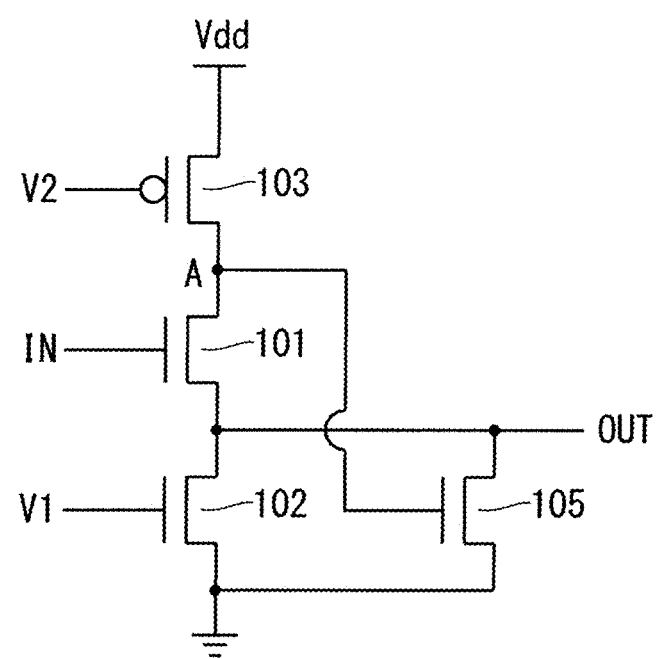
FIG. 64 is a diagram illustrating another modification of the configuration illustrated in FIG. 43.

FIG. 64 is a diagram illustrating another modification of the configuration illustrated in FIG. 43. As illustrated in the drawing, the fixed potential V3 may be omitted, and the source of the feedback N-type FET 105 may be connected to the source of the load FET 102.

FIG. 65 is a diagram illustrating a modification of the configuration illustrated in FIG. 45. As illustrated in the drawing, the fixed potential V3 may be omitted, and the corresponding portion may be commonly connected to the fixed potential V1.

FIG. 66 is a diagram illustrating another modification of the configuration illustrated in FIG. 45. As illustrated in the drawing, the fixed potential V3 may be omitted, and the source of the feedback P-type FET 104 may be connected to the source of the load FET 202.

Figure 67:
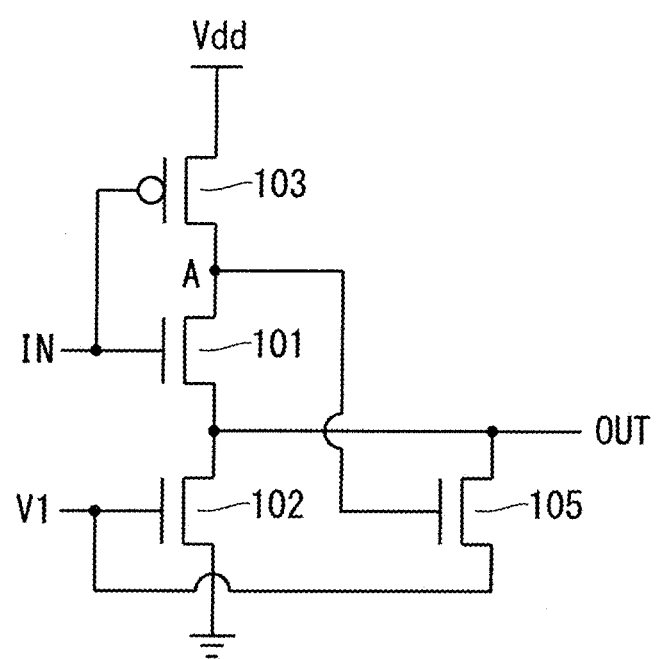
FIG. 67 is a diagram illustrating a modification of the configuration illustrated in FIG. 47.

FIG. 67 is a diagram illustrating a modification of the configuration illustrated in FIG. 47. As illustrated in the drawing, the fixed potential V3 may be omitted, and the corresponding portion may be commonly connected to the fixed potential V1.

Figure 68:
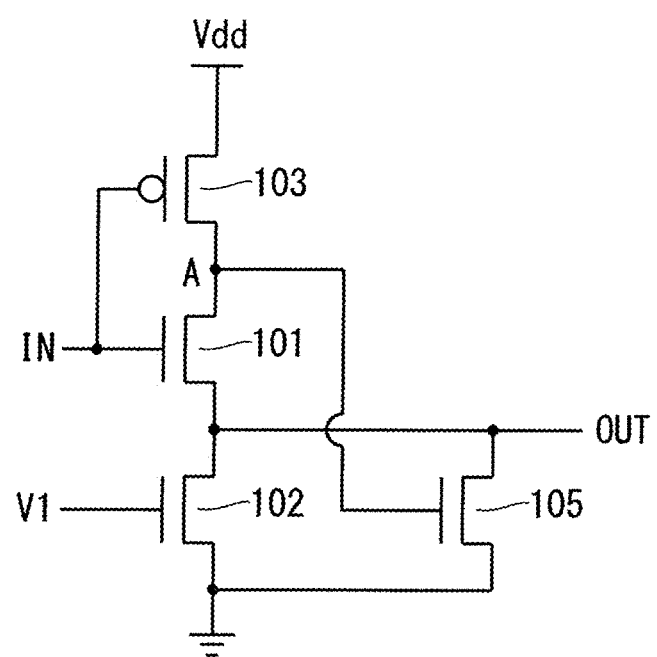
FIG. 68 is a diagram illustrating another modification of the configuration illustrated in FIG. 47.

FIG. 68 is a diagram illustrating another modification of the configuration illustrated in FIG. 47. As illustrated in the drawing, the fixed potential V3 may be omitted, and the source of the feedback N-type FET 105 may be connected to the source of the load FET 102.

FIG. 69 is a diagram illustrating a modification of the configuration illustrated in FIG. 49. As illustrated in the drawing, the fixed potential V3 may be omitted, and the corresponding portion may be commonly connected to the fixed potential V1.

FIG. 70 is a diagram illustrating another modification of the configuration illustrated in FIG. 49. As illustrated in the drawing, the fixed potential V3 may be omitted, and the source of the feedback P-type FET 104 may be connected to the source of the load FET 202.

<Regarding Effects Produced by Embodiments Described Above>

Next, examples of the effects produced by the embodiments described above will be shown. In the following description, the effects will each be described based on the specific configuration shown by an example in the embodiment described above, but the configuration may be replaced with another specific configuration shown by an example in the present specification in a range where a similar effect is produced. That is, any one of the associated specific configurations may be described below for convenience but may be replaced with another associated specific configuration.

Further, the replacement may be performed across a plurality of embodiments. That is, there may be a case where a similar effect is produced by combining the respective configurations shown by examples in different embodiments.

According to the embodiment described above, the amplifier circuit is an amplifier circuit that amplifies a signal input to the input terminal IN and outputs the amplified signal to the output terminal OUT. The amplifier circuit includes a first transistor of a first conductivity type (e.g., P-type), a second transistor of a second conductivity type (e.g., N-type) different from the first conductivity type, a third transistor that is a field-effect transistor of a third conductivity type, and a fourth transistor that is a field-effect transistor of a fourth conductivity type different from the first conductivity type. Here, the first transistor corresponds to, for example, any one of the feedback P-type FET 104, the feedback N-type FET 105, the feedback PNP-type BJT 504, the feedback NPN-type BJT 605, and the like. The second transistor corresponds to, for example, at least one of the driving N-type FET 101, the driving P-type FET 201, the driving PNP-type BJT 801, and the like. The third transistor corresponds to, for example, at least one of the load FET 102, the load FET 202, and the like. The fourth transistor corresponds to, for example, at least one of the feedback N-type FET 105, the feedback P-type FET 104, and the like. The feedback P-type FET 104 has a first control terminal, a first current terminal connected to a first potential, and a second current terminal connected to the output terminal OUT. Here, the first potential corresponds to, for example, at least one of the power supply potential Vdd, the ground potential, and the like. The driving N-type FET 101 has a second control terminal connected to the input terminal IN, a third current terminal connected to the output terminal OUT, and a fourth current terminal connected to the first control terminal of the feedback P-type FET 104. The load FET 102 has a third control terminal that is a gate terminal connected to the first fixed potential, a fifth current terminal that is a source terminal connected to the second potential, and a sixth current terminal that is a drain terminal connected to the output terminal OUT. Here, the first fixed potential corresponds to, for example, the fixed potential V1. The second potential corresponds to, for example, at least one of a ground potential, a power supply potential Vdd, and the like. The feedback N-type FET 105 includes a fourth control terminal that is a gate terminal connected to the first control terminal of the feedback P-type FET 104 at an equal potential, a seventh current terminal that is a source terminal connected to the third fixed potential, and an eighth current terminal that is a drain terminal connected to the output terminal OUT. Here, the third fixed potential corresponds to, for example, the fixed potential V3.

With such a configuration, the rising (settling time) and the falling (settling time) of the output waveform can be shortened by reducing an extra steady current in the amplifier circuit. Further, the through current flowing through the CMOS inverter including the feedback P-type FET 104 and the feedback N-type FET 105 is reduced, and hence the power consumption is reduced. Moreover, since the range in which the input/output characteristics are linear is shifted as a whole, the power consumption of the amplifier circuit is reduced, and the hot-carrier generation can be reduced. In addition, the gate-source voltages of the two feedback transistors are equalized, so that an inverter including a feedback transistor with symmetrical design parameters (threshold voltage, ratio of gate length to gate width, gate oxide film capacitance, etc.) can be configured, and the degree of freedom in design and versatility are enhanced.

Even when another configuration shown by an example in the present specification is appropriately added to the above configuration, that is, even when another configuration not mentioned as the above configuration in the present specification is appropriately added, a similar effect can be produced.

Further, according to the embodiment described above, the feedback PNP-type BJT 504 is a bipolar transistor. The first control terminal of the feedback PNP-type BJT 504 is a base terminal, the first current terminal of the feedback PNP-type BJT 504 is an emitter terminal, and the second current terminal of the feedback PNP-type BJT 504 is a collector terminal. With such a configuration, the rising (settling time) and the falling (settling time) of the output waveform can be shortened by reducing an extra steady current in the amplifier circuit.

Further, according to the embodiment described above, the driving PNP-type BJT 801 is a bipolar transistor. The second control terminal of the driving PNP-type BJT 801 is a base terminal, the third current terminal of the driving PNP-type BJT 801 is an emitter terminal, and the fourth current terminal of the driving PNP-type BJT 801 is a collector terminal. With such a configuration, the rising (settling time) and the falling (settling time) of the output waveform can be shortened by reducing an extra steady current in the amplifier circuit.

Further, according to the embodiment described above, the driving N-type FET 101 is a field-effect transistor. The second control terminal of the driving N-type FET 101 is a gate terminal, the third current terminal of the driving N-type FET 101 is a source terminal, and the fourth current terminal of the driving N-type FET 101 is a drain terminal. With such a configuration, the rising (settling time) and the falling (settling time) of the output waveform can be shortened by reducing an extra steady current in the amplifier circuit.

Further, according to the embodiment described above, the feedback P-type FET 104 is a field-effect transistor. The first control terminal of the feedback P-type FET 104 is a gate terminal, the first current terminal of the feedback P-type FET 104 is a source terminal, and the second current terminal of the feedback P-type FET 104 is a drain terminal. The driving N-type FET 101 is a field-effect transistor. The second control terminal of the driving N-type FET 101 is a gate terminal, the third current terminal of the driving N-type FET 101 is a source terminal, and the fourth current terminal of the driving N-type FET 101 is a drain terminal. Further, the amplifier circuit includes a current source element that supplies a current to the fourth current terminal of the driving N-type FET 101. Here, the current source element corresponds to, for example, at least one of the current source FET 103, the current source FET 203, and the like. With such a configuration, the rising (settling time) and the falling (settling time) of the output waveform can be shortened by reducing an extra steady current in the amplifier circuit.

Further, according to the embodiment described above, the current source FET 103 has a fifth control terminal that is a gate terminal connected to the second fixed potential, a ninth current terminal that is a source terminal connected to the power supply potential Vdd, and a tenth current terminal that is a drain terminal connected to the fourth current terminal of the driving N-type FET 101. The current source FET 103 is a fifth transistor as a field-effect transistor of a first conductivity type (e.g., P-type). Here, the second fixed potential corresponds to, for example, the fixed potential V2. With such a configuration, the rising (settling time) and the falling (settling time) of the output waveform can be shortened by reducing an extra steady current in the amplifier circuit.

Further, according to the embodiment described above, the fixed potential V2 is connected to the input terminal IN. With such a configuration, the gate of the current source FET 103 is connected to the input terminal, so that the voltage change at the node A becomes fast, and the output fluctuation quickly transitions from the transient state to the steady state. In particular, the output feedback speed becomes higher at the falling edge than at the rising edge of the output waveform. Therefore, in the output waveform of the amplifier circuit 1300, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 1300 are shortened, and an amplifier circuit capable of transmitting a faster clock signal can be obtained.

Further, according to the embodiment described above, in the steady state, no current flows between the output terminal OUT and the connection point (node X) between the third current terminal of the driving N-type FET 101 and the sixth current terminal that is the drain terminal of the load FET 102. With such a configuration, I0=0 in the steady state $I_{out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

Further, according to the embodiment described above, when the first potential is the power supply potential Vdd and the second potential is the ground potential, the relationship of expression (114) is satisfied in the steady state. With such a configuration, I0=0 in the steady state $I_{out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

Further, according to the embodiment described above, when the first potential is the power supply potential Vdd and the second potential is the ground potential, the relationship of expression (115) is satisfied in the steady state. With such a configuration, I0=0 in the steady state $I_{out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

Further, according to the embodiment described above, when the first potential is the ground potential and the second potential is the power supply potential Vdd, the relationship of expression (214) is satisfied in the steady state. With such a configuration, I0=0 in the steady state $I_{out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

Further, according to the embodiment described above, when the first potential is the ground potential and the second potential is the power supply potential Vdd, the relationship of expression (215) is satisfied in the steady state. With such a configuration, I0=0 in the steady state $I_{out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

Further, according to the embodiment described above, the sum of the fixed potential V1 and the fixed potential V2 is equal to the power supply potential Vdd. With such a configuration, I0=0 in the steady state $I_{out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

Further, according to the embodiment described above, $-Vth_{fbp}=Vth_{fbn}$ and $\beta_{fbp}=\beta_{fbn}$. With such a configuration, I0=0 in the steady state $I_{out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

According to the embodiment described above, the amplifier circuit includes the feedback P-type FET 104 that is the field-effect transistor of the first conductivity type, the driving N-type FET 101 that is the field-effect transistor of the second conductivity type different from the first conductivity type, the load FET 102 that is the field-effect transistor of the second conductivity type, the feedback N-type FET 105 that is the field-effect transistor of the second conductivity type, the current source FET 103, the differential amplifier 162 (alternatively, the differential amplifier 262), and the switching device. Here, the switching device corresponds to, for example, at least one of the switch 161, the switch 261, and the like. The feedback P-type FET 104 has a first control terminal that is a gate terminal, a first current terminal that is a source terminal connected to the power supply potential Vdd, and a second current terminal that is a drain terminal connected to the output terminal OUT. The driving N-type FET 101 has a second control terminal that is a gate terminal connected to the input terminal IN, a third current terminal that is a source terminal, and a fourth current terminal that is a drain terminal connected to the first control terminal that is the gate terminal of the feedback P-type FET 104. The load FET 102 has a third control terminal that is a gate terminal connected to the fixed potential V1, a fifth current terminal that is a source terminal connected to the ground potential, and a sixth current terminal that is a drain terminal connected to the third current terminal that is the source terminal of the driving N-type FET 101. The feedback N-type FET 105 includes a fourth control terminal that is a gate terminal connected to a first control terminal that is the gate terminal of the feedback P-type FET 104 at an equal potential, a seventh current terminal that is a source terminal connected to the fixed potential V3, and an eighth current terminal that is a drain terminal connected to the output terminal OUT. The current source FET 103 supplies a current to the fourth current terminal that is the drain terminal of the driving N-type FET 101. In the differential amplifier 162, a first differential input terminal is connected to the connection point (node X) between a third current terminal that is the source terminal of the driving N-type FET 101 and a sixth current terminal that is the drain terminal of the load FET 102. The second differential input terminal of the differential amplifier 162 is connected to the output terminal OUT. The switch 161 can switch whether to connect the first differential input terminal and the second differential input terminal of the differential amplifier 162.

With such a configuration, the rising (settling time) and the falling (settling time) of the output waveform can be shortened by reducing an extra steady current in the amplifier circuit. Further, the through current flowing through the CMOS inverter including the feedback P-type FET 104 and the feedback N-type FET 105 is reduced, and hence the power consumption is reduced. Moreover, since the range in which the input/output characteristics are linear is shifted as a whole, the power consumption of the amplifier circuit is reduced, and the hot-carrier generation can be reduced. In addition, the gate-source voltages of the two feedback transistors are equalized, so that an inverter including a feedback transistor with symmetrical design parameters (threshold voltage, ratio of gate length to gate width, gate oxide film capacitance, etc.) can be configured, and the degree of freedom in design and versatility are enhanced. V1 or V2 is adjusted such that the output voltage of the differential amplifier 162 becomes 0 V, whereby I0=0 in the steady state $I_{Out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

Even when at least one of the other configurations described by examples in the present specification is appropriately added to the above configuration, that is, even when another configuration shown by an example in the present specification and not mentioned as the above configuration is appropriately added, a similar effect can be produced.

Further, according to the embodiment described above, the feedback P-type FET 104 and the feedback N-type FET 105 are enhancement type transistors. With such a configuration, the threshold voltage Vth=−Vth$_{fbp}$=Vth$_{fbn}$ becomes larger than 0. Therefore, the through current of the CMOS inverter including the feedback P-type FET 104 and the feedback N-type FET 105 is reduced, and the power consumption of the amplifier circuit 100 is reduced.

Further, according to the embodiment described above, the current source FET 103, the driving N-type FET 101, and the load FET 102 are depletion-type transistors. With such a configuration, the threshold voltage Vth=−Vth$_{cp}$=Vth$_{ln}$=Vth$_{dn}$ becomes 0 or less. Therefore, the input voltage of the amplifier circuit 100 can be reduced, and the power consumption of the amplifier circuit 100 and the hot-carrier generation can be reduced.

According to the embodiment described above, the composite circuit includes an amplifier circuit and an evaluation circuit. The evaluation circuit is used to determine the fixed potential V1 and the fixed potential V2 for satisfying the condition that no current flows between the output terminal OUT and the connection point between the third current terminal of the driving N-type FET 101 and the sixth current terminal that is the drain terminal of the load FET 102. The evaluation circuit includes a sixth transistor that is a field-effect transistor of a first conductivity type, a seventh transistor that is a field-effect transistor of a second conductivity type different from the first conductivity type, an eighth transistor that is a field-effect transistor of a second conductivity type different from the first conductivity type, a ninth transistor that is a field-effect transistor of the second conductivity type, and the current source FET 103. Here, the sixth transistor corresponds to, for example, at least one of the feedback P-type FET 104, the feedback N-type FET 105, and the like. The seventh transistor corresponds to, for example, at least one of the driving N-type FET 101, the driving P-type FET 201, and the like. The eighth transistor corresponds to, for example, at least one of the load FET 102, the load FET 202, and the like. The ninth transistor corresponds to, for example, at least one of the feedback N-type FET 105, the feedback P-type FET 104, and the like. The feedback P-type FET 104 has a sixth control terminal that is a gate terminal, an eleventh current terminal that is a source terminal connected to the power supply potential Vdd, and a twelfth current terminal that is a drain terminal connected to the output terminal OUT. The driving N-type FET 101 has a seventh control terminal that is a gate terminal connected to the input terminal IN, a thirteenth current terminal that is a source terminal, and a fourteenth current terminal that is a drain terminal connected to a sixth control terminal that is the gate terminal of the feedback P-type FET 104. The load FET 102 has an eighth control terminal that is a gate terminal connected to the fixed potential V1, a fifteenth current terminal that is a source terminal connected to the ground potential, and a sixteenth current terminal that is a drain terminal connected to a thirteenth current terminal that is the source terminal of the driving N-type FET 101. The feedback N-type FET 105 includes a ninth control terminal that is a gate terminal connected to a sixth control terminal that is the gate terminal of the feedback P-type FET 104 at an equal potential, a seventeenth current terminal that is a source terminal connected to the fixed potential V3, and an eighteenth current terminal that is a drain terminal connected to the output terminal OUT. The current source FET 103 supplies a current to a fourteenth current terminal that is the drain terminal of the driving N-type FET 101.

With such a configuration, the rising (settling time) and the falling (settling time) of the output waveform can be shortened by reducing an extra steady current in the amplifier circuit. Further, the through current flowing through the CMOS inverter including the feedback P-type FET 104 and the feedback N-type FET 105 is reduced, and hence the power consumption is reduced. Moreover, since the range in which the input/output characteristics are linear is shifted as a whole, the power consumption of the amplifier circuit is reduced, and the hot-carrier generation can be reduced. In addition, the gate-source voltages of the two feedback transistors are equalized, so that an inverter including a feedback transistor with symmetrical design parameters (threshold voltage, ratio of gate length to gate width, gate oxide film capacitance, etc.) can be configured, and the degree of freedom in design and versatility are enhanced. V1 or V2 is adjusted such that a potential difference between the source of the driving N-type FET 101 and the drain of the load FET 102 (e.g., node X in FIG. 8) and the drain of the feedback P-type FET 104 and the drain of the feedback N-type FET 105 (output terminal OUT) becomes 0 V, whereby I0=0 in the steady state I$_{out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

Note that when there is no particular limitation, the order in which each process is performed can be changed.

Even when another configuration shown by an example in the present specification is appropriately added to the above configuration, that is, even when another configuration not mentioned as the above configuration in the present specification is appropriately added, a similar effect can be produced.

Further, according to the embodiment described above, it is possible to selectively short-circuit the output terminal OUT and the connection point between and the thirteenth current terminal that is the source terminal of the driving N-type FET 101 and the sixteenth current terminal that is the drain terminal of the load FET 102. With such a configuration, V1 or V2 is adjusted such that a potential difference between the source of the driving N-type FET 101 and the drain of the load FET 102 (e.g., node X in FIG. 8) and the drain of the feedback P-type FET 104 and the drain of the feedback N-type FET 105 (output terminal OUT) becomes 0 V, whereby I0=0 in the steady state I$_{out}$=0, and the source-drain currents of the feedback P-type FET 104 and the feedback N-type FET 105 become equal. Therefore, the input/output characteristics of the CMOS inverter including the feedback P-type FET 104 and the feedback N-type FET 105 are symmetrical, and an extra steady current in the amplifier circuit is reduced.

Further, according to the embodiment described above, the amplifier circuit includes a first transistor of a first conductivity type, the driving N-type FET 101 of the first conductivity type, and the load FET 102 that is a field-effect transistor of a third conductivity type. Here, the first transistor corresponds to, for example, any one of the feedback N-type FET 105, the feedback P-type FET 104, and the like. The feedback N-type FET 105 has a first control terminal, a first current terminal connected to the fixed potential V3, and a second current terminal connected to the output terminal OUT. The driving N-type FET 101 has a second control terminal connected to the input terminal IN, a third current terminal connected to the output terminal OUT, and a fourth current terminal connected to the first control terminal of the feedback N-type FET 105. The load FET 102 has a third control terminal that is a gate terminal connected to the fixed potential V1, a fifth current terminal that is a source terminal connected to the ground potential, and a sixth current terminal that is a drain terminal connected to the output terminal OUT.

With such a configuration, the rising (settling time) and the falling (settling time) of the output waveform can be shortened by reducing an extra steady current in the amplifier circuit. In addition, noise can be reduced due to a small number of transistors. Here, the N-type drive transistor can be responsible for the rising of the output waveform, and the P-type feedback transistor can be responsible for the falling of the output waveform. Alternatively, the P-type drive transistor can be responsible for the falling of the output waveform, and the N-type feedback transistor can be responsible for the rising of the output waveform. Therefore, the rising settling time or the falling settling time can be shortened.

Further, according to the embodiment described above, the feedback N-type FET 105 is a field-effect transistor. The first control terminal of the feedback N-type FET 105 is a gate terminal, the first current terminal of the feedback N-type FET 105 is a source terminal, and the second current terminal of the feedback N-type FET 105 is a drain terminal. The driving N-type FET 101 is a field-effect transistor. The second control terminal of the driving N-type FET 101 is a gate terminal, the third current terminal of the driving N-type FET 101 is a source terminal, and the fourth current terminal of the driving N-type FET 101 is a drain terminal. Further, the amplifier circuit includes the current source FET 103 that supplies a current to the fourth current terminal of the driving N-type FET 101. With such a configuration, the rising (settling time) and the falling (settling time) of the output waveform can be shortened by reducing an extra steady current in the amplifier circuit. In addition, noise can be reduced due to a small number of transistors.

Further, according to the embodiment described above, the current source FET 103 is a field-effect transistor of a fourth conductivity type different from the first conductivity type, the current source FET 103 having a fourth control terminal that is a gate terminal connected to the fixed potential V2, a seventh current terminal that is a source terminal connected to the power supply potential Vdd, and an eighth current terminal that is a drain terminal connected to the fourth current terminal of the driving N-type FET 101. With such a configuration, the rising (settling time) and the falling (settling time) of the output waveform can be shortened by reducing an extra steady current in the amplifier circuit. In addition, noise can be reduced due to a small number of transistors.

Further, according to the embodiment described above, the fixed potential V2 is connected to the input terminal IN. With such a configuration, the gate of the current source FET 103 is connected to the input terminal, so that the voltage change at the node A becomes fast, and the output fluctuation quickly transitions from the transient state to the steady state. In particular, the output feedback speed becomes higher at the falling edge than at the rising edge of the output waveform. Therefore, in the output waveform of the amplifier circuit 1300, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 1300 are shortened, and an amplifier circuit capable of transmitting a faster clock signal can be obtained.

Further, according to the embodiment described above, the amplifier circuit includes a first field-effect transistor of a first conductivity type, a second field-effect transistor of the first conductivity type, a third field-effect transistor of a third conductivity type, and a fourth field-effect transistor of a fourth conductivity type different from the first conductivity type. Here, the first field-effect transistor corresponds to, for example, at least one of the feedback N-type FET 105, the feedback P-type FET 104, and the like. The second field-effect transistor corresponds to, for example, at least one of the driving N-type FET 101, the driving P-type FET 201, and the like. The third field-effect transistor corresponds to, for example, at least one of the load FET 102, the load FET 202, and the like. The fourth field-effect transistor corresponds to, for example, at least one of the current source FET 103, the current source FET 203, and the like. The feedback N-type FET 105 has a first gate terminal, a first source terminal connected to the fixed potential V3, and a first drain terminal connected to the output terminal OUT. The driving N-type FET 101 has a second gate terminal connected to the input terminal IN, a second source terminal connected to the output terminal OUT, and a second drain terminal connected to the first gate terminal of the feedback N-type FET 105. The load FET 102 has a third gate terminal connected to the fixed potential V1, a third source terminal connected to the ground potential, and a third drain terminal connected to the output terminal OUT. The current source FET 103 has a fourth gate terminal connected to the input terminal IN, a fourth source terminal connected to the power supply potential Vdd, and a fourth drain terminal connected to the second drain terminal of the driving N-type FET 101.

With such a configuration, the rising (settling time) and the falling (settling time) of the output waveform can be shortened by reducing an extra steady current in the amplifier circuit. In addition, noise can be reduced due to a small number of transistors. Here, the N-type drive transistor can be responsible for the rising of the output waveform, and the P-type feedback transistor can be responsible for the falling of the output waveform. Alternatively, the P-type drive transistor can be responsible for the falling of the output waveform, and the N-type feedback transistor can be responsible for the rising of the output waveform. Therefore, the rising settling time or the falling settling time can be shortened. In addition, the gate of the current source FET 103 is connected to the input terminal, so that the voltage change at the node A becomes fast, and the output fluctuation quickly transitions from the transient state to the steady state. In particular, the output feedback speed becomes higher at the falling edge than at the rising edge of the output waveform. Therefore, in the output waveform of the amplifier circuit 1300, the rising and falling become steep, while the overshoot and undershoot of the rising and falling are reduced, and oscillation of the output waveform is also reduced. As a result, the rising time $t_r$ and the falling time $t_f$ of the output waveform of the amplifier circuit 1300 are shortened, and an amplifier circuit capable of transmitting a faster clock signal can be obtained.

Further, according to the embodiment described above, the fixed potential V3 is equal to the ground potential. With such a configuration, the degree of freedom of the circuit is increased.

Further, according to the embodiment described above, the fixed potential V3 is equal to the fixed potential V1. With such a configuration, the number of power supply terminals is reduced by one, and hence the convenience of the circuit is enhanced.

<Modifications of Embodiment Described Above>

In the embodiments described above, the material quality, material, dimensions, shape, relative positional relationship, conditions for implementation, or the like, of each component may be described, but each of these is one example in all aspects and is not restrictive.

Accordingly, numerous modifications and equivalents, not shown by examples, are conceived within the scope of the technology disclosed in the present specification. This includes, for example, a case where at least one component is modified, added, or omitted, and further includes a case where at least one component in at least one embodiment is extracted and combined with a component in another preferred embodiment.

In addition, in the preferred embodiments described above, when a material name or the like is described without being specified, unless there is contradiction, the material contains other additives, for example, an alloy or the like.

Unless there is a contradiction, as for a component described as being provided as "one" component in the preferred embodiments described above, "one or more" components may be provided.

Further, each component in the embodiments described above is a conceptual unit, and within the scope of the technology disclosed in the present specification, there are included a case where one component is made up of a plurality of structures, a case where one component corresponds to a part of a structure, and a case where a plurality of components are provided in one structure.

Moreover, each component in the preferred embodiment described above includes a structure having another structure or shape so long as the same function is exhibited.

The description in the present specification is referred to for all purposes related to the present technology, and none is recognized as prior art.

EXPLANATION OF REFERENCE SIGNS

100, 150, 160, 200, 250, 260, 300, 500, 600, 700, 800, 900, 1000, 1100, 1200, 1300, 1400 amplifier circuit, 101 driving N-type FET, 102, 202 load FET, 103, 203 current source FET, 104 feedback P-type FET, 105 feedback N-type FET, 110, 210 source follower circuit, 120, 220 SSF circuit, 161, 261 switch, 162, 262 differential amplifier, 201 driving P-type FET, 504 feedback PNP-type BJT, 605 feedback NPN-type BJT, 701 driving NPN-type BJT, 720, 820 FET-input ID circuit, 801 driving PNP-type BJT, 910, 1010 emitter follower circuit, 920, 1020 ID circuit

The invention claimed is:

1. An amplifier circuit that amplifies a signal input to an input terminal and outputs the amplified signal to an output terminal, the amplifier circuit comprising:
a first transistor of a first conductivity type having a first control terminal, a first current terminal connected to a first potential, and a second current terminal connected to the output terminal;
a second transistor of a second conductivity type different from the first conductivity type, the second transistor having a second control terminal connected to the input terminal, a third current terminal connected to the output terminal, and a fourth current terminal connected to the first control terminal of the first transistor;
a third transistor that is a field-effect transistor of a third conductivity type, the third transistor having a third control terminal that is a gate terminal connected to a first fixed potential, a fifth current terminal that is a source terminal connected to a second potential, and a sixth current terminal that is a drain terminal connected to the output terminal; and
a fourth transistor that is a field-effect transistor of a fourth conductivity type different from the first conductivity type, the fourth transistor having a fourth control terminal that is a gate terminal connected to the first control terminal of the first transistor at an equal potential, a seventh current terminal that is a source terminal connected to a third fixed potential, and an eighth current terminal that is a drain terminal connected to the output terminal.

2. The amplifier circuit according to claim 1, wherein
the first transistor is a bipolar transistor,
the first control terminal of the first transistor is a base terminal,
the first current terminal of the first transistor is an emitter terminal, and
the second current terminal of the first transistor is a collector terminal.

3. The amplifier circuit according to claim 2, wherein
the second transistor is a bipolar transistor,
the second control terminal of the second transistor is a base terminal,
the third current terminal of the second transistor is an emitter terminal, and
the fourth current terminal of the second transistor is a collector terminal.

4. The amplifier circuit according to claim 2, wherein
the second transistor is a field-effect transistor,
the second control terminal of the second transistor is a gate terminal,
the third current terminal of the second transistor is a source terminal, and
the fourth current terminal of the second transistor is a drain terminal.

5. The amplifier circuit according to claim 1, wherein
the first transistor is a field-effect transistor,
the first control terminal of the first transistor is a gate terminal,
the first current terminal of the first transistor is a source terminal,
the second current terminal of the first transistor is a drain terminal,
the second transistor is a field-effect transistor,
the second control terminal of the second transistor is a gate terminal,
the third current terminal of the second transistor is a source terminal,
the fourth current terminal of the second transistor is a drain terminal, and
the amplifier circuit further includes a current source element that supplies a current to the fourth current terminal of the second transistor.

6. The amplifier circuit according to claim 5, wherein the current source element is a fifth transistor as a field-effect transistor of a first conductivity type, the fifth transistor having a fifth control terminal that is a gate terminal connected to a second fixed potential, a ninth current terminal that is a source terminal connected to the first potential, and a tenth current terminal that is a drain terminal connected to the fourth current terminal of the second transistor.

7. The amplifier circuit according to claim 6, wherein the second fixed potential is connected to the input terminal.

8. The amplifier circuit according to claim 6, wherein in a steady state, no current flows between the output terminal and a connection point between the third current terminal of the second transistor and the sixth current terminal that is the drain terminal of the third transistor.

9. An amplifier circuit that amplifies a signal input to an input terminal and outputs the amplified signal to an output terminal, the amplifier comprising:
   a first transistor that is a field-effect transistor of a first conductivity type, the first transistor having a first control terminal that is a gate terminal, a first current terminal that is a source terminal connected to a first potential, and a second current terminal that is a drain terminal connected to the output terminal;
   a second transistor that is a field-effect transistor of a second conductivity type different from the first conductivity type, the second transistor having a second control terminal that is a gate terminal connected to the input terminal, a third current terminal that is a source terminal, and a fourth current terminal that is a drain terminal connected to the first control terminal that is a gate terminal of the first transistor;
   a third transistor that is a field-effect transistor of the second conductivity type, the third transistor having a third control terminal that is a gate terminal connected to a first fixed potential, a fifth current terminal that is a source terminal connected to a second potential, and a sixth current terminal that is a drain terminal connected to the third current terminal that is a source terminal of the second transistor;
   a fourth transistor that is a field-effect transistor of the second conductivity type, the fourth transistor having a fourth control terminal that is a gate terminal connected to the first control terminal that is a gate terminal of the first transistor at an equal potential, a seventh current terminal that is a source terminal connected to a third fixed potential, and an eighth current terminal that is a drain terminal connected to the output terminal;
   a current source element that supplies a current to the fourth current terminal that is a drain terminal of the second transistor;
   a differential amplifier having a first differential input terminal connected to a connection point between the third current terminal that is the source terminal of the second transistor and the sixth current terminal that is the drain terminal of the third transistor, the differential amplifier having a second differential input terminal connected to the output terminal; and
   a switching device capable of switching whether or not to connect the first differential input terminal and the second differential input terminal of the differential amplifier.

10. The amplifier circuit according to claim 5, wherein the first transistor and the fourth transistor are enhancement-type transistors.

11. The amplifier circuit according to claim 5, wherein the current source element, the second transistor, and the third transistor are depletion-type transistors.

12. A composite circuit comprising:
   an amplifier circuit that amplifies a signal input to an input terminal and outputs the amplified signal to an output terminal, the amplifier circuit including
      a first transistor of a first conductivity type having a first control terminal, a first current terminal connected to a first potential, and a second current terminal connected to the output terminal,
      a second transistor of a second conductivity type different from the first conductivity type, the second transistor having a second control terminal connected to the input terminal, a third current terminal connected to the output terminal, and a fourth current terminal connected to the first control terminal of the first transistor,
      a third transistor that is a field-effect transistor of a third conductivity type, the third transistor having a third control terminal that is a gate terminal connected to a first fixed potential, a fifth current terminal that is a source terminal connected to a second potential, and a sixth current terminal that is a drain terminal connected to the output terminal, and
      a fourth transistor that is a field-effect transistor of a fourth conductivity type different from the first conductivity type, the fourth transistor having a fourth control terminal that is a gate terminal connected to the first control terminal of the first transistor at an equal potential, a seventh current terminal that is a source terminal connected to a third fixed potential, and an eighth current terminal that is a drain terminal connected to the output terminal,
   wherein
      the first transistor is a field-effect transistor,
      the first control terminal of the first transistor is a gate terminal,
      the first current terminal of the first transistor is a source terminal,
      the second current terminal of the first transistor is a drain terminal,
      the second transistor is a field-effect transistor,
      the second control terminal of the second transistor is a gate terminal,
      the third current terminal of the second transistor is a source terminal,
      the fourth current terminal of the second transistor is a drain terminal, and
      the amplifier circuit further includes a current source element that supplies a current to the fourth current terminal of the second transistor,
   wherein the current source element is a fifth transistor as a field-effect transistor of a first conductivity type, the fifth transistor having a fifth control terminal that is a gate terminal connected to a second fixed potential, a ninth current terminal that is a source terminal connected to the first potential, and a tenth current terminal that is a drain terminal connected to the fourth current terminal of the second transistor,
   wherein in a steady state, no current flows between the output terminal and a connection point between the third current terminal of the second transistor and the sixth current terminal that is the drain terminal of the third transistor,
   the composite circuit further comprising:
   an evaluation circuit used to determine the first fixed potential and the second fixed potential to satisfy a condition that no current flows between the output terminal and the connection point between the third current terminal of the second transistor and the sixth current terminal that is the drain terminal of the third transistor,
   wherein the evaluation circuit includes
   a sixth transistor that is a field-effect transistor of a first conductivity type, the sixth transistor having a sixth control terminal that is a gate terminal, an eleventh current terminal that is a source terminal connected to the first potential, and a twelfth current terminal that is a drain terminal connected to the output terminal, a seventh transistor that is a field-effect transistor of a second conductivity type different from the first conductivity type, the seventh transistor having a seventh control terminal that is a gate terminal connected to the input terminal, a thirteenth current terminal that is a source terminal, and a fourteenth current terminal that is a drain terminal connected to the sixth control terminal that is a gate terminal of the sixth transistor, an eighth transistor that is a field-effect transistor of the second conductivity type different from the first conductivity type, the eighth transistor having an eighth control terminal that is a gate terminal connected to the first fixed potential, a fifteenth current terminal that is a source terminal connected to the second potential, and a sixteenth current terminal that is a drain terminal connected to the thirteenth current terminal that is a source terminal of the seventh transistor, a ninth transistor that is a field-effect transistor of a second conductivity type, the ninth transistor having a ninth control terminal that is a gate terminal connected to the sixth control terminal that is a gate terminal of the sixth transistor at an equal potential, a seventeenth current terminal that is a source terminal connected to a third fixed potential, and an eighteenth current terminal that is a drain terminal connected to the output terminal, and a current source element that supplies a current to the fourteenth current terminal that is a drain terminal of the seventh transistor.

13. The composite circuit according to claim 12, wherein the output terminal and a connection point between the thirteenth current terminal that is the source terminal of the seventh transistor and the sixteenth current terminal that is the drain terminal of the eighth transistor are able to be short-circuited selectively.

14. An amplifier circuit that amplifies a signal input to an input terminal and outputs the amplified signal to an output terminal, the amplifier circuit comprising:

a first transistor of a first conductivity type having a first control terminal, a first current terminal connected to a third fixed potential, and a second current terminal connected to the output terminal;

a second transistor of the first conductivity type having a second control terminal connected to the input terminal, a third current terminal connected to the output terminal, and a fourth current terminal connected to the first control terminal of the first transistor; and a third transistor that is a field-effect transistor of a third conductivity type, the third transistor having a third control terminal that is a gate terminal connected to a first fixed potential, a fifth current terminal that is a source terminal connected to a second potential, and a sixth current terminal that is a drain terminal connected to the output terminal.

15. The amplifier circuit according to claim 14, wherein the first transistor is a field-effect transistor, the first control terminal of the first transistor is a gate terminal, the first current terminal of the first transistor is a source terminal, the second current terminal of the first transistor is a drain terminal, the second transistor is a field-effect transistor, the second control terminal of the second transistor is a gate terminal, the third current terminal of the second transistor is a source terminal, the fourth current terminal of the second transistor is a drain terminal, and the amplifier circuit further comprises a current source element that supplies a current to the fourth current terminal of the second transistor.

16. The amplifier circuit according to claim 15, wherein the current source element is a field-effect transistor of a fourth conductivity type different from the first conductivity type, the field-effect transistor having a fourth control terminal that is a gate terminal connected to a second fixed potential, a seventh current terminal that is a source terminal connected to a first potential, and an eighth current terminal that is a drain terminal connected to the fourth current terminal of the second transistor.

17. The amplifier circuit according to claim 16, wherein the second fixed potential is connected to the input terminal.

18. An amplifier circuit that amplifies a signal input to an input terminal and outputs the amplified signal to an output terminal, the amplifier circuit comprising:

a first field-effect transistor of a first conductivity type having a first gate terminal, a first source terminal connected to a third fixed potential, and a first drain terminal connected to the output terminal;

a second field-effect transistor of the first conductivity type having a second gate terminal connected to the input terminal, a second source terminal connected to the output terminal, and a second drain terminal connected to the first gate terminal of the first field-effect transistor;

a third field-effect transistor of a third conductivity type having a third gate terminal connected to a first fixed potential, a third source terminal connected to a second potential, and a third drain terminal connected to the output terminal; and a fourth field-effect transistor of a fourth conductivity type different from the first conductivity type, the fourth field-effect transistor having a fourth gate terminal connected to the input terminal, a fourth source terminal connected to a first potential, and a fourth drain terminal connected to the second drain terminal of the second field-effect transistor.

19. The amplifier circuit according to claim 1, wherein the third fixed potential is equal to the second potential.

20. The composite circuit according to claim 12, wherein the third fixed potential is equal to the second potential.

21. The amplifier circuit according to claim 1, wherein the third fixed potential is equal to the first fixed potential.

22. The composite circuit according to claim 12, wherein the third fixed potential is equal to the first fixed potential.

* * * * *